United States Patent
Wenzel et al.

(10) Patent No.: US 11,706,573 B2
(45) Date of Patent: Jul. 18, 2023

(54) NEARFIELD INDUCTIVE COUPLING IN A CONTACT HEARING SYSTEM

(71) Applicant: Earlens Corporation, Menlo Park, CA (US)

(72) Inventors: Stuart W. Wenzel, San Carlos, CA (US); Lawrence W. Arne, Palo Alto, CA (US)

(73) Assignee: Earlens Corporation, Menlo Park, CA (US)

(*) Notice: Subject to any disclaimer, the term of this patent is extended or adjusted under 35 U.S.C. 154(b) by 0 days.

(21) Appl. No.: 17/159,482

(22) Filed: Jan. 27, 2021

(65) Prior Publication Data

US 2021/0152950 A1 May 20, 2021

Related U.S. Application Data

(63) Continuation of application No. PCT/US2019/042910, filed on Jul. 23, 2019.

(Continued)

(51) Int. Cl.
  *H04R 25/00* (2006.01)
  *H04R 25/02* (2006.01)
  (Continued)

(52) U.S. Cl.
  CPC ........... *H04R 25/456* (2013.01); *H01F 27/24* (2013.01); *H01F 38/14* (2013.01); *H02M 3/08* (2013.01);
  (Continued)

(58) Field of Classification Search
  CPC ..... H04R 25/00; H04R 25/604; H04R 25/606
  See application file for complete search history.

(56) References Cited

U.S. PATENT DOCUMENTS

| 4,375,016 A | 2/1983 | Harada |
| 4,628,907 A | 12/1986 | Epley |

(Continued)

FOREIGN PATENT DOCUMENTS

| DE | 3508830 A1 | 9/1986 |
| KR | 100624445 B1 | 9/2006 |

(Continued)

OTHER PUBLICATIONS

Kiran, Diware, "Faraday's Law and Lenz's Law of Electromagnetic Induction", ( 2014) https://www.electricaleasy.com/2014/02/faradays-law-and-lenzs-law-of.html (Year: 2014).*

(Continued)

*Primary Examiner* — Sunita Joshi
(74) *Attorney, Agent, or Firm* — Polsinelli PC

(57) ABSTRACT

In one embodiment, the present invention is directed to a method of transmitting information from an ear tip to a contact hearing device, the method comprising the steps of: exciting a transmit coil, the transmit coil being positioned in the ear tip, wherein the transmit coil is wound on a core, the core including a ferromagnetic material; radiating an electromagnetic field from the first coil through the ear canal of a user; receiving the radiated electromagnetic field at a receive coil, the receive coil being positioned on a contact hearing device, the contact hearing device including a receive coil without a ferrite core; and transmitting the information from the transmit coil to the receive coil using, for example, near-field radiation.

32 Claims, 35 Drawing Sheets

Related U.S. Application Data

(60) Provisional application No. 62/831,085, filed on Apr. 8, 2019, provisional application No. 62/831,074, filed on Apr. 8, 2019, provisional application No. 62/712,462, filed on Jul. 31, 2018, provisional application No. 62/712,478, filed on Jul. 31, 2018, provisional application No. 62/712,466, filed on Jul. 31, 2018, provisional application No. 62/712,458, filed on Jul. 31, 2018, provisional application No. 62/712,474, filed on Jul. 31, 2018.

(51) Int. Cl.
*H04R 3/04* (2006.01)
*H02M 3/08* (2006.01)
*H02M 7/10* (2006.01)
*H04B 5/00* (2006.01)
*H01F 27/24* (2006.01)
*H01F 38/14* (2006.01)
*H02J 50/12* (2016.01)
*H02M 7/06* (2006.01)

(52) U.S. Cl.
CPC ............ *H02M 7/10* (2013.01); *H04B 5/0006* (2013.01); *H04R 3/04* (2013.01); *H04R 25/02* (2013.01); *H04R 25/554* (2013.01); *H04R 25/602* (2013.01); *H04R 25/606* (2013.01); *H04R 25/609* (2019.05); *H04R 25/652* (2013.01); *H02J 50/12* (2016.02); *H02M 7/06* (2013.01); *H04R 25/505* (2013.01); *H04R 2225/021* (2013.01); *H04R 2225/025* (2013.01); *H04R 2225/0216* (2019.05); *H04R 2225/33* (2013.01); *H04R 2460/11* (2013.01); *H04R 2460/13* (2013.01)

(56) References Cited

U.S. PATENT DOCUMENTS

| | | | |
|---|---|---|---|
| 4,957,478 A | 9/1990 | Maniglia et al. | |
| 5,259,032 A | 11/1993 | Perkins et al. | |
| 5,276,910 A | 1/1994 | Buchele | |
| 5,424,698 A | 6/1995 | Dydyk et al. | |
| 5,425,104 A | 6/1995 | Shennib | |
| 5,624,376 A | 4/1997 | Ball et al. | |
| 5,721,783 A | 2/1998 | Anderson | |
| 5,740,257 A | 4/1998 | Marcus | |
| 5,804,109 A | 9/1998 | Perkins | |
| 6,068,589 A | 5/2000 | Neukermans | |
| 6,137,889 A | 10/2000 | Shennib et al. | |
| 6,190,305 B1 | 2/2001 | Ball et al. | |
| 6,466,679 B1 | 10/2002 | Husung | |
| 6,491,644 B1 | 12/2002 | Vujanic et al. | |
| 6,724,902 B1 | 4/2004 | Shennib et al. | |
| 6,931,231 B1 | 8/2005 | Griffin | |
| 6,940,989 B1 | 9/2005 | Shennib et al. | |
| 7,095,981 B1 | 8/2006 | Voroba et al. | |
| 7,260,234 B2 | 8/2007 | Kasztelan et al. | |
| 7,289,639 B2 | 10/2007 | Abel et al. | |
| 7,421,087 B2 | 9/2008 | Perkins et al. | |
| 7,630,646 B2 | 12/2009 | Anderson et al. | |
| 7,668,325 B2 | 2/2010 | Puria et al. | |
| 7,867,160 B2 | 1/2011 | Pluvinage et al. | |
| 7,885,359 B2 | 2/2011 | Meltzer | |
| 7,955,249 B2 | 6/2011 | Perkins et al. | |
| 7,983,435 B2 | 7/2011 | Moses | |
| 8,116,494 B2 | 2/2012 | Rass | |
| 8,157,730 B2 | 4/2012 | LeBoeuf et al. | |
| 8,204,786 B2 | 6/2012 | LeBoeuf et al. | |
| 8,251,903 B2 | 8/2012 | LeBoeuf et al. | |
| 8,284,970 B2 | 10/2012 | Sacha | |
| 8,295,523 B2 | 10/2012 | Fay et al. | |
| 8,320,982 B2 | 11/2012 | LeBoeuf et al. | |
| 8,373,310 B2 | 2/2013 | Baarman et al. | |
| 8,396,239 B2 | 3/2013 | Fay et al. | |
| 8,401,212 B2 | 3/2013 | Puria et al. | |
| 8,401,214 B2 | 3/2013 | Perkins et al. | |
| 8,506,473 B2 | 8/2013 | Puria | |
| 8,512,242 B2 | 8/2013 | LeBoeuf et al. | |
| 8,545,383 B2 | 10/2013 | Wenzel et al. | |
| 8,600,089 B2 | 12/2013 | Wenzel et al. | |
| 8,647,270 B2 | 2/2014 | LeBoeuf et al. | |
| 8,652,040 B2 | 2/2014 | LeBoeuf et al. | |
| 8,696,541 B2 | 4/2014 | Pluvinage et al. | |
| 8,700,111 B2 | 4/2014 | LeBoeuf et al. | |
| 8,702,607 B2 | 4/2014 | LeBoeuf et al. | |
| 8,715,152 B2 | 5/2014 | Puria et al. | |
| 8,715,153 B2 | 5/2014 | Puria et al. | |
| 8,715,154 B2 | 5/2014 | Perkins et al. | |
| 8,787,609 B2 | 7/2014 | Perkins et al. | |
| 8,788,002 B2 | 7/2014 | LeBoeuf et al. | |
| 8,824,715 B2 | 9/2014 | Fay et al. | |
| 8,837,758 B2 | 9/2014 | Knudsen | |
| 8,845,705 B2 | 9/2014 | Perkins et al. | |
| 8,858,419 B2 | 10/2014 | Puria et al. | |
| 8,885,860 B2 | 11/2014 | Djalilian et al. | |
| 8,886,269 B2 | 11/2014 | LeBoeuf et al. | |
| 8,888,701 B2 | 11/2014 | LeBoeuf et al. | |
| 8,923,941 B2 | 12/2014 | LeBoeuf et al. | |
| 8,929,965 B2 | 1/2015 | LeBoeuf et al. | |
| 8,929,966 B2 | 1/2015 | LeBoeuf et al. | |
| 8,934,952 B2 | 1/2015 | LeBoeuf et al. | |
| 8,942,776 B2 | 1/2015 | LeBoeuf et al. | |
| 8,961,415 B2 | 2/2015 | LeBoeuf et al. | |
| 8,986,187 B2 | 3/2015 | Perkins et al. | |
| 8,989,830 B2 | 3/2015 | LeBoeuf et al. | |
| 9,044,180 B2 | 6/2015 | LeBoeuf et al. | |
| 9,049,528 B2 | 6/2015 | Fay et al. | |
| 9,055,379 B2 | 6/2015 | Puria et al. | |
| 9,124,120 B2 | 9/2015 | Cook et al. | |
| 9,131,312 B2 | 9/2015 | LeBoeuf et al. | |
| 9,154,891 B2 | 10/2015 | Puria et al. | |
| 9,226,083 B2 | 12/2015 | Puria et al. | |
| 9,277,335 B2 | 3/2016 | Perkins et al. | |
| 9,289,135 B2 | 3/2016 | LeBoeuf et al. | |
| 9,289,175 B2 | 3/2016 | LeBoeuf et al. | |
| 9,301,696 B2 | 4/2016 | LeBoeuf et al. | |
| 9,314,167 B2 | 4/2016 | LeBoeuf et al. | |
| 9,392,377 B2 | 7/2016 | Olsen et al. | |
| 9,427,191 B2 | 8/2016 | LeBoeuf | |
| 9,521,962 B2 | 12/2016 | LeBoeuf | |
| 9,538,921 B2 | 1/2017 | LeBoeuf et al. | |
| 9,544,675 B2 | 1/2017 | Facteau et al. | |
| 9,544,683 B2 | 1/2017 | Ganem et al. | |
| 9,544,700 B2 | 1/2017 | Puria et al. | |
| 9,564,862 B2 | 2/2017 | Hoyerby | |
| 9,591,409 B2 | 3/2017 | Puria et al. | |
| 9,749,758 B2 | 8/2017 | Puria et al. | |
| 9,750,462 B2 | 9/2017 | LeBoeuf et al. | |
| 9,788,785 B2 | 10/2017 | LeBoeuf | |
| 9,788,794 B2 | 10/2017 | LeBoeuf et al. | |
| 9,794,653 B2 | 10/2017 | Aumer et al. | |
| 9,801,552 B2 | 10/2017 | Romesburg | |
| 9,808,204 B2 | 11/2017 | LeBoeuf et al. | |
| 9,924,276 B2 | 3/2018 | Wenzel | |
| 9,930,458 B2 | 3/2018 | Freed et al. | |
| 9,949,035 B2 | 4/2018 | Rucker et al. | |
| 9,949,039 B2 | 4/2018 | Perkins et al. | |
| 9,961,454 B2 | 5/2018 | Puria et al. | |
| 10,003,877 B2 | 6/2018 | Perkins et al. | |
| 10,034,103 B2 | 7/2018 | Puria et al. | |
| 10,062,492 B2 * | 8/2018 | Wagman | H01F 27/2804 |
| 10,154,352 B2 | 12/2018 | Perkins et al. | |
| 10,178,483 B2 | 1/2019 | Teran et al. | |
| 10,237,663 B2 | 3/2019 | Puria et al. | |
| 10,284,964 B2 | 5/2019 | Olsen et al. | |
| 10,286,215 B2 | 5/2019 | Perkins et al. | |
| 10,292,601 B2 | 5/2019 | Perkins et al. | |
| 10,306,381 B2 | 5/2019 | Sandhu et al. | |
| 10,420,259 B2 * | 9/2019 | Jang | H02J 50/12 |
| 10,492,010 B2 | 11/2019 | Rucker et al. | |
| 10,506,310 B2 | 12/2019 | Aumer et al. | |

(56) References Cited

U.S. PATENT DOCUMENTS

| | | | |
|---|---|---|---|
| 10,511,913 B2 | 12/2019 | Puria et al. | |
| 10,511,920 B2 | 12/2019 | Haubrich et al. | |
| 10,516,946 B2 | 12/2019 | Puria et al. | |
| 10,516,949 B2 | 12/2019 | Puria et al. | |
| 10,516,950 B2 | 12/2019 | Perkins et al. | |
| 10,516,951 B2 | 12/2019 | Wenzel | |
| 10,531,206 B2 | 1/2020 | Freed et al. | |
| 10,555,100 B2 | 2/2020 | Perkins et al. | |
| 10,609,492 B2 | 3/2020 | Olsen et al. | |
| 10,743,110 B2 | 8/2020 | Puria et al. | |
| 10,779,094 B2 | 9/2020 | Rucker et al. | |
| 10,798,498 B2 | 10/2020 | Larkin et al. | |
| 10,855,112 B2 | 12/2020 | Richter | |
| 10,863,286 B2 | 12/2020 | Perkins et al. | |
| 10,937,433 B2 | 3/2021 | Larkin | |
| 11,057,714 B2 | 7/2021 | Puria et al. | |
| 11,058,305 B2 | 7/2021 | Perkins et al. | |
| 11,070,902 B2 | 7/2021 | Perkins et al. | |
| 11,070,927 B2 | 7/2021 | Rucker et al. | |
| 11,102,594 B2 | 8/2021 | Shaquer et al. | |
| 11,153,697 B2 | 10/2021 | Olsen et al. | |
| 11,166,114 B2 | 11/2021 | Perkins et al. | |
| 2002/0041176 A1* | 4/2002 | Eki | H02J 50/10 320/109 |
| 2003/0169894 A1 | 9/2003 | Lin | |
| 2004/0202340 A1 | 10/2004 | Armstrong et al. | |
| 2006/0023908 A1 | 2/2006 | Perkins et al. | |
| 2007/0100197 A1 | 5/2007 | Perkins et al. | |
| 2008/0049945 A1 | 2/2008 | Haenggi et al. | |
| 2009/0092271 A1 | 4/2009 | Fay et al. | |
| 2009/0253951 A1 | 10/2009 | Ball et al. | |
| 2009/0274328 A1 | 11/2009 | Gebhardt et al. | |
| 2009/0281367 A1 | 11/2009 | Cho et al. | |
| 2011/0062793 A1 | 3/2011 | Azancot et al. | |
| 2011/0084654 A1 | 4/2011 | Julstrom et al. | |
| 2011/0125222 A1 | 5/2011 | Perkins et al. | |
| 2011/0130622 A1 | 6/2011 | Ilberg et al. | |
| 2011/0144414 A1 | 6/2011 | Spearman et al. | |
| 2011/0152602 A1 | 6/2011 | Perkins et al. | |
| 2011/0196460 A1 | 8/2011 | Weiss | |
| 2011/0286616 A1 | 11/2011 | Beck et al. | |
| 2012/0039493 A1 | 2/2012 | Rucker et al. | |
| 2013/0099696 A1* | 4/2013 | Maxik | H05K 13/00 307/104 |
| 2013/0195300 A1* | 8/2013 | Larsen | H04B 5/0006 381/315 |
| 2014/0084698 A1 | 3/2014 | Asanuma et al. | |
| 2014/0286514 A1 | 9/2014 | Pluvinage et al. | |
| 2014/0288358 A1 | 9/2014 | Puria et al. | |
| 2014/0296620 A1 | 10/2014 | Puria et al. | |
| 2014/0321681 A1 | 10/2014 | Ball et al. | |
| 2014/0363037 A1 | 12/2014 | Nikles | |
| 2015/0104053 A1 | 4/2015 | Djalilian et al. | |
| 2015/0146900 A1 | 5/2015 | Vonlanthen et al. | |
| 2015/0364931 A1 | 12/2015 | Ren et al. | |
| 2016/0277854 A1 | 9/2016 | Puria et al. | |
| 2016/0309265 A1 | 10/2016 | Pluvinage et al. | |
| 2016/0330555 A1 | 11/2016 | Vonlanthen et al. | |
| 2017/0095202 A1 | 4/2017 | Facteau et al. | |
| 2017/0195801 A1 | 7/2017 | Rucker et al. | |
| 2017/0195804 A1 | 7/2017 | Sandhu et al. | |
| 2017/0195806 A1 | 7/2017 | Atamaniuk et al. | |
| 2018/0048970 A1 | 2/2018 | Demartini et al. | |
| 2018/0077503 A1 | 3/2018 | Shaquer et al. | |
| 2018/0077504 A1* | 3/2018 | Shaquer | H04R 25/656 |
| 2018/0160241 A1 | 6/2018 | Gustafsson et al. | |
| 2018/0213331 A1 | 7/2018 | Rucker et al. | |
| 2018/0262846 A1 | 9/2018 | Perkins et al. | |
| 2018/0270560 A1 | 9/2018 | Perkins et al. | |
| 2018/0317026 A1 | 11/2018 | Puria | |
| 2019/0116416 A1 | 4/2019 | Lawand et al. | |
| 2019/0116436 A1 | 4/2019 | Lawand et al. | |
| 2019/0166438 A1 | 5/2019 | Perkins et al. | |
| 2019/0174240 A1 | 6/2019 | Johnson et al. | |
| 2019/0217104 A1 | 7/2019 | Perkins et al. | |
| 2019/0230449 A1 | 7/2019 | Puria | |
| 2019/0239005 A1 | 8/2019 | Sandhu et al. | |
| 2019/0253811 A1 | 8/2019 | Unno et al. | |
| 2019/0253815 A1 | 8/2019 | Atamaniuk et al. | |
| 2019/0306613 A1 | 10/2019 | Qian et al. | |
| 2019/0394584 A1 | 12/2019 | Nikles et al. | |
| 2020/0037082 A1 | 1/2020 | Perkins et al. | |
| 2020/0069944 A1 | 3/2020 | Gnansia et al. | |
| 2020/0084551 A1 | 3/2020 | Puria et al. | |
| 2020/0092662 A1 | 3/2020 | Wenzel | |
| 2020/0092664 A1 | 3/2020 | Freed et al. | |
| 2020/0128338 A1 | 4/2020 | Shaquer et al. | |
| 2020/0128339 A1 | 4/2020 | Perkins et al. | |
| 2020/0137503 A1 | 4/2020 | Demartini et al. | |
| 2020/0186942 A1 | 6/2020 | Flaherty et al. | |
| 2020/0267485 A1 | 8/2020 | Perkins et al. | |
| 2020/0351600 A1 | 11/2020 | Shaquer et al. | |
| 2020/0396551 A1 | 12/2020 | Dy et al. | |
| 2021/0029451 A1 | 1/2021 | Fitz et al. | |
| 2021/0029474 A1 | 1/2021 | Larkin et al. | |
| 2021/0105566 A1 | 4/2021 | Kirchhoff | |
| 2021/0152948 A1 | 5/2021 | Prusick et al. | |
| 2021/0152951 A1 | 5/2021 | Wenzel et al. | |
| 2021/0152952 A1 | 5/2021 | Wenzel et al. | |
| 2021/0152956 A1 | 5/2021 | Arne et al. | |
| 2021/0152957 A1 | 5/2021 | Wenzel | |
| 2021/0152958 A1 | 5/2021 | Nikles | |
| 2021/0160631 A1 | 5/2021 | Arne et al. | |
| 2021/0185462 A1 | 6/2021 | Perkins et al. | |
| 2021/0186343 A1 | 6/2021 | Perkins et al. | |
| 2021/0211813 A1 | 7/2021 | Larkin et al. | |
| 2021/0266686 A1 | 8/2021 | Puria et al. | |
| 2021/0274293 A1 | 9/2021 | Perkins et al. | |
| 2021/0289301 A1 | 9/2021 | Atamaniuk et al. | |
| 2021/0306777 A1 | 9/2021 | Rucker et al. | |
| 2021/0307623 A1 | 10/2021 | Perkins et al. | |
| 2021/0314712 A1 | 10/2021 | Shaquer et al. | |
| 2021/0366493 A1 | 11/2021 | Larkin | |
| 2021/0392449 A1 | 12/2021 | Flaherty et al. | |
| 2021/0400405 A1 | 12/2021 | Perkins et al. | |

FOREIGN PATENT DOCUMENTS

| | | |
|---|---|---|
| KR | 20180129243 A | 12/2018 |
| WO | WO-2006014915 A2 | 2/2006 |
| WO | WO-2006042298 A2 | 4/2006 |
| WO | WO-2006118819 A2 | 11/2006 |
| WO | WO-2007053653 A2 | 5/2007 |
| WO | WO-2009046329 A1 | 4/2009 |
| WO | WO-2009049320 A1 | 4/2009 |
| WO | WO-2009155358 A1 | 12/2009 |
| WO | WO-2009155361 A1 | 12/2009 |
| WO | WO-2010033932 A1 | 3/2010 |
| WO | WO-2010033933 A1 | 3/2010 |
| WO | WO-2010077781 A2 | 7/2010 |
| WO | WO-2010141895 A1 | 12/2010 |
| WO | WO-2010147935 A1 | 12/2010 |
| WO | WO-2010148324 A1 | 12/2010 |
| WO | WO-2010148345 A2 | 12/2010 |
| WO | WO-2010151629 A2 | 12/2010 |
| WO | WO-2010151636 A2 | 12/2010 |
| WO | WO-2010151647 A2 | 12/2010 |
| WO | WO-2011005479 A2 | 1/2011 |
| WO | WO-2011005500 A2 | 1/2011 |
| WO | WO-2012088187 A2 | 6/2012 |
| WO | WO-2016011044 A1 | 1/2016 |
| WO | WO-2016146487 A1 | 9/2016 |
| WO | WO-2017059218 A1 | 4/2017 |
| WO | WO-2017059240 A1 | 4/2017 |
| WO | WO-2017116791 A1 | 7/2017 |
| WO | WO-2017116865 A1 | 7/2017 |
| WO | WO-2018035036 A1 | 2/2018 |
| WO | WO-2018048794 A1 | 3/2018 |
| WO | WO-2018081121 A1 | 5/2018 |
| WO | WO-2018093733 A1 | 5/2018 |
| WO | WO-2019055308 A1 | 3/2019 |
| WO | WO-2019143702 A1 | 7/2019 |
| WO | WO-2019173470 A1 | 9/2019 |
| WO | WO-2019199680 A1 | 10/2019 |

(56) References Cited

FOREIGN PATENT DOCUMENTS

| WO | WO-2019199683 A1 | 10/2019 |
|---|---|---|
| WO | WO-2020028082 A1 | 2/2020 |
| WO | WO-2020028083 A1 | 2/2020 |
| WO | WO-2020028084 A1 | 2/2020 |
| WO | WO-2020028085 A1 | 2/2020 |
| WO | WO-2020028086 A1 | 2/2020 |
| WO | WO-2020028087 A1 | 2/2020 |
| WO | WO-2020028088 A1 | 2/2020 |
| WO | WO-2020176086 A1 | 9/2020 |
| WO | WO-2020198334 A1 | 10/2020 |
| WO | WO-2021003087 A1 | 1/2021 |
| WO | WO-2021173520 A1 | 9/2021 |
| WO | WO-2021211318 A1 | 10/2021 |
| WO | WO-2021216293 A1 | 10/2021 |

OTHER PUBLICATIONS

Asbeck, et al. Scaling Hard Vertical Surfaces with Compliant Microspine Arrays, The International Journal of Robotics Research 2006; 25; 1165-79.

Atasoy [Paper] Opto-acoustic Imaging, for BYM504E Biomedical Imaging Systems class at ITU, downloaded from the Internet www2.itu.edu.td-cilesiz/courses/BYM504- 2005-OA504041413.pdf, 14 pages.

Athanassiou, et al. Laser controlled photomechanical actuation of photochromic polymers Microsystems. Rev. Adv. Mater. Sci. 2003; 5:245-251.

Autumn, et al. Dynamics of geckos running vertically, The Journal of Experimental Biology 209, 260-272, (2006).

Autumn, et al., Evidence for van der Waals adhesion in gecko setae, www.pnas.orgycgiydoiy10.1073ypnas.192252799 (2002).

Ayatollahi, et al. Design and Modeling of Micromachined Condenser MEMS Loudspeaker using Permanent Magnet Neodymium-Iron-Boron (Nd—Fe—B). IEEE International Conference on Semiconductor Electronics, 2006. ICSE '06, Oct. 29 2006-Dec. 1, 2006; 160-166.

Baer, et al. Effects of Low Pass Filtering on the Intelligibility of Speech in Noise for People With and Without Dead Regions at High Frequencies. J. Acost. Soc. Am 112 (3), pt. 1, (Sep. 2002), pp. 1133-1144.

Best, et al. The influence of high frequencies on speech localization. Abstract 981 (Feb. 24, 2003) from www.aro.org/abstracts/abstracts.html.

Birch, et al. Microengineered systems for the hearing impaired. IEE Colloquium on Medical Applications of Microengineering, Jan. 31, 1996; pp. 2/1-2/5.

Boedts. Tympanic epithelial migration, Clinical Otolaryngology 1978, 3, 249-253.

Burkhard, et al. Anthropometric Manikin for Acoustic Research. J. Acoust. Soc. Am., vol. 58, No. 1, (Jul. 1975), pp. 214-222.

Camacho-Lopez, et al. Fast Liquid Crystal Elastomer Swims Into the Dark, Electronic Liquid Crystal Communications. Nov. 26, 2003; 9 pages total.

Carlile, et al. Frequency bandwidth and multi-talker environments. Audio Engineering Society Convention 120. Audio Engineering Society, May 20-23, 2006. Paris, France. 118: 8 pages.

Carlile, et al. Spatialisation of talkers and the segregation of concurrent speech. Abstract 1264 (Feb. 24, 2004) from www.aro.org/abstracts/abstracts.html.

Cheng, et al. A Silicon Microspeaker for Hearing Instruments. Journal of Micromechanics and Microengineering 2004; 14(7):859-866.

Dictionary.com's (via American Heritage Medical Dictionary) online dictionary definition of 'percutaneous'. Accessed on Jun. 3, 2013. 2 pages.

Merriam-Webster's online dictionary definition of 'percutaneous'. Accessed on Jun. 3, 2013. 3 pages.

Datskos, et al. Photoinduced and thermal stress in silicon microcantilevers. Applied Physics Letters. Oct. 19, 1998; 73(16):2319-2321.

Decraemer, et al. A method for determining three-dimensional vibration in the ear. Hearing Res., 77:19-37 (1994).

Doyon. Laser Wire Stripping for Medical Device Manufacturing Applications. ConnectorSupplier.com. Oct. 10, 2017. [retrieved on Jun. 14, 2021], Retrieved from the Internet at URL: https://www.connectorsupplier.com/laser-wire-stripping-medical-device-manufacturing-applications/ (7 pages).

Dundas et al. The Earlens Light-Driven Hearing Aid: Top 10 questions and answers. Hearing Review. 2018;25(2):36-39.

Ear. Downloaded from the Internet. Accessed Jun. 17, 2008. 4 pages. URL: http://wwwmgs.bionet.nsc.ru/mgs/gnw/trrd/thesaurus/Se/ear.html.

Edinger, J.R. High-Quality Audio Amplifier With Automatic Bias Control. Audio Engineering; Jun. 1947; pp. 7-9.

Fay. Cat eardrum mechanics. Ph.D. thesis. Dissertation submitted to Department of Aeronautics and Astronautics. Stanford University. May 2001; 210 pages total.

Fay, et al. Cat eardrum response mechanics. Mechanics and Computation Division. Department of Mechanical Engineering. Stanford University. 2002; 10 pages total.

Fay, et al. Preliminary evaluation of a light-based contact hearing device for the hearing impaired. Otol Neurotol. Jul. 2013;34(5):912-21. doi: 10.1097/MAO.0b013e31827de4b1.

Fay, et al. The discordant eardrum, PNAS, Dec. 26, 2006, vol. 103, No. 52, p. 19743-19748.

Fletcher. Effects of Distortion on the Individual Speech Sounds. Chapter 18, ASA Edition of Speech and Hearing in Communication, Acoust Soc.of Am. (republished in 1995) pp. 415-423.

Folkeard, et al. Detection, Speech Recognition, Loudness, and Preference Outcomes With a Direct Drive Hearing Aid: Effects of Bandwidth. Trends Hear. Jan.-Dec. 2021; 25: 1-17. doi: 10.1177/2331216521999139.

Freyman, et al. Spatial Release from Informational Masking in Speech Recognition. J. Acost. Soc. Am., vol. 109, No. 5, pt. 1, (May 2001); 2112-2122.

Freyman, et al. The Role of Perceived Spatial Separation in the Unmasking of Speech. J. Acoust. Soc. Am., vol. 106, No. 6, (Dec. 1999); 3578-3588.

Fritsch, et al. EarLens transducer behavior in high-field strength MRI scanners. Otolaryngol Head Neck Surg. Mar. 2009;140(3):426-8. doi: 10.1016/j.otohns.2008.10.016.

Galbraith et al. A wide-band efficient inductive transdermal power and data link with coupling insensitive gain IEEE Trans Biomed Eng. Apr. 1987;34(4):265-75.

Gantz, et al. Broad Spectrum Amplification with a Light Driven Hearing System. Combined Otolaryngology Spring Meetings, 2016 (Chicago).

Gantz, et al. Light Driven Hearing System: A Multi-Center Clinical Study. Association for Research in Otolaryngology Annual Meeting, 2016 (San Diego).

Gantz, et al. Light-Driven Contact Hearing Aid for Broad Spectrum Amplification: Safety and Effectiveness Pivotal Study. Otology & Neurotology Journal, 2016 (in review).

Gantz, et al. Light-Driven Contact Hearing Aid for Broad-Spectrum Amplification: Safety and Effectiveness Pivotal Study. Otology & Neurotology. Copyright 2016. 7 pages.

Ge, et al., Carbon nanotube-based synthetic gecko tapes, p. 10792-10795, PNAS, Jun. 26, 2007, vol. 104, No. 26.

Gennum. GA3280 Preliminary Data Sheet: Voyageur TD Open Platform DSP System for Ultra Low Power Audio Processing. Oct. 2006; 17 pages. Downloaded from the Internet: www.sounddesigntechnologies.com/products/pdf/37601DOC.pdf.

Gobin, et al. Comments on the physical basis of the active materials concept. Proc. SPIE 2003; 4512:84-92.

Gorb, et al. Structural Design and Biomechanics of Friction-Based Releasable Attachment Devices in Insects. Integr Comp Biol. Dec. 2002. 42(6):1127-1139. doi: 10.1093/icb/42.6.1127.

Hakansson, et al. Percutaneous vs. transcutaneous transducers for hearing by direct bone conduction (Abstract). Otolaryngol Head Neck Surg. Apr. 1990;102(4):339-44.

(56) References Cited

OTHER PUBLICATIONS

Hato, et al. Three-dimensional stapes footplate motion in human temporal bones. Audiol. Neurootol., 8:140-152 (Jan. 30, 2003).
Hofman, et al. Relearning Sound Localization With New Ears. Nature Neuroscience, vol. 1, No. 5, (Sep. 1998); 417-421.
International search report with written opinion dated Jul. 14, 2021 for PCT/US2021/025773.
International search report with written opinion dated Jul. 20, 2021 for PCT/US2021/026357.
International search report with written opinion dated Jul. 29, 2021 for PCT/US2021/019176.
International search report with written opinion dated Oct. 3, 2019 for PCT/US2019/042920.
International search report with written opinion dated Oct. 16, 2019 for PCT/US2019/042925.
International search report with written opinion dated Oct. 18, 2019 for PCT/US2019/042910.
International search report with written opinion dated Oct. 18, 2019 for PCT/US2019/042913.
International search report with written opinion dated Oct. 18, 2019 for PCT/US2019/042916.
International search report with written opinion dated Oct. 22, 2019 for PCT/US2019/042935.
International search report with written opinion dated Oct. 23, 2019 for PCT/US2019/042932.
Izzo, et al. Laser Stimulation of Auditory Neurons: Effect of Shorter Pulse Duration and Penetration Depth. Biophys J. Apr. 15, 2008;94(8):3159-3166.
Izzo, et al. Laser Stimulation of the Auditory Nerve. Lasers Surg Med. Sep. 2006;38(8):745-753.
Izzo, et al. Selectivity of Neural Stimulation in the Auditory System: A Comparison of Optic and Electric Stimuli. J Biomed Opt. Mar.-Apr. 2007;12(2):021008.
Jackson, et al. Multiphoton and Transmission Electron Microscopy of Collagen in Ex Vivo Tympanic Membranes. Ninth Annual Symposium on Biomedical Computation at Stanford (BCATS). BCATS 2008 Abstract Book. Poster 18:56. Oct. 2008. URL: www.stanford.edu/~puria1/BCATS08.html.
Jian, et al. A 0.6 V, 1.66 mW energy harvester and audio driver for tympanic membrane transducer with wirelessly optical signal and power transfer. InCircuits and Systems (ISCAS), 2014 IEEE International Symposium on Jun. 1, 2014. 874-7. IEEE.
Jin, et al. Speech Localization. J. Audio Eng. Soc. convention paper, presented at the AES 112th Convention, Munich, Germany, May 10-13, 2002, 13 pages total.
Khaleghi, et al. Attenuating the ear canal feedback pressure of a laser-driven hearing aid. J Acoust Soc Am. Mar. 2017;141(3):1683.
Khaleghi, et al. Attenuating the feedback pressure of a light-activated hearing device to allows microphone placement at the ear canal entrance. IHCON 2016, International Hearing Aid Research Conference, Tahoe City, CA, Aug. 2016.
Khaleghi, et al. Characterization of Ear-Canal Feedback Pressure due to Umbo-Drive Forces: Finite-Element vs. Circuit Models. ARO Midwinter Meeting 2016, (San Diego).
Khaleghi, et al. Mechano-Electro-Magnetic Finite Element Model of a Balanced Armature Transducer for a Contact Hearing Aid. Proc. MoH 2017, Mechanics of Hearing workshop, Brock University, Jun. 2017.
Khaleghi, et al. Multiphysics Finite Element Model of a Balanced Armature Transducer used in a Contact Hearing Device. ARO 2017, 40th ARO MidWinter Meeting, Baltimore, MD, Feb. 2017.
Kiessling, et al. Occlusion Effect of Earmolds with Different Venting Systems. J Am Acad Audiol. Apr. 2005;16(4):237-49.
Killion, et al. The case of the missing dots: AI and SNR loss. The Hearing Journal, 1998. 51(5), 32-47.
Killion. Myths About Hearing in Noise and Directional Microphones. The Hearing Review. Feb. 2004; 11(2):14, 16, 18, 19, 72 & 73.
Killion. SNR loss: I can hear what people say but I can't understand them. The Hearing Review, 1997; 4(12):8-14.

Knight, D. Diode detectors for RF measurement. Paper. Jan. 1, 2016. [Retrieved from 1-16 online] (retrieved Feb. 11, 2020) abstract, p. 1; section 1, p. 6; section 1.3, p. 9; section 3 voltage-double rectifier, p. 21; section 5, p. 27. URL: g3ynh.info/circuits/Diode_det.pdf.
Lee, et al. A Novel Opto-Electromagnetic Actuator Coupled to the tympanic Membrane. J Biomech. Dec. 5, 2008;41(16):3515-8. Epub Nov. 7, 2008.
Lee, et al. The optimal magnetic force for a novel actuator coupled to the tympanic membrane: a finite element analysis. Biomedical engineering: applications, basis and communications. 2007; 19(3):171-177.
Levy, et al. Characterization of the available feedback gain margin at two device microphone locations, in the fossa triangularis and Behind the Ear, for the light-based contact hearing device. Acoustical Society of America (ASA) meeting, 2013 (San Francisco).
Levy, et al. Extended High-Frequency Bandwidth Improves Speech Reception in the Presence of Spatially Separated Masking Speech. Ear Hear. Sep.-Oct. 2015;36(5):e214-24. doi: 10.1097/AUD.0000000000000161.
Levy et al. Light-driven contact hearing aid: a removable direct-drive hearing device option for mild to severe sensorineural hearing impairment. Conference on Implantable Auditory Prostheses, Tahoe City, CA, Jul. 2017. 4 pages.
Lezal. Chalcogenide glasses—survey and progress. Journal of Optoelectronics and Advanced Materials. Mar. 2003; 5(1):23-34.
Mah. Fundamentals of photovoltaic materials. National Solar Power Research Institute. Dec. 21, 1998, 3-9.
Makino, et al. Epithelial migration in the healing process of tympanic membrane perforations. Eur Arch Otorhinolaryngol. 1990; 247: 352-355.
Makino, et al., Epithelial migration on the tympanic membrane and external canal, Arch Otorhinolaryngol (1986) 243:39-42.
Markoff. Intuition + Money: An Aha Moment. New York Times Oct. 11, 2008, p. BU4, 3 pages total.
Martin, et al. Utility of Monaural Spectral Cues is Enhanced in the Presence of Cues to Sound-Source Lateral Angle. JARO. 2004; 5:80-89.
McElveen et al. Overcoming High-Frequency Limitations of Air Conduction Hearing Devices Using a Light-Driven Contact Hearing Aid. Poster presentation at the Triological Society, 120th Annual Meeting at COSM, Apr. 28, 2017; San Diego, CA.
Michaels, et al., Auditory epithelial migration on the human tympanic membrane: II. The existence of two discrete migratory pathways and their embryologic correlates. Am J Anat. Nov. 1990. 189(3):189-200. DOI: 10.1002/aja.1001890302.
Moore, et al. Perceived naturalness of spectrally distorted speech and music. J Acoust Soc Am. Jul. 2003;114(1):408-19.
Moore, et al. Spectro-temporal characteristics of speech at high frequencies, and the potential for restoration of audibility to people with mild-to-moderate hearing loss. Ear Hear. Dec. 2008;29(6):907-22. doi: 10.1097/AUD.0b013e3181824616.
Moore. Loudness perception and intensity resolution. Cochlear Hearing Loss, Chapter 4, pp. 90-115, Whurr Publishers Ltd., London (1998).
Murphy, et al. Adhesion and anisotropic friction enhancements of angled heterogeneous micro-fiber arrays with spherical and spatula tips. Journal of Adhesion Science and Technology. vol 21. No. 12-13. Aug. 2007. pp. 1281-1296. DOI: 10.1163/156856107782328380.
Murugasu, et al. Malleus-to-footplate versus malleus-to-stapes-head ossicular reconstruction prostheses: temporal bone pressure gain measurements and clinical audiological data. Otol Neurotol. Jul. 2005;26(4):572-82. DOI: 10.1097/01.mao.0000178151.44505.1b.
Musicant, et al. Direction-dependent spectral properties of cat external ear: new data and cross-species comparisons. J Acoust Soc Am. Feb. 1990. 87(2):757-781. DOI: 10.1121/1.399545.
National Semiconductor. LM4673 Boomer: Filterless, 2.65W, Mono, Class D Audio Power Amplifier. Nov. 1, 2007. 24 pages. [Data Sheet] downloaded from the Internet: URL: www.national.com/ds/LM/LM4673.pdf.
Nishihara, et al. Effect of changes in mass on middle ear function. Otolaryngol Head Neck Surg. Nov. 1993;109(5):889-910.

(56) References Cited

OTHER PUBLICATIONS

O'Connor, et al. Middle ear Cavity and Ear Canal Pressure-Driven Stapes Velocity Responses in Human Cadaveric Temporal Bones. J Acoust Soc Am. Sep. 2006;120(3):1517-28.
Office action dated Jan. 6, 2022 for U.S. Appl. No. 17/159,495.
Office action dated Dec. 21, 2021 for U.S. Appl. No. 17/159,493.
Park, et al. Design and analysis of a microelectromagnetic vibration transducer used as an implantable middle ear hearing aid. J. Micromech. Microeng. vol. 12 (2002), pp. 505-511.
Perkins, et al. Light-based Contact Hearing Device: Characterization of available Feedback Gain Margin at two device microphone locations. Presented at AAO-HNSF Annual Meeting, 2013 (Vancouver).
Perkins, et al. The EarLens Photonic Transducer: Extended bandwidth. Presented at AAO-HNSF Annual Meeting, 2011 (San Francisco).
Perkins, et al. The EarLens System: New sound transduction methods. Hear Res. Feb. 2, 2010; 10 pages total.
Perkins, R. Earlens tympanic contact transducer: a new method of sound transduction to the human ear. Otolaryngol Head Neck Surg. Jun. 1996;114(6):720-8.
Poosanaas, et al. Influence of sample thickness on the performance of photostrictive ceramics, J. App. Phys. Aug. 1, 1998; 84(3):1508-1512.
Puria et al. A gear in the middle ear. ARO Denver CO, 2007b.
Puria, et al. Cues above 4 kilohertz can improve spatially separated speech recognition. The Journal of the Acoustical Society of America, 2011, 129, 2384.
Puria, et al. Extending bandwidth above 4 kHz improves speech understanding in the presence of masking speech. Association for Research in Otolaryngology Annual Meeting, 2012 (San Diego).
Puria, et al. Extending bandwidth provides the brain what it needs to improve hearing in noise. First international conference on cognitive hearing science for communication, 2011 (Linkoping, Sweden).
Puria, et al. Hearing Restoration: Improved Multi-talker Speech Understanding. 5th International Symposium on Middle Ear Mechanics in Research and Otology (MEMRO), Jun. 2009 (Stanford University).
Puria, et al. Imaging, Physiology and Biomechanics of the middle ear: Towards understating the functional consequences of anatomy. Stanford Mechanics and Computation Symposium, 2005, ed Fong J.
Puria, et al. Malleus-to-footplate ossicular reconstruction prosthesis positioning: cochleovestibular pressure optimization. Otol Nerotol. May 2005; 26(3):368-379. DOI: 10.1097/01.mao.0000169788.07460. 4a.
Puria, et al. Measurements and model of the cat middle ear: Evidence of tympanic membrane acoustic delay. J. Acoust. Soc. Am., 104(6):3463-3481 (Dec. 1998).
Puria, et al., Mechano-Acoustical Transformations in A. Basbaum et al., eds., The Senses: A Comprehensive Reference, v3, p. 165-201, Academic Press (2008).
Puria, et al. Middle Ear Morphometry From Cadaveric Temporal Bone MicroCT Imaging. Proceedings of the 4th International Symposium, Zurich, Switzerland, Jul. 27-30, 2006, Middle Ear Mechanics in Research and Otology, pp. 260-269.
Puria, et al. Sound-Pressure Measurements in the Cochlear Vestibule of Human-Cadaver Ears. Journal of the Acoustical Society of America. 1997; 101 (5-1): 2754-2770.
Puria, et al. Temporal-Bone Measurements of the Maximum Equivalent Pressure Output and Maximum Stable Gain of a Light-Driven Hearing System That Mechanically Stimulates the Umbo. Otol Neurotol. Feb. 2016;37(2):160-6. doi: 10.1097/MAO. 0000000000000941.
Puria, et al. The EarLens Photonic Hearing Aid. Association for Research in Otolaryngology Annual Meeting, 2012 (San Diego).
Puria, et al. The Effects of bandwidth and microphone location on understanding of masked speech by normal-hearing and hearing-impaired listeners. International Conference for Hearing Aid Research (IHCON) meeting, 2012 (Tahoe City).
Puria, et al. Tympanic-membrane and malleus-incus-complex co-adaptations for high-frequency hearing in mammals. Hear Res. May 2010;263(1-2):183-90. doi: 10.1016/j.heares.2009.10.013. Epub Oct. 28, 2009.
Puria. Measurements of human middle ear forward and reverse acoustics: implications for otoacoustic emissions. J Acoust Soc Am. May 2003;113(5):2773-89.
Puria, S. Middle Ear Hearing Devices. Chapter 10. Part of the series Springer Handbook of Auditory Research pp. 273-308. Date: Feb. 9, 2013.
Qu, et al. Carbon nanotube arrays with strong shear binding-on and easy normal lifting-off. Science. Oct. 10, 2008. 322(5899):238-342. doi: 10.1126/science.1159503.
Robles, et al. Mechanics of the mammalian cochlea. Physiol Rev. Jul. 2001;81(3):1305-52.
Roush. SiOnyx Brings "Black Silicon" into the Light; Material Could Upend Solar, Imaging Industries. Xconomy, Oct. 12, 2008, retrieved from the Internet: www.xconomy.com/boston/2008/10/12/sionyx-brings-black-silicon-into-the-light¬material-could-upend-solar-imaging-industries 4 pages total.
Rubinstein. How cochlear implants encode speech. Curr Opin Otolaryngol Head Neck Surg. Oct. 2004. 12(5):444-448. DOI: 10.1097/01.moo.0000134452.24819.c0.
School of Physics Sydney, Australia. Acoustic Compliance, Inertance and Impedance. 1-6. (2018). http://www.animations.physics.unsw.edu.au/jw/compliance-inertance-impedance.htm.
Sekaric, et al. Nanomechanical resonant structures as tunable passive modulators. Applied Physics Letters. May 2002. 80(19):3617-3619. DOI: 10.1063/1.1479209.
Shaw. Transformation of Sound Pressure Level From the Free Field to the Eardrum in the Horizontal Plane. J. Acoust. Soc. Am., vol. 56, No. 6, (Dec. 1974), 1848-1861.
Shih, et al. Shape and displacement control of beams with various boundary conditions via photostrictive optical actuators. Proc. IMECE. Nov. 2003; 1-10.
Smith, Julius O. Digital Audio Resampling Home Page. CCRMA—Stanford University. Jan. 2012. 19 pages, http://www-ccrma.stanford.edu/~jos/resample/.
Smith. The Scientist and Engineers Guide to Digital Signal Processing. California Technical Publishing. 1997. Chapter 22. pp. 351-372.
Song, et al. The development of a non-surgical direct drive hearing device with a wireless actuator coupled to the tympanic membrane. Applied Acoustics. Dec. 31, 2013;74(12):1511-8.
Sound Design Technologies. Voyager TD Open Platform DSP System for Ultra Low Power Audio Processing—GA3280 Data Sheet. Oct. 2007. 15 pages. Retrieved from the Internet: www.sounddes.com/pdf/37601DOC.pdf.
Spolenak, et al. Effects of contact shape on the scaling of biological attachments. Proc. R. Soc. A. 2005; 461:305-319.
Stenfelt, et al. Bone-Conducted Sound: Physiological and Clinical Aspects. Otology & Neurotology, Nov. 2005; 26 (6):1245-1261.
Struck, et al. Comparison of Real-world Bandwidth in Hearing Aids vs Earlens Light-driven Hearing Aid System. The Hearing Review. TechTopic: EarLens. Hearingreview.com. Mar. 14, 2017. pp. 24-28.
Stuchlik, et al. Micro-Nano Actuators Driven by Polarized Light. IEEE Proc. Sci. Meas. Techn. Mar. 2004; 151(2):131-136.
Suski, et al. Optically activated ZnO/SiGi2/Si cantilever beams. Sensors and Actuators A: Physical. Sep. 1990. 24(3): 221-225. https://doi.org/10.1016/0924-4247(90)80062-A.
Takagi, et al. Mechanochemical Synthesis of Piezoelectric PLZT Powder. KONA. 2003; 51(21):234-241.
Thakoor, et al. Optical microactuation in piezoceramics. Proc. SPIE. Jul. 1998; 3328:376-391.
Thompson. Tutorial on microphone technologies for directional hearing aids. Hearing Journal. Nov. 2003; 56(11):14-16,18, 20-21.
Tzou, et al. Smart Materials, Precision Sensors/Actuators, Smart Structures, and Structronic Systems. Mechanics of Advanced Materials and Structures. 2004; 11:367-393.
Uchino, et al. Photostricitve actuators. Ferroelectrics. 2001; 258:147-158.

(56) References Cited

OTHER PUBLICATIONS

Vickers, et al. Effects of Low-Pass Filtering on the Intelligibility of Speech in Quiet for People With and Without Dead Regions at High Frequencies. J. Acoust. Soc. Am. Aug. 2001; 110(2):1164-1175.

Vinge. Wireless Energy Transfer by Resonant Inductive Coupling. Master of Science Thesis. Chalmers University of Technology. 1-83 (2015).

Vinikman-Pinhasi, et al. Piezoelectric and Piezooptic Effects in Porous Silicon. Applied Physics Letters, Mar. 2006; 88(11): 111905-1-111905-2. DOI: 10.1063/1.2186395.

Wang, et al. Preliminary Assessment of Remote Photoelectric Excitation of an Actuator for a Hearing Implant. Proceeding of the 2005 IEEE, Engineering in Medicine and Biology 27th Annual Conference, Shanghai, China. Sep. 1-4, 2005; 6233-6234.

Web Books Publishing, "The Ear," accessed online Jan. 22, 2013, available online Nov. 2, 2007 at http://www.web-books.com/eLibrary/Medicine/Physiology/Ear/Ear.htm.

Wiener, et al. On the Sound Pressure Transformation by the Head and Auditory Meatus of the Cat. Acta Otolaryngol. Mar. 1966;61(3):255-269.

Wightman, et al. Monaural Sound Localization Revisited. J Acoust Soc Am. Feb. 1997;101(2):1050-1063.

Wiki. Sliding Bias Variant 1, Dynamic Hearing (2015).

Wikipedia. Headphones. Downloaded from the Internet. Accessed Oct. 27, 2008. 7 pages. URL: http://en.wikipedia.org/wiki/Headphones.

Wikipedia. Inductive Coupling. 1-2 (Jan. 11, 2018). https://en.wikipedia.org/wiki/Inductive_coupling.

Wikipedia. Pulse-density Coupling. 1-4 (Apr. 6, 2017). https://en.wikipedia.org/wiki/Pulse-density_modulation.

Wikipedia. Resonant Inductive Coupling. 1-11 (Jan. 12, 2018). https://en.wikipedia.org/wiki/Resonant_inductive_coupling#cite_note-13.

Yao, et al. Adhesion and sliding response of a biologically inspired fibrillar surface: experimental observations, J. R. Soc. Interface (2008) 5, 723-733 doi:10.1098/rsif.2007.1225 Published online Oct. 30, 2007.

Yao, et al. Maximum strength for intermolecular adhesion of nanospheres at an optimal size. J R Soc Interface. Nov. 6, 2008;5(28):1363-70. doi: 10.1098/rsif.2008.0066.

Yi, et al. Piezoelectric Microspeaker with Compressive Nitride Diaphragm. The Fifteenth IEEE International Conference on Micro Electro Mechanical Systems, 2002; 260-263.

Yu, et al. Photomechanics: Directed bending of a polymer film by light. Nature. Sep. 11, 2003;425(6954):145. DOI: 10.1038/425145a.

\* cited by examiner

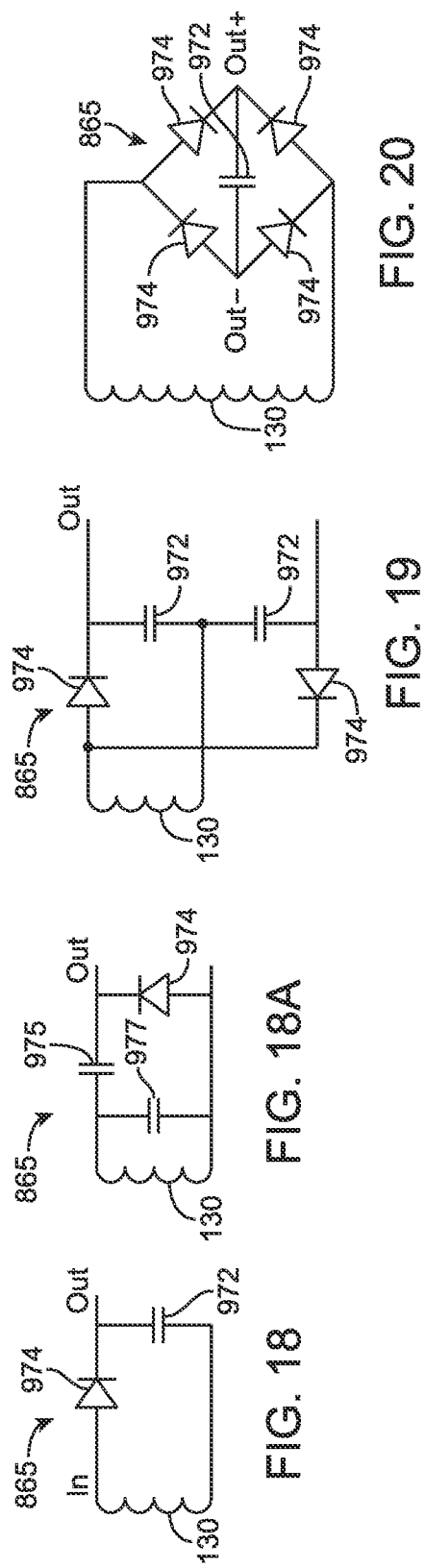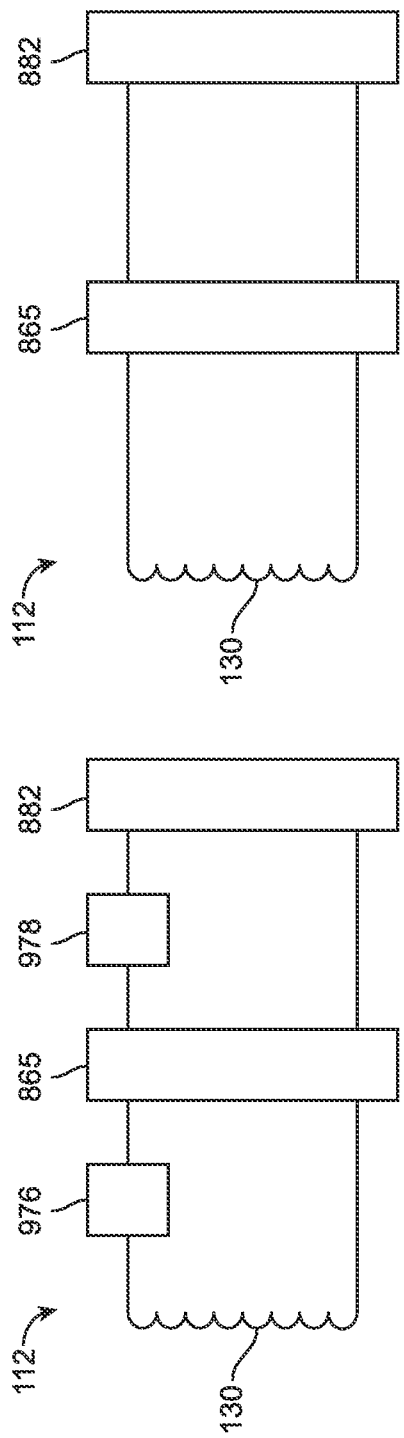

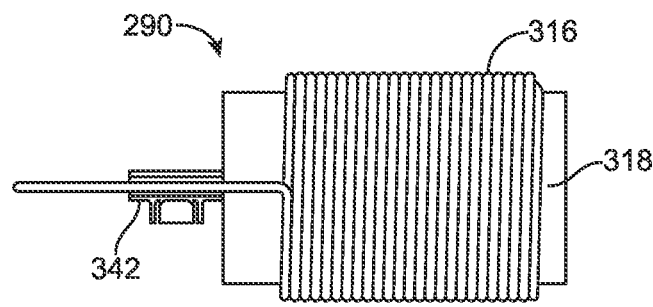
FIG. 38
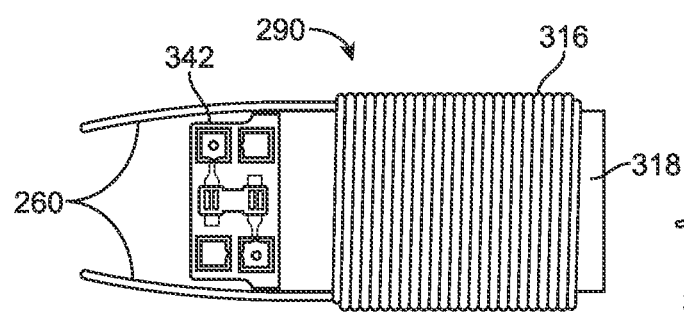 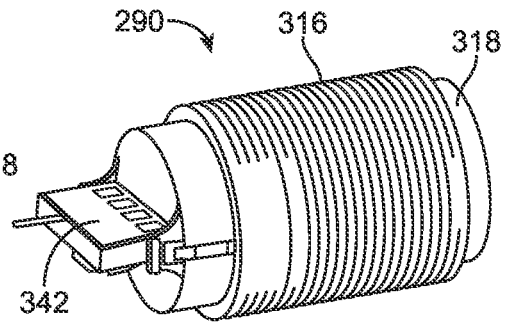
FIG. 39　　　　　　　FIG. 40
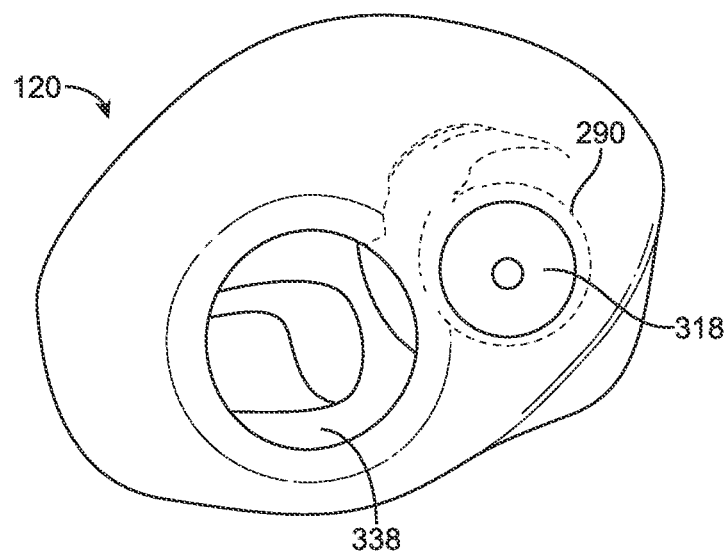
FIG. 41

Magnetic-flux-*B*-entering-coil

NEARFIELD INDUCTIVE COUPLING IN A CONTACT HEARING SYSTEM

CROSS REFERENCE TO RELATED APPLICATIONS

This patent application is a continuation of PCT Application No. PCT/US19/42910, filed Jul. 23, 2019; which claims priority to U.S. Provisional Patent Applications Nos. 62/712,458, filed Jul. 31, 2018; 62/712,462, filed Jul. 31, 2018; 62/712,466, filed Jul. 31, 2018; 62/712,474, filed Jul. 31, 2018; 62/712,478, filed Jul. 31, 2018; 62/831,074, filed Apr. 8, 2019; and 62/831,085, filed Apr. 8, 2019; the contents of which are incorporated herein by reference.

BACKGROUND OF THE INVENTION

Contact hearing aids (such as, for example, the light based hearing aid available from Earlens Corporation) provide significant advantages over air conduction hearing aids, including, for example an expanded bandwidth and a substantial increase in available gain before feedback. However, certain challenges arise when using light as a transmission mechanism in an environment like the human ear canal. One challenge is the presence of substances, including cerumen, in the ear canal which may partially or fully block light as it is transmitted through the ear canal. For example, in a system that uses a laser positioned in an ear tip as a transmission device and a photodetector positioned on a contact hearing device as a detection device, the presence of such substances may impede transmission of light at the laser or reception of the light by the photodetector. A further challenge may be the shape of the ear canal itself, which may impede the transmission of light from a laterally placed laser to a medially placed photodetector since light will generally not pass through tissue located between the laser and the photodetector. This challenge may be even worse in some users where the ear canal is highly mobile, the shape changing when the user yawns, chews, coughs or laughs. A further challenge in a light based system is the need to focus the light from the laser onto the photodetector, which may be located on a contact hearing device. This need to focus light onto the photodetector necessitates alignment between the output of the laser and the photodetector, which alignment may be effected by the movement of the ear canal described above. One consequence of these challenges is the need to place the output of the laser as close as possible to the photodetector, to ensure that an adequate portion of the light transmitted from the laser is received at the photodetector. An further challenge it the inherent inefficiency of converting an electrical signal, such as that generated by an audio processor into light, such as that generated by a laser and, on the receiving end, the inherent inefficiency of converting a light signal, such as that received by the photodetector, back into an electrical signal. This inefficiency means that the system will lose a significant amount of power during the light transmission which may result in, for example, reduced battery life.

It would, therefore, be advantageous to design a contact hearing aid in which transmission between a laterally located ear tip and a medially located contact hearing device is not degraded by the presence of tissue or other substances between the ear tip and the contact hearing device.

BRIEF DESCRIPTION OF THE DRAWINGS

The foregoing and other objects, features, and advantages of embodiments of the present inventive concepts will be apparent from the more particular description of preferred embodiments, as illustrated in the accompanying drawings in which like reference characters refer to the same or like elements. The drawings are not necessarily to scale, emphasis instead being placed upon illustrating the principles of the preferred embodiments.

FIG. 18 is a diagram of a rectifier circuit for use in a contact hearing system according to the present invention.

FIG. 18A is a diagram of a rectifier circuit for use in a contact hearing system according to the present invention.

FIG. 19 is a diagram of a rectifier and converter circuit for use in a contact hearing system according to the present invention.

FIG. 20 is a diagram of a rectifier and converter circuit for use in a contact hearing system according to the present invention.

FIG. 21 is a diagram of a portion of a contact hearing device according to the present invention.

FIG. 21A is a diagram of a portion of a contact hearing device according to the present invention.

FIG. 38 is a side view of a transmit coil for use in an ear tip according to the present invention.

FIG. 39 is a top view of a transmit coil for use in an ear tip according to the present invention.

FIG. 40 is a side perspective view of a transmit coil for use in an ear tip according to the present invention.

FIG. 41 is an end view of an ear tip according to the present invention.

DETAILED DESCRIPTION OF THE INVENTION

Figure 1:
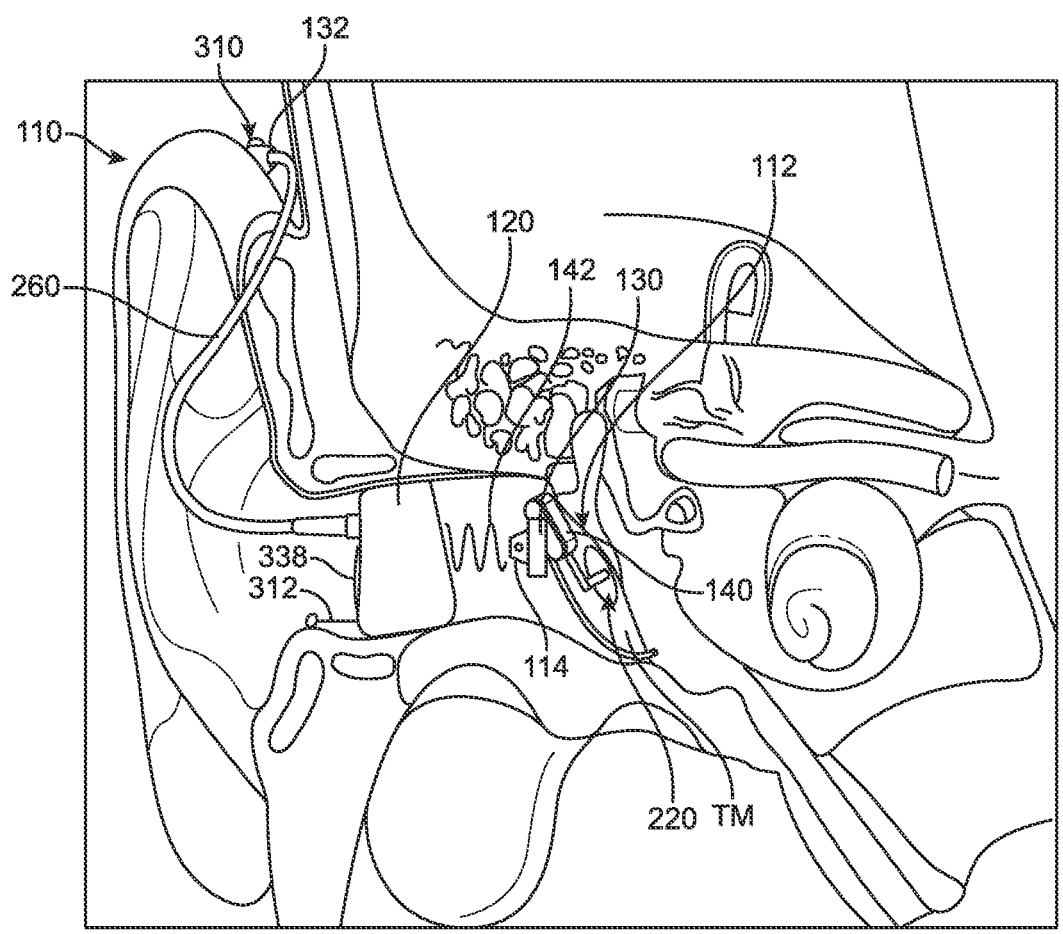
FIG. 1 is a cutaway view of an ear canal showing a contact hearing system according to the present invention wherein at least a portion of the contact hearing system is positioned in the ear canal.
Figure 45:
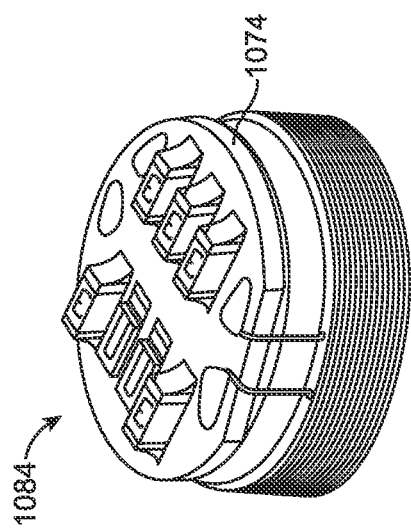
FIG. 45 is a perspective view of a receive coil according to the present invention.
Figure 44:
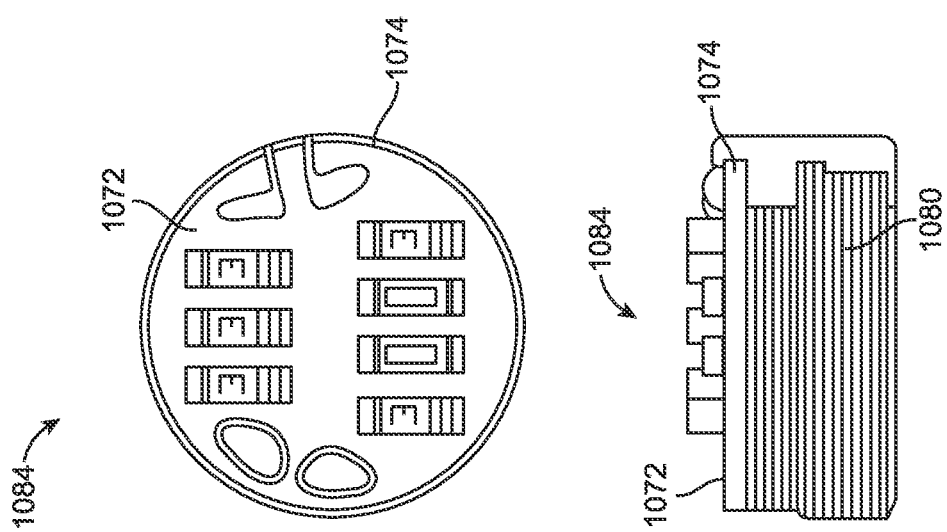
FIG. 44 is a top and side view of a receive coil according to the present invention.

FIG. 1 is a cutaway view of an ear canal showing a contact hearing system 110 for use in systems and methods according to the present invention, wherein at least a portion of the contact hearing system 110 is positioned in the ear canal. In embodiments of the invention, contact hearing system 110 may be referred to as a smartlens system or smartlens. In embodiments of the invention, contact hearing system 110 may comprise a contact hearing system using electromagnetic waves to transmit information and/or power from ear tip 120 to the contact hearing device 112. In embodiments of the invention, contact hearing system 110 may comprise a contact hearing system using inductive coupling to transmit information and/or power from ear tip 120 to contact hearing device 112. In FIG. 1, contact hearing system 110 includes Audio processor 132, which audio processor may include at least one external microphone 310. Audio processor 132 may be connected to an ear tip 120 by cable 260, which is adapted to transmit signals from audio processor 132 to ear tip 120. Ear tip 120 may further include canal microphone 312 and at least one acoustic vent 338. Ear tip 120 may be an ear tip which radiates electromagnetic waves 142 in response to signals from audio processor 132. Electromagnetic signals radiated by ear tip 120 may be received by contact hearing device 112, which may comprise receive coil 130, microactuator 140, and umbo platform 220. As used herein, receive coil 130 may comprise receive circuit assembly 1084 as illustrated in FIGS. 44-46.

Figure 2:
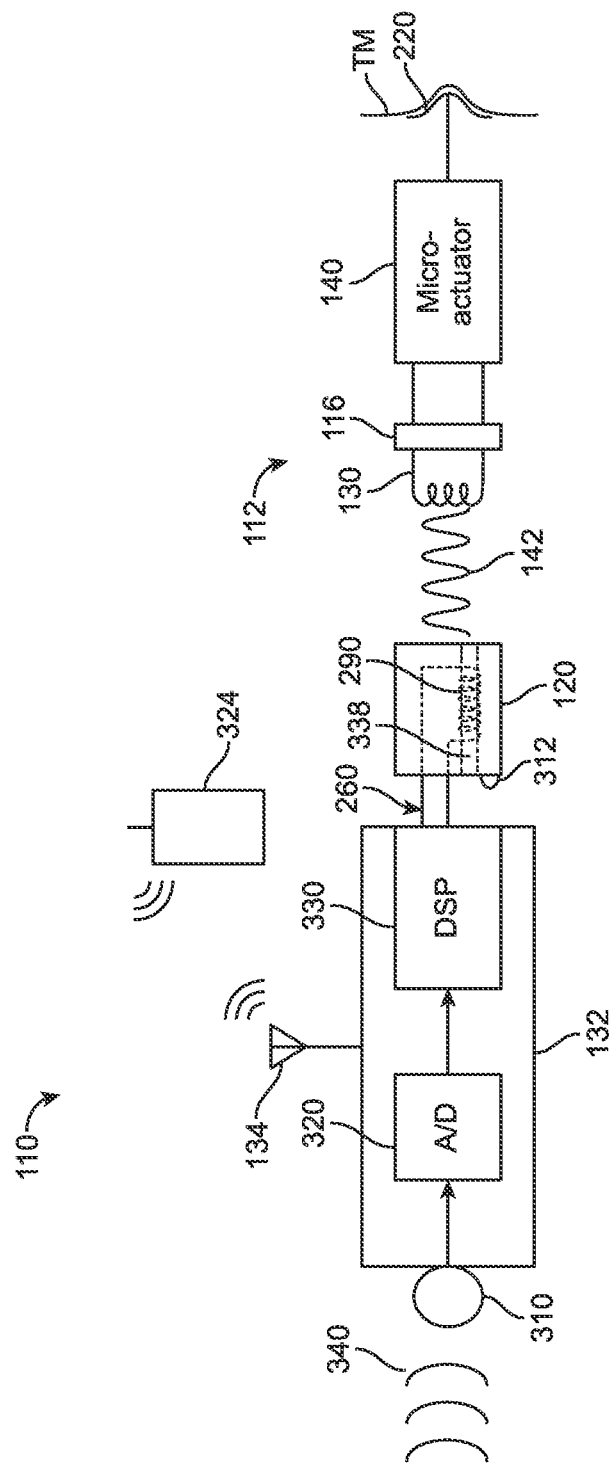
FIG. 2 is a block diagram of a contact hearing system according to the present invention.

FIG. 2 is a block diagram of a contact hearing system 110 for use in methods and apparatus according to the present invention. In embodiments of the invention, at least a portion of contact hearing system 110 is positioned in the ear canal of a user. In FIG. 2, ambient sound 340 may be received by external microphone 310 of audio processor 132, which then processes the received sound by passing it through processing circuitry, which may include analog to digital converter 320 and digital signal processor 330. The output of audio processor 132 may be transmitted to an ear tip 120 by cable 260. Signals transmitted to ear tip 120 may then be transmitted to contact hearing device 112 by, for example, causing transmit coil 290 to radiate electromagnetic waves 142. In embodiments of the invention, contact hearing device 112 may include receive coil 130, microactuator 140, and umbo lens 220. Information contained in electromagnetic waves 142 received by receive coil 130 may be transmitted through demodulator 116 to microactuator 140, moving umbo lens 220. In embodiments of the invention, the signal transmitted to ear tip 120 may be a signal representative of the received audio signal which may then be transmitted to contact hearing device 112. In embodiments of the invention, transmit coil 290 may be wound around an acoustic vent 338 in ear tip 120. In embodiments of the invention, acoustic vent 338 may be formed as a passage through a ferrite material or a ferromagnetic material. As used herein ferrite material may be any ferromagnetic material. In embodiments of the invention, transmit coil 290 may be wound around ferrite material positioned in ear tip 120. In embodiments of the invention, contact hearing system 110 may include one or more external communication and control devices 324, such as, for example, a cell phone. In embodiments of the invention, audio processor 132 may communicate with external communication and control devices 324 by, for example, using audio processor antenna 134.

Figure 3:
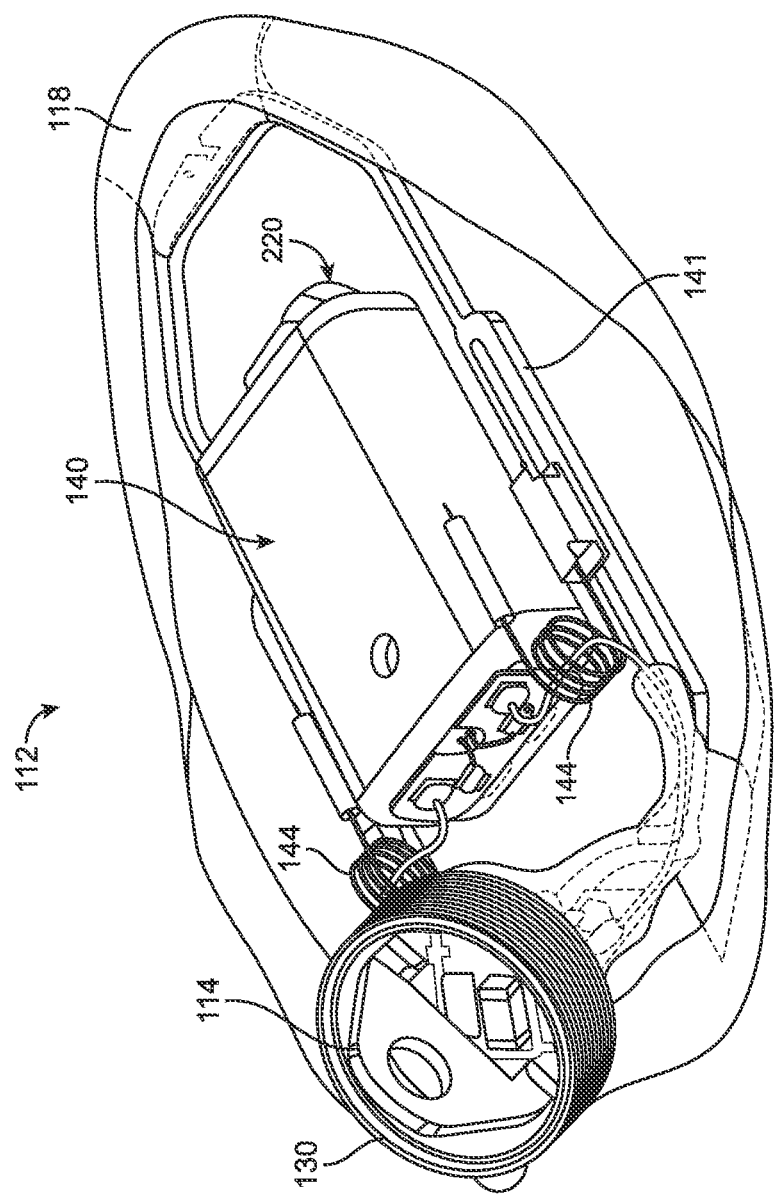
FIG. 3 is a top view of a contact hearing device according to the present invention.
Figure 4:
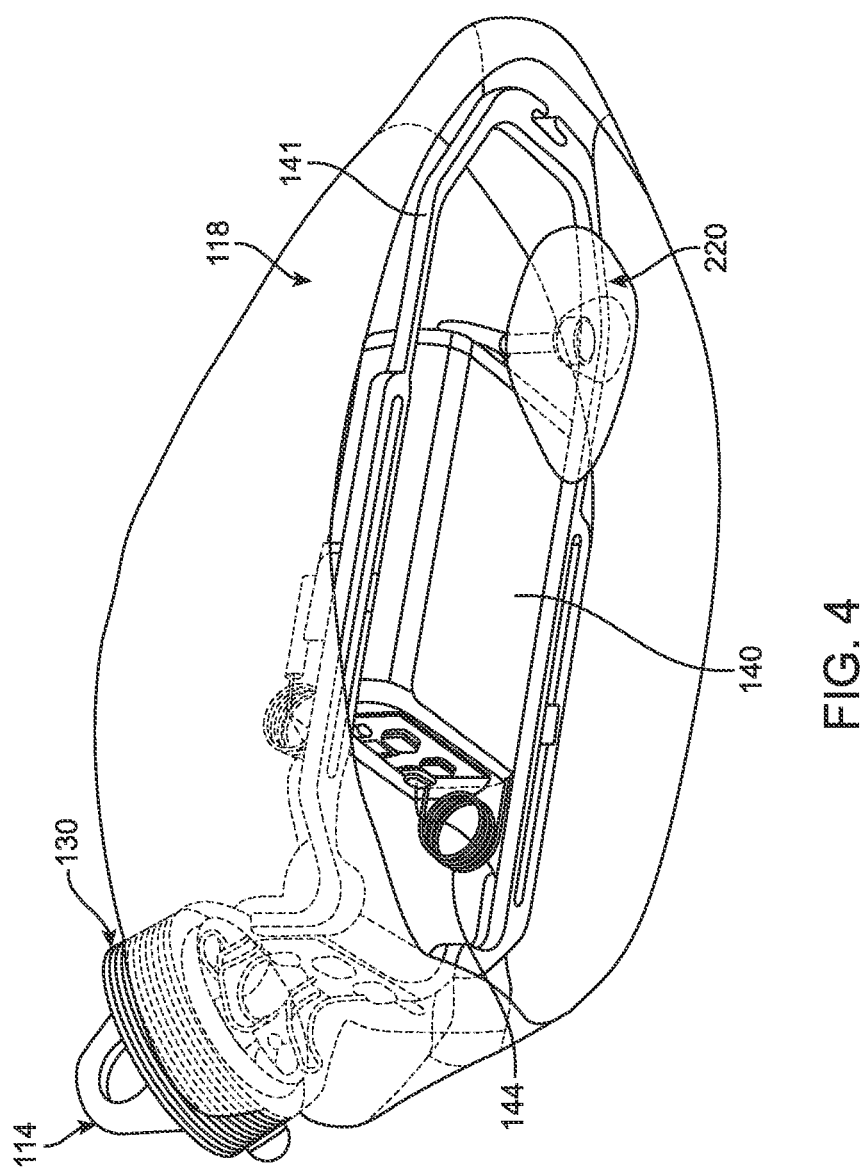
FIG. 4 is a bottom view of a contact hearing device according to the present invention.

FIG. 3 is a top view of a contact hearing device 112 according to the present invention. FIG. 4 is a bottom view of a contact hearing device 112 according to the present invention. The contact hearing device 112 illustrated in FIGS. 3 and 4 includes a receive coil 130, a microactuator 140, an umbo lens 220, a support structure 141, and springs 144. In the embodiment illustrated in FIGS. 3 and 4, microactuator 140 is connected to support structure 141 by springs 144. In embodiments of the invention, contact hearing device 112 may further include a sulcus platform 118, which may also be referred to as a mounting platform, connected to support structure 141 and adapted to assist in positioning contact hearing device 112 in the ear canal of a user. In embodiments of the invention, contact hearing device 112 may further include grasping tab 114.

Figure 5:
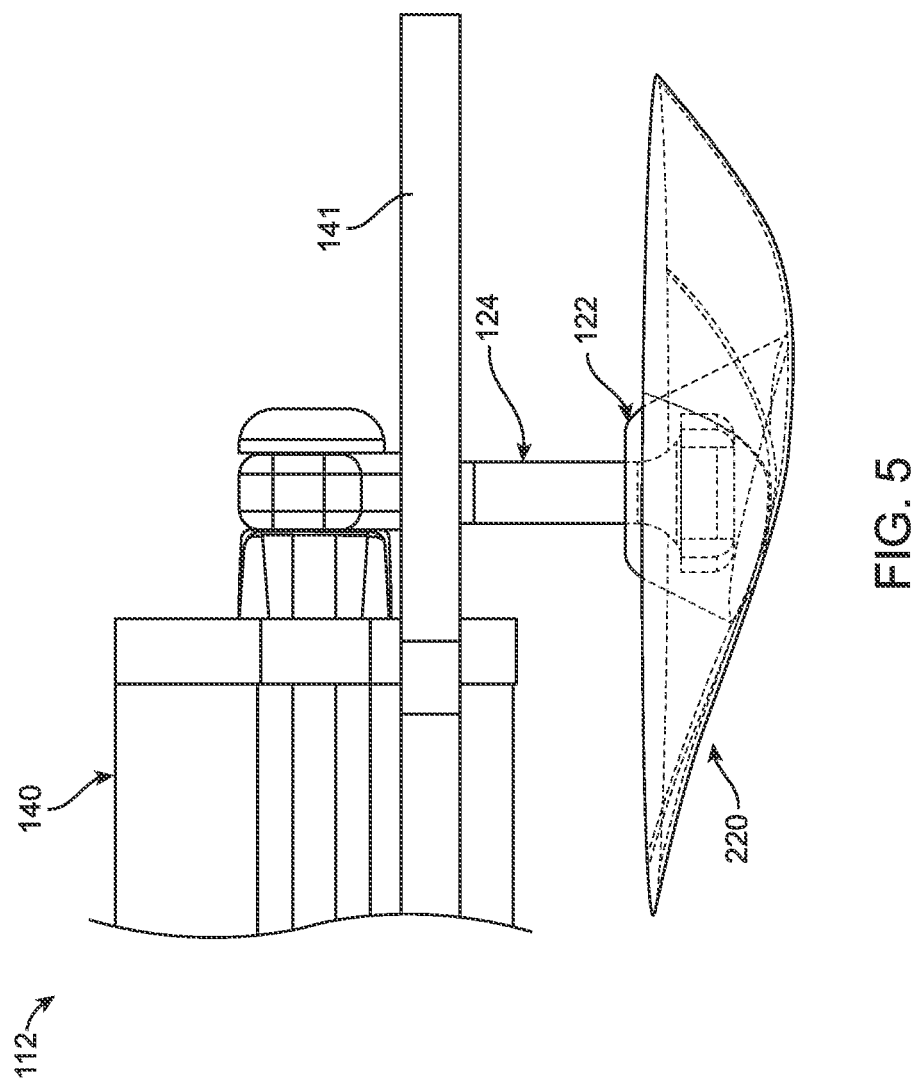
FIG. 5 is a side view of a portion of a contact hearing device, including a drive post and umbo lens, according to the present invention.

FIG. 5 is a side view of a portion of a contact hearing device 112 according to the present invention, including a drive post 124 and umbo lens 220. In FIG. 5, contact hearing device 112, including a drive post 124 and umbo lens 220. In FIG. 5, drive post 124 may be attached to umbo lens 220 by adhesive 122. Drive post 124 may be attached to the output of microactuator 140, which is supported on contact hearing device 112 by support structure 141.

Figure 6:
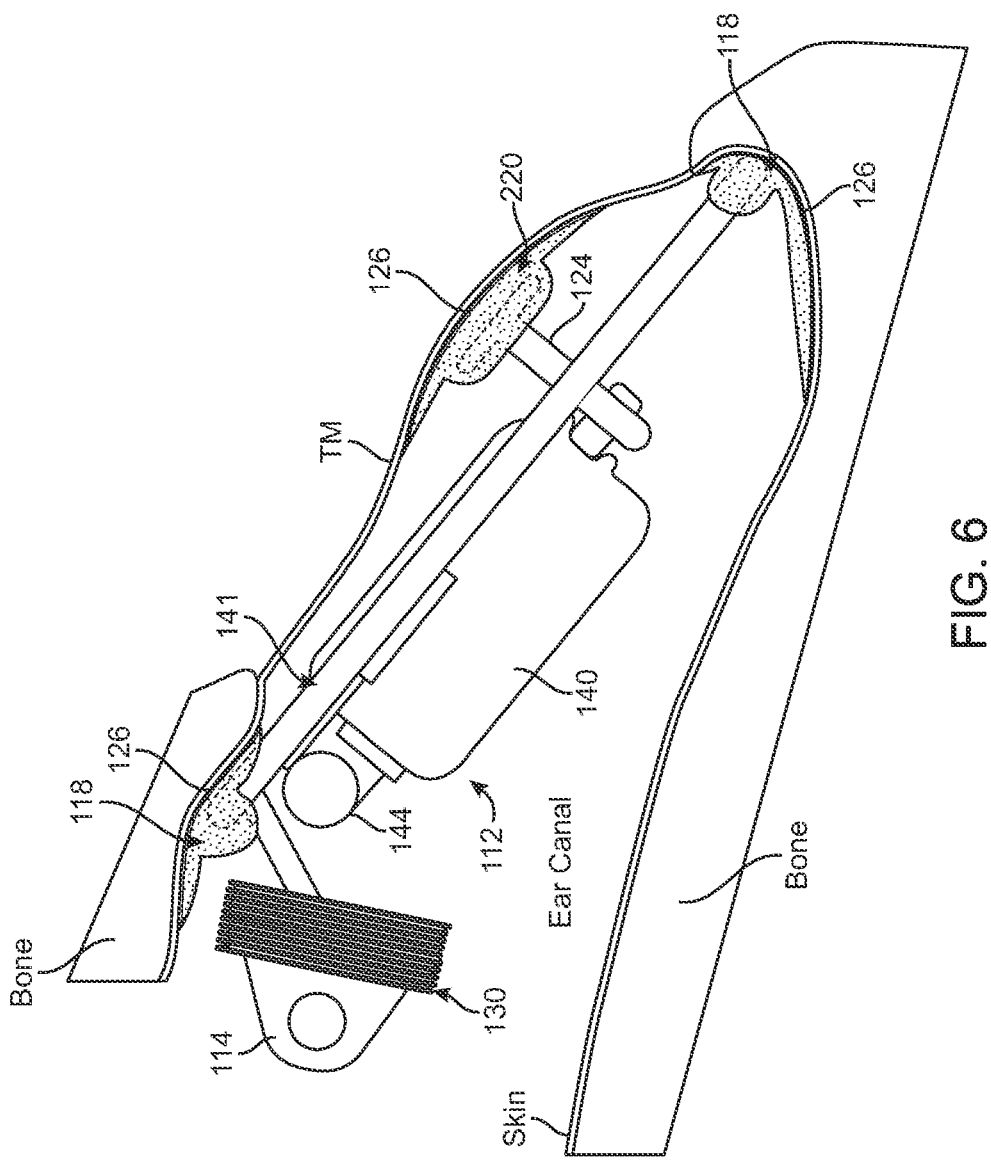
FIG. 6 is a cutaway view of an ear canal illustrating the positioning of a contact hearing device according to the present invention.

FIG. 6 is a cutaway view of an ear canal illustrating the positioning of a contact hearing device 112 according to the present invention. In the embodiment of FIG. 6, contact hearing device 112 is positioned at a medial end of the ear canal, proximate the tympanic membrane of the user. Contact hearing device 112 includes a receive coil 130 positioned at a medial end thereof. In embodiments of the invention, receive coil 130 may be positioned to receive signals from an ear tip (not shown) positioned in the ear canal lateral to the position of contact hearing device 112. In embodiments of the invention, signals received by receive coil 130 may be transmitted to microactuator 140 to move drive post 124 which is connected to the user's tympanic membrane through umbo lens 220. Umbo lens 220 may be in direct physical contact with the tympanic membrane or a thin layer of oil 126 may be used between umbo lens 220 and the user's tympanic membrane. Sulcus platform 118 may be used to properly position contact hearing device 112 in the user's ear canal through contact with a skin layer which lines the ear canal. Sulcus platform 118 may be in direct contact with the skin of the ear canal or a thin layer of oil 126 may be used between sulcus platform 118 and the skin of the ear canal. In embodiments of the invention contact hearing device 112 may further include support structure 141, grasping tab 114, and springs 144.

Figure 7:
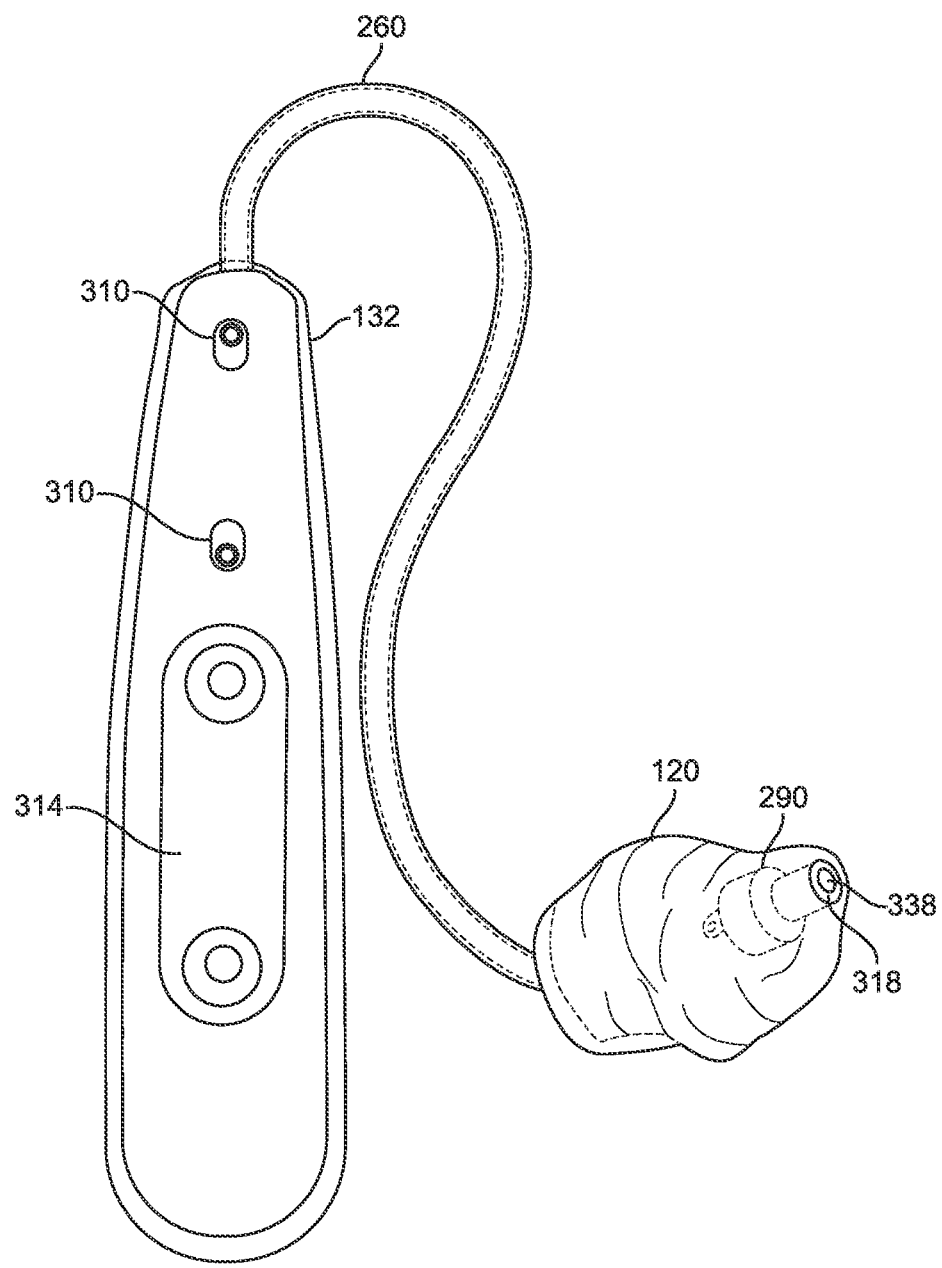
FIG. 7 illustrates a processor and ear tip according to the present invention.

FIG. 7 illustrates an audio processor 132 and ear tip 120 according to the present invention. Ear tip 120 may, in some embodiments of the invention, be referred to as a mag tip or magnetic tip. In the embodiment of FIG. 7, audio processor 132 may include external microphones 310 and volume/control switch 314. In embodiments of the invention, ear tip 120 may include a transmit coil 290 which may include ferrite core 318. In embodiments of the invention, ear tip 120 may include an acoustic vent which may pass through transmit coil 290 and/or through ferrite core 318

Figure 8:
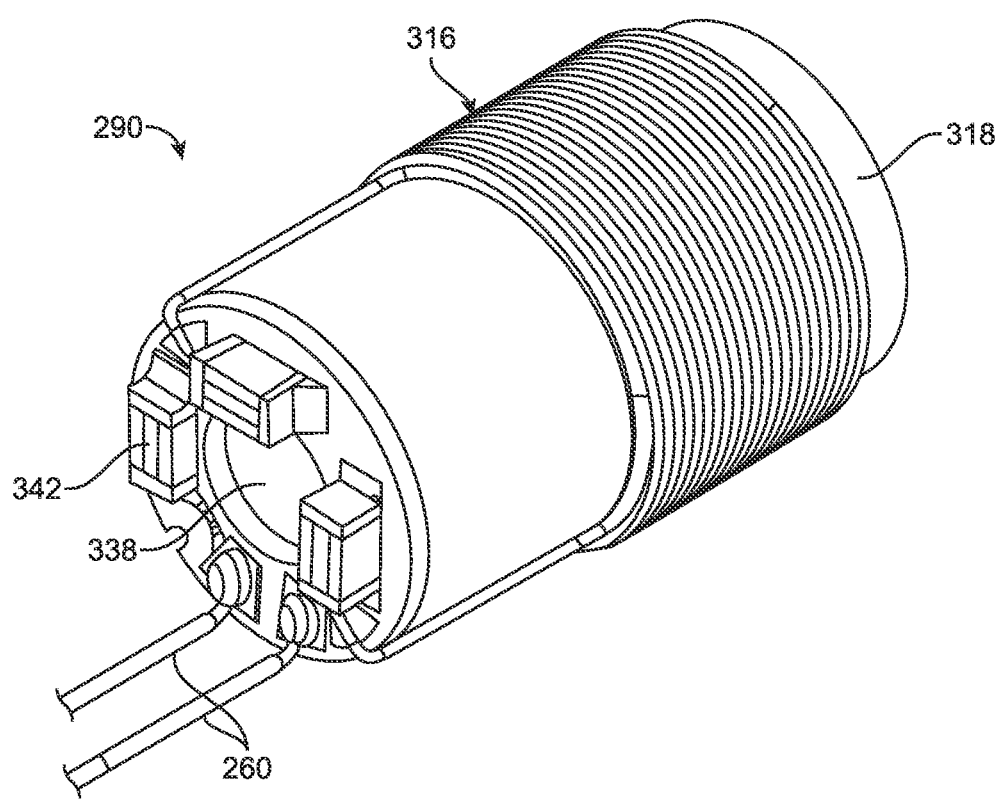
FIG. 8 is a side perspective view of a transmit coil for use in an ear tip according to the present invention.

FIG. 8 is a side perspective view of a transmit coil 290 for use in an ear tip 120 according to the present invention. In the embodiment of FIG. 8, transmit coil 290 includes coil winding 316 which is wound around ferrite core 318. In embodiments of the invention, transmit coil 290 may further include acoustic vent 338. In embodiments of the invention, transmit coil 290 may further include transmit electronics 342. In embodiments of the invention, transmit coil 290 may be connected to audio processor 132 by cable 260.

Figure 9:
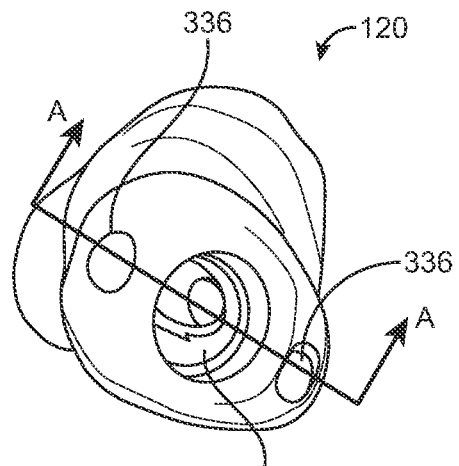
FIG. 9 is an end view of an ear tip according to the present invention.
Figure 10:
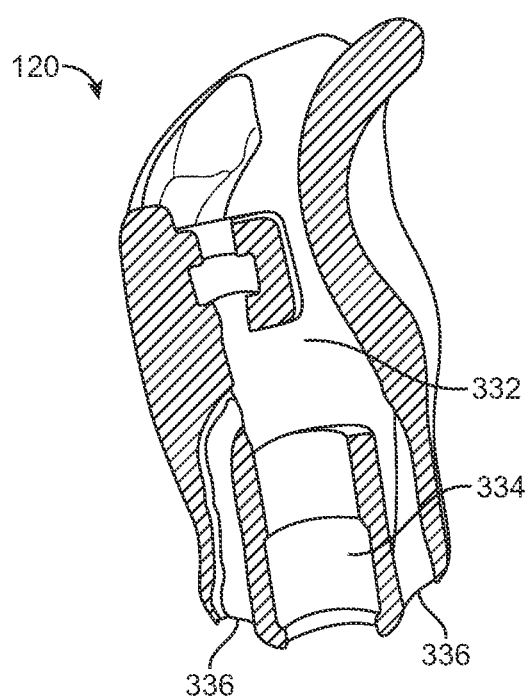
FIG. 10 is a cut away side view of an ear tip according to the present invention.
Figure 10A:
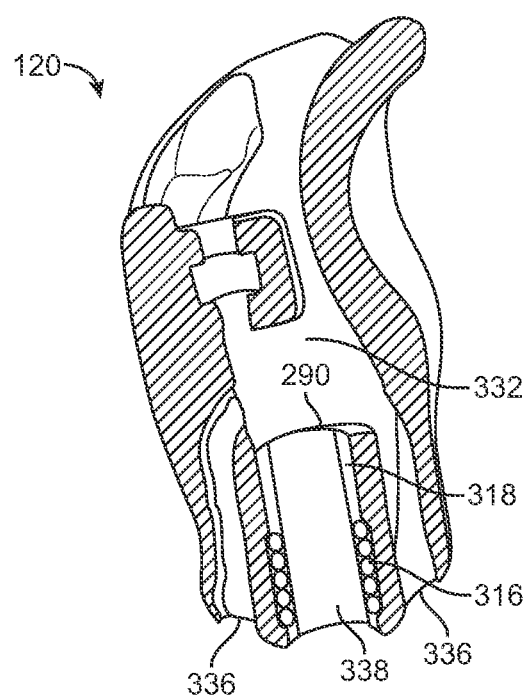
FIG. 10A is a cut away side view of an ear tip according to the present invention.
Figure 11:
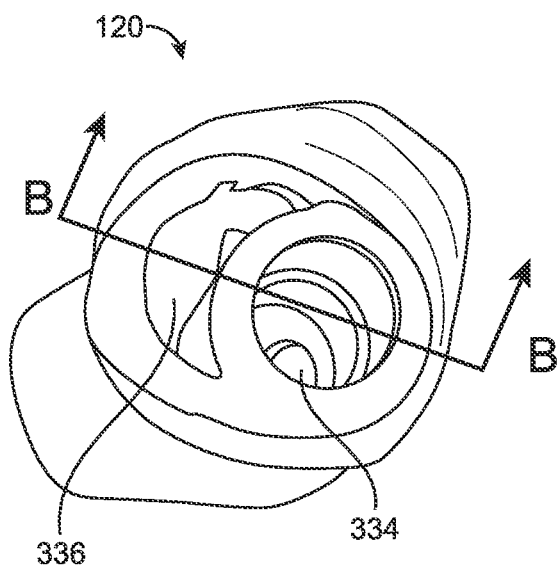
FIG. 11 is an end view of an ear tip according to the present invention.
Figure 12:
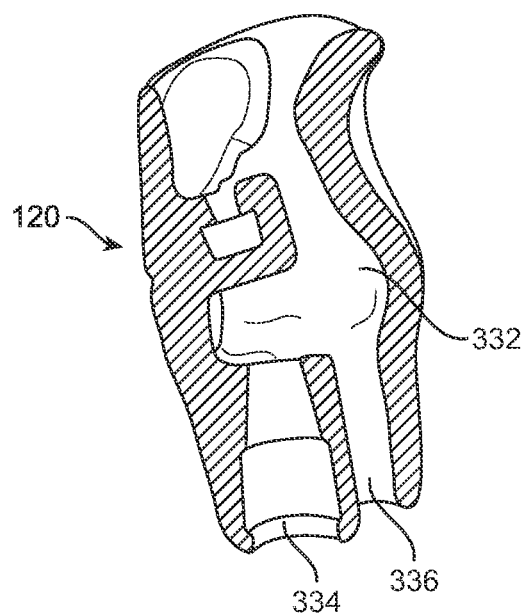
FIG. 12 is a cut away side view of an ear tip according to the present invention.
Figure 12A:
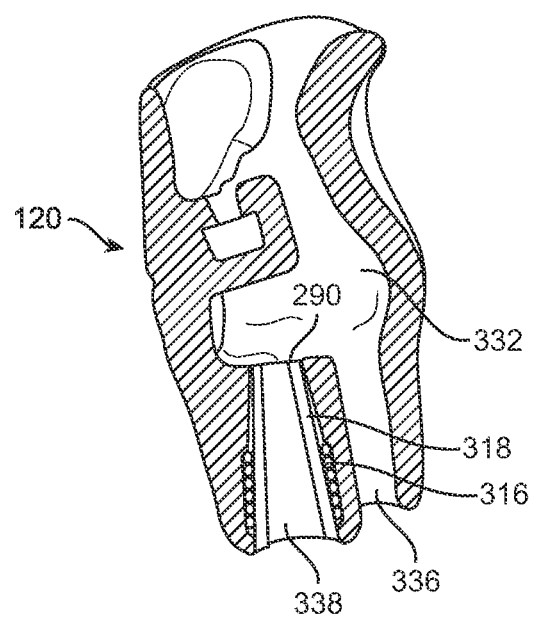
FIG. 12A is a cut away side view of an ear tip according to the present invention.

FIG. 9 is an end view of an ear tip 120 according to the present invention. FIGS. 10 and 10A are cut away side views of an ear tip according to the present invention. FIG. 11 is an end view of an ear tip 120 according to the present invention. FIGS. 12 and 12A are cut away side views of an ear tip 120 according to the present invention. In the embodiments of FIGS. 9, 10, 10A, 11, 12 and 12A ear tip 120 includes mounting recess 334, which is adapted to receive transmit coil 290 (shown in FIGS. 10A and 12A). In the embodiments of FIGS. 9-12, ear tip 120 further includes at least one secondary acoustic vent 336. In embodiments of the invention, secondary acoustic vents are adapted to work in conjunction with acoustic vent 338 in transmit coil 290 to reduce the overall acoustic mass of the ear tip. In embodiments of the invention, secondary acoustic vents 336 combine at central chamber 332 which has a larger cross section than the combined cross section of secondary acoustic vents 336. In embodiments of the invention, secondary acoustic vents 336 and acoustic vent 338 combine at central chamber 332 which has a larger cross section than the combined cross section of secondary acoustic vents 336 and acoustic vent 338.

In embodiments of the invention, the total combined acoustic mass (including the acoustic mass of acoustic vent 338 through ferrite core 318 of transmit coil 290, the acoustic mass of any secondary acoustic vents 336 and the acoustic mass of central chamber 332) will not exceed 2000 Kg/m$^4$. In embodiments of the invention, the acoustic mass may be defined as the impeding effect of inertia upon the transmission of sound in a conduit, equal in a tubular conduit (as an organ pipe) to the mass of the vibrating medium divided by the square of the cross section. It may also be the acoustic analogue of alternating-current-circuit inductance (called also inertance). In an ear tip which incorporates one or more acoustic vents, the acoustic mass may be representative of the resistance to the flow of air through the ear tip. The acoustic impedance (Z) is frequency specific and relates to the acoustic mass (or inertance, L) as a function of frequency $Z=jwL$. Acoustic mass may be a function of the cross section of any acoustic vents in an ear tip. Acoustic mass may be a function of the effective length of the acoustic vents in an ear tip. A higher acoustic mass may be perceived by the hearing aid user in a fashion similar to what would be perceived when talking with one's fingers in the ear canals. Thus, a higher acoustic mass effect may be perceived to result in altering the hearing aid user's voice in ways which the hearing aid user finds to be bothersome or unacceptable.

For an even straight tube, the acoustic mass is given by the simple equation:

$$\frac{\rho l}{A}$$

Where ρ is the density of air (in kg/m3), l is the length of the tube, and A is the cross sectional area along the open bore.

For complex openings, the acoustic mass can be described as the integral of the density of air (ρ) divided by the open cross sectional area along the length of the light tip:

$$\int_{x=0}^{tiplength} \frac{\rho}{Area_x} dx$$

Which can be estimated by dividing the tip along its length into n cross sections and summing each open area as follows:

$$\sum_{i=0}^{n} \frac{\rho}{Area_i} \times \Delta l$$

Where:

$$\Delta l = \frac{tip\ length}{n}$$

In one embodiment the present invention is directed to an ear tip having a proximal end and a distal end, the eartip including: a transmit coil, the transmit coil including a core of a ferromagnetic material, the ferromagnetic core having a central channel there through, a distal end of the ferromagnetic core positioned at a first opening in a distal end of the ear tip; a passage extending from an opening at a proximal end of the ear tip to the distal end of the ear tip, the passage ending at a second opening in the distal end of the ear tip, wherein a proximal end of the central channel is connected to the passage. In embodiments of the present invention, the combination of the central channel and the passage act as an acoustic vent, allowing air and sound to pass through the ear tip. In embodiments of the present invention, the acoustic vent has a predetermined acoustic mass. In embodiments of the present invention, the predetermined acoustic mass of the ear tip is less than 2000 kilograms per meter$^4$ (meter to the fourth power). In embodiments of the present invention, the transmit coil includes a coil winding wound around the ferromagnetic material.

In one embodiment, the present invention is directed to a method of acoustically connecting a proximal end of an ear tip to a distal end of an ear tip wherein the ear tip includes a transmit coil wrapped around a core, the core having an central channel extending from a proximal end of the core to a distal end of the core, and the ear tip having a passage extending from a proximal end of the ear tip to a distal end of the ear tip, the method including the steps of: passing an electrical current through the transmit coil; passing acoustic signals through the central channel; and passing acoustic signals through the passage. In embodiments of the present invention, the acoustic signals comprise sound. In embodiments of the present invention, sound and air pass through the passage. In embodiments of the present invention, a proximal end of the central channel connects to the passage at a point within the ear tip. In embodiments of the present invention, a distal end of the central channel is connected to a first opening in the distal end of the ear tip and the distal end of the passage is connected to a second opening in the distal end of the ear tip.

Figure 13A:
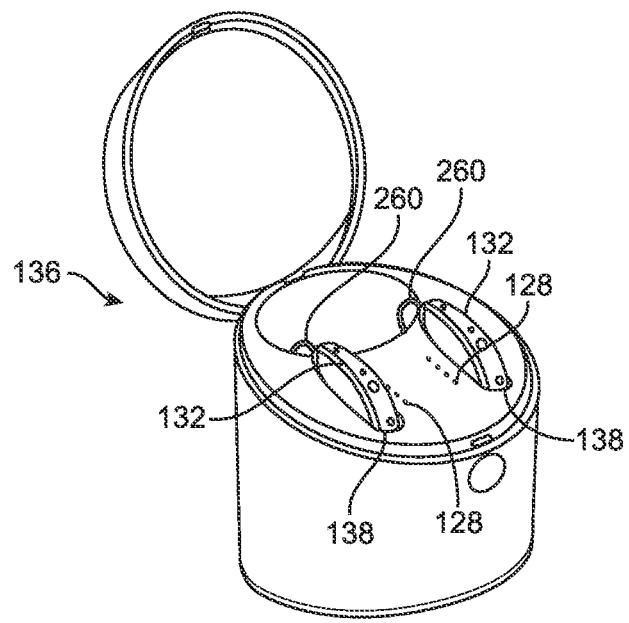
FIG. 13A is a top perspective view of a charging station for use in charging processors.
Figure 13B:
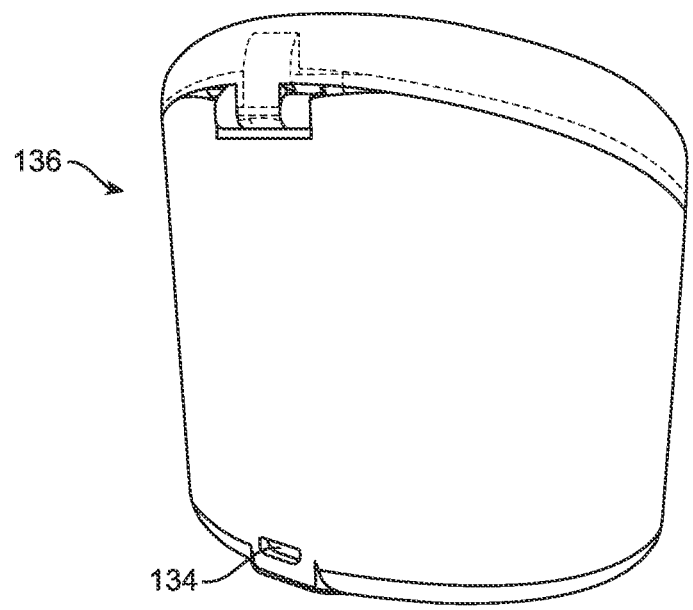
FIG. 13B is a back perspective view of a charging station for use in charging processors.

FIG. 13A is a top perspective view of a charging station 136 for use in charging audio processors 132. FIG. 13B is a back perspective view of a charging station 136, including AC adapter port 134 for use in charging audio processors 132. In FIGS. 13A and 13B, audio processors 132 may be positioned in charging slots 138. Charging status LEDs 128 may be used to communicate the charge status of audio processors 132 positioned in charging slots 138.

Figure 14:
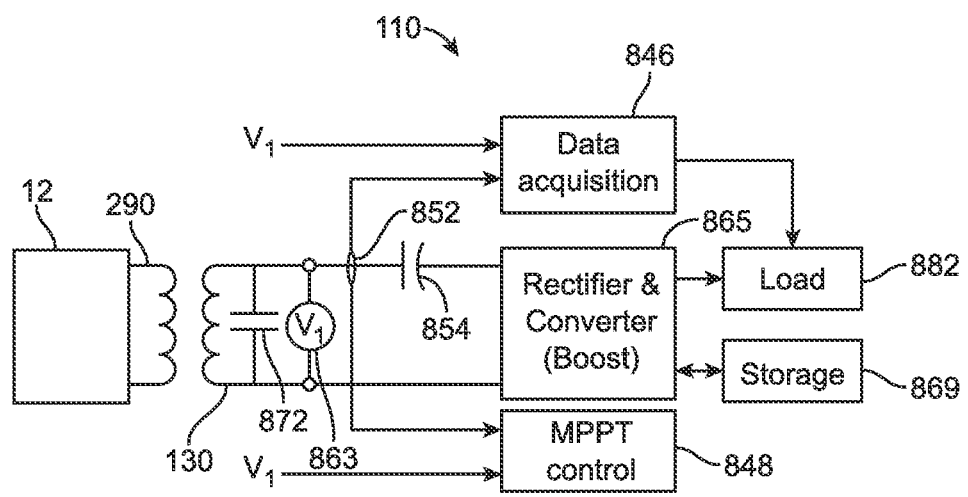
FIG. 14 is a block diagram of an inductively coupled contact hearing system, including a contact hearing device, according to the present invention.

FIG. 14 is a block diagram of an inductively coupled contact hearing device 112 and ear tip 120 according to the present invention. In embodiments of the invention, contact hearing device 112 may also be referred to as a medial ear canal assembly. In FIG. 14, the output of ear tip 120 may be inductively coupled through transmit coil 290 to receive coil 130 on contact hearing device 112. In embodiments of the invention, ear tip 120 may be referred to as a lateral ear canal assembly. In embodiments of the invention, inductive coupling may induce a current in receive coil 130 on contact hearing device 112. In embodiments of the invention, the inductively induced current may be measured by current sensor 852. In embodiments of the invention, inductive coupling may induce an output voltage $V_1$ across receive coil 130. In embodiments of the invention, the induced output voltage may be measured by a voltage meter 863. In embodiments of the invention, the measured current and voltage may be used by MPPT control 848 and data acquisition circuit 846. In embodiments of the invention, the output of receive coil 130 may be further connected to a rectifier and converter circuit 865 through capacitor 854. In embodiments of the invention, receive coil 130 may be connected directly to rectifier and converter circuit 865 (eliminating capacitor 854). In embodiments of the invention, receive coil 130 may be connected to a rectifier circuit. In FIG. 14, capacitor 854 may be positioned between the output of receive coil 130, which may include capacitor 872, and the input of rectifier and converter circuit 865. The output of rectifier and converter circuit 865 may be connected to load 882 and to storage device 869. In embodiments of the invention, rectifier and converter circuitry 865 may include circuitry which provides power to storage device 869 and transmits power from storage device 869 to load 882 when required. In embodiments of the invention, storage device 869 may be connected directly to receive coil 130 or to other circuitry adapted to harvest energy from receive coil 130 and deliver energy to load 882. Load 882 may be, for example, a microactuator positioned on the contact hearing device 112 such that load 882 vibrates the tympanic membrane of a user when stimulated by signals received by receive coil 130. Storage device 869 may be, for example, a rechargeable battery.

In embodiments of the invention, transmit coil 290 may comprise a transmit coil, such as, for example, transmit coil 290 and coil 130 may comprise a receive coil, such as, for example, receive coil 130. In embodiments of the invention, transmit coil 290 and receive coil 130 may be elongated coils manufactured from a conductive material. In embodiments of the invention, transmit coil 290 and receive coil 130 may be stacked coils. In embodiments of the invention, transmit coil 290 and receive coil 130 may be wound inductors. In embodiments of the invention, transmit coil 290 and receive coil 130 may be wound around a central core. In embodiments of the invention, transmit coil 290 and receive coil 130 may be wound around a core comprising air. In embodiments of the invention, transmit coil 290 and receive coil 130 may be wound around a magnetic core. In embodiments of the invention, transmit coil 290 and receive coil 130 may have a substantially fixed diameter along the length of the wound coil.

In embodiments of the invention, rectifier and converter circuit 865 may comprise power control circuitry. In embodiments of the invention, rectifier and converter circuit 865 may comprise a rectifier. In embodiments of the invention, rectifier and converter 865 may be a rectifying circuit, including, for example, a diode circuit, a half wave rectifier or a full wave rectifier. In embodiments of the invention, rectifier and converter circuit 865 may comprise a diode circuit and capacitor. In embodiments of the invention, energy storage device 869 may be a capacitor, a rechargeable battery or any other electronic element or device which is adapted to store electrical energy.

In FIG. 14, the output of MPPT control circuit 848 may control rectifier and converter circuit 865. Rectifier and converter circuit 865 may supply energy to and receive energy from storage device 869, which may be, for example, a rechargeable battery. Data acquisition circuit 846 and rectifier and converter circuit 865 may be used to drive load 882, with data acquisition circuit 846 proving load 882 with control data (e.g. sound wave information) and rectifier and converter circuit 865 providing load 882 with power. In embodiments of the invention, rectifier and converter circuit 865 may be used to drive load 882 directly, without information from a data circuit such as data acquisition circuit 846. In embodiments of the invention, rectifier and converter circuit 865 may be used to drive load 882 directly without energy from storage device 869. The power provided by rectifier and converter circuit 865 may be used to drive load 882 in accordance with the control data from data acquisition circuit 846. Load 882 may, in some embodiments of the invention, be a transducer assembly, such as, for example, a balanced armature transducer.

In embodiments of the invention, information and/or power may be transmitted from ear tip 120 to contact hearing device 112 by magnetically coupling transmit coil 290 to receive coil 130. When the coils are inductively coupled, the magnetic flux generated by transmit coil 290 may be used to generate an electrical current in receive coil 130. When the coils are inductively coupled, the magnetic flux generated by transmit coil 290 may be used to generate an electrical voltage across receive coil 130. In embodiments of the invention, the signal used to excite transmit coil 290 on ear tip 120 may be a push/pull signal. In embodiments of the invention, the signal used to excite transmit coil 290 may have a zero crossing. In embodiments of the invention, the magnetic flux generated by transmit coil 290 travels through a pathway that includes a direct air pathway that is not obstructed by bodily components. In embodiments of the invention, the direct air pathway is through air in the ear canal of a user. In embodiments of the invention, the direct air pathway is line of sight between ear tip 120 and contact hearing device 112 such that contact hearing device 112 is optically visible from ear tip 120.

In embodiments of the invention, the output signal generated at receive coil 130 may be rectified by, for example, rectifier and converter circuit 865. In embodiments of the invention, a rectified signal may be used to drive a load, such as load 882 positioned on contact hearing device 112. In embodiments of the invention, the output signal generated at receive coil 130 may contain an information/data portion which includes information transmitted to contact hearing device 112 by transmit coil 290. In embodiments of the invention, at least a portion of the output signal generated at receive coil 130 may contain energy or power which may be scavenged by circuits on contact hearing device 112 to charge, for example, storage device 869.

Figure 14A:
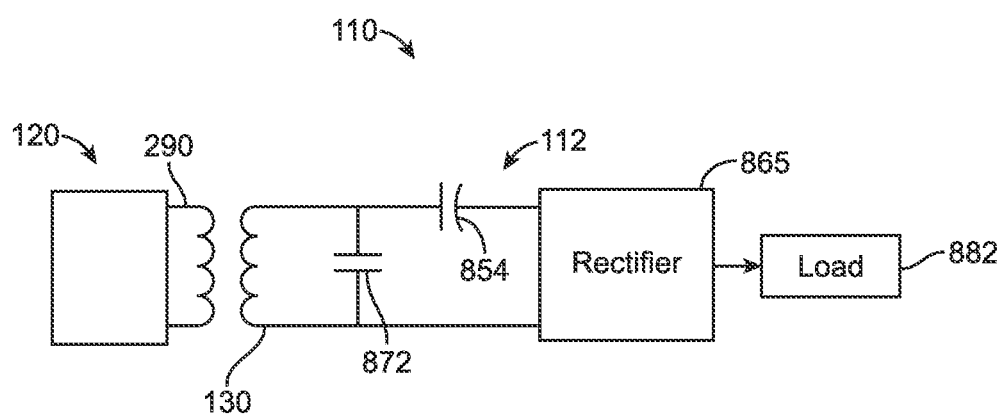
FIG. 14A is a block diagram of an inductively coupled contact hearing system according to the present invention.

FIG. 14A is a block diagram of an inductively coupled contact hearing system according to the present invention. In FIG. 14A, contact hearing system 110 includes Ear Tip 120 (which may also be referred to as a Mag Tip) and contact hearing device 112. Ear Tip 120 may include a transmit coil 290. Contact hearing device 112 may include receive coil 130, parasitic capacitance 872, capacitor 854, rectifier and converter circuit 865 and load 882.

Figure 15:
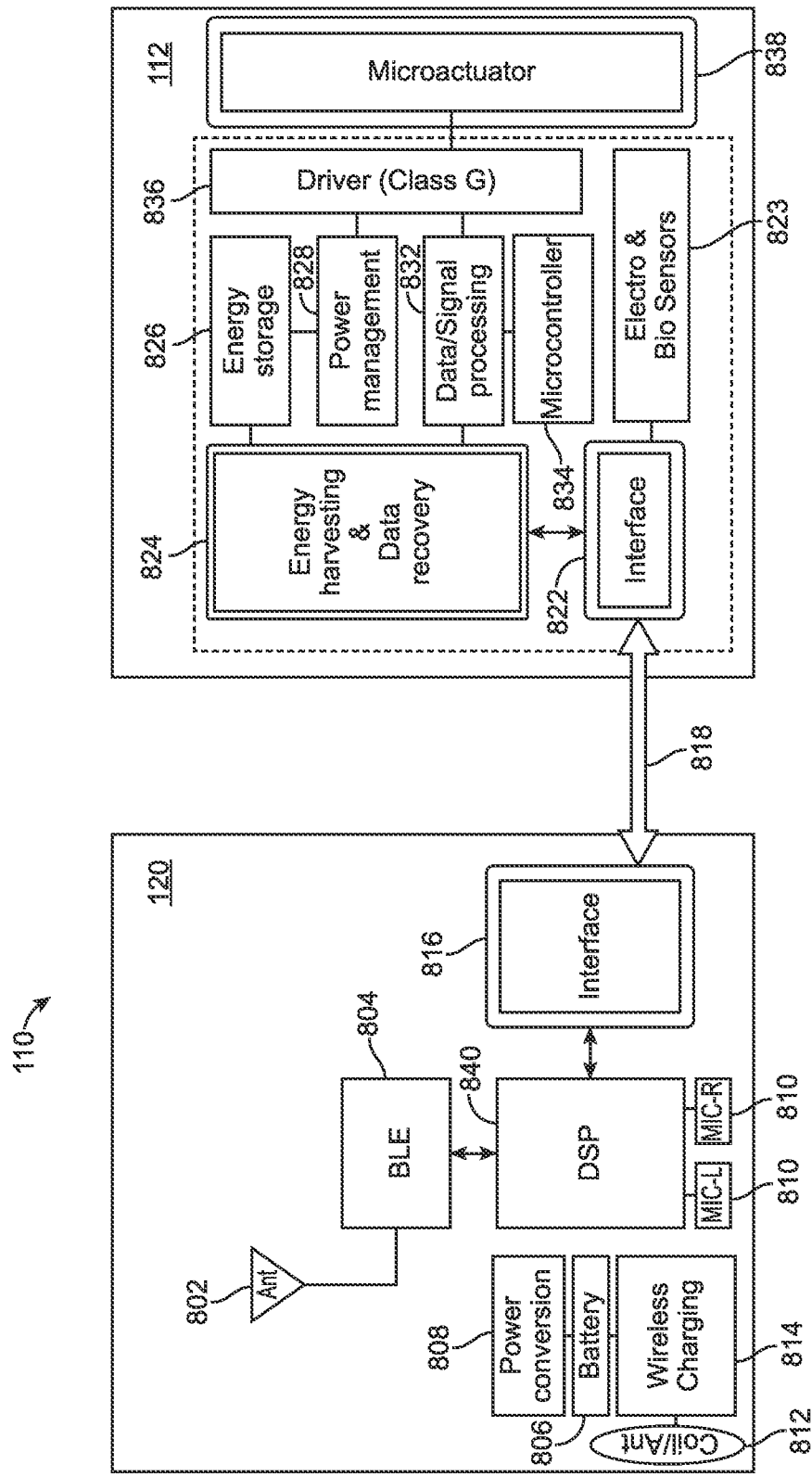
FIG. 15 is a block diagram of a contact hearing system, including an ear tip and contact hearing device according to the present invention.

FIG. 15 is a block diagram of a contact hearing system 110, including a ear tip 120 (which may also be referred to as a processor) and contact hearing device 112 according to the present invention. In FIG. 15, ear tip 120 may include an external antenna 802 adapted to send and receive signals from an external source such as a cell phone (see FIG. 2). External antenna 802 may be connected to a circuit for processing signals received from external antenna 802, such as blue tooth circuit 804, which, in some embodiments, may be a blue tooth low energy circuit. The output of Bluetooth circuit 804 may be connected to digital signal processor 840, which may also include inputs from microphones 810. Ear canal assembly 12 may further include battery 806 and power conversion circuit 808 along with charging antenna 812 (which may be a coil) and wireless charging circuit 814. Digital signal processor 840 may be connected to interface circuit 816, which may be used to transmit data and power from ear tip 120 to contact hearing device 112. In embodiments of the invention, power and data may be transmitted between ear tip 120 and contact hearing device 112 over power/data link 818 by inductive coupling to provide transmission of the data and power. Alternatively, separate modes of transmission may be used for the power and data signals, such as, for example, transmitting the power using radio frequency or light and the data using inductive coupling.

In FIG. 15, power and data transmitted to contact hearing device 112 may be received by interface circuit 822. Interface circuit 822 may be connected to energy harvesting and data recovery circuit 824 and to electrical and biological sensors 823. In FIG. 2, contact hearing device 112 may further include energy storage circuitry 826, power management circuitry 828, data and signal processing circuitry 832, and microcontroller 834. Contact hearing device 112 may further include a driver circuit 836 and a microactuator 838. In the illustrated embodiment, data transmitted from contact hearing device 112 may be received by interface circuit 816 on ear tip 120.

Figure 16:
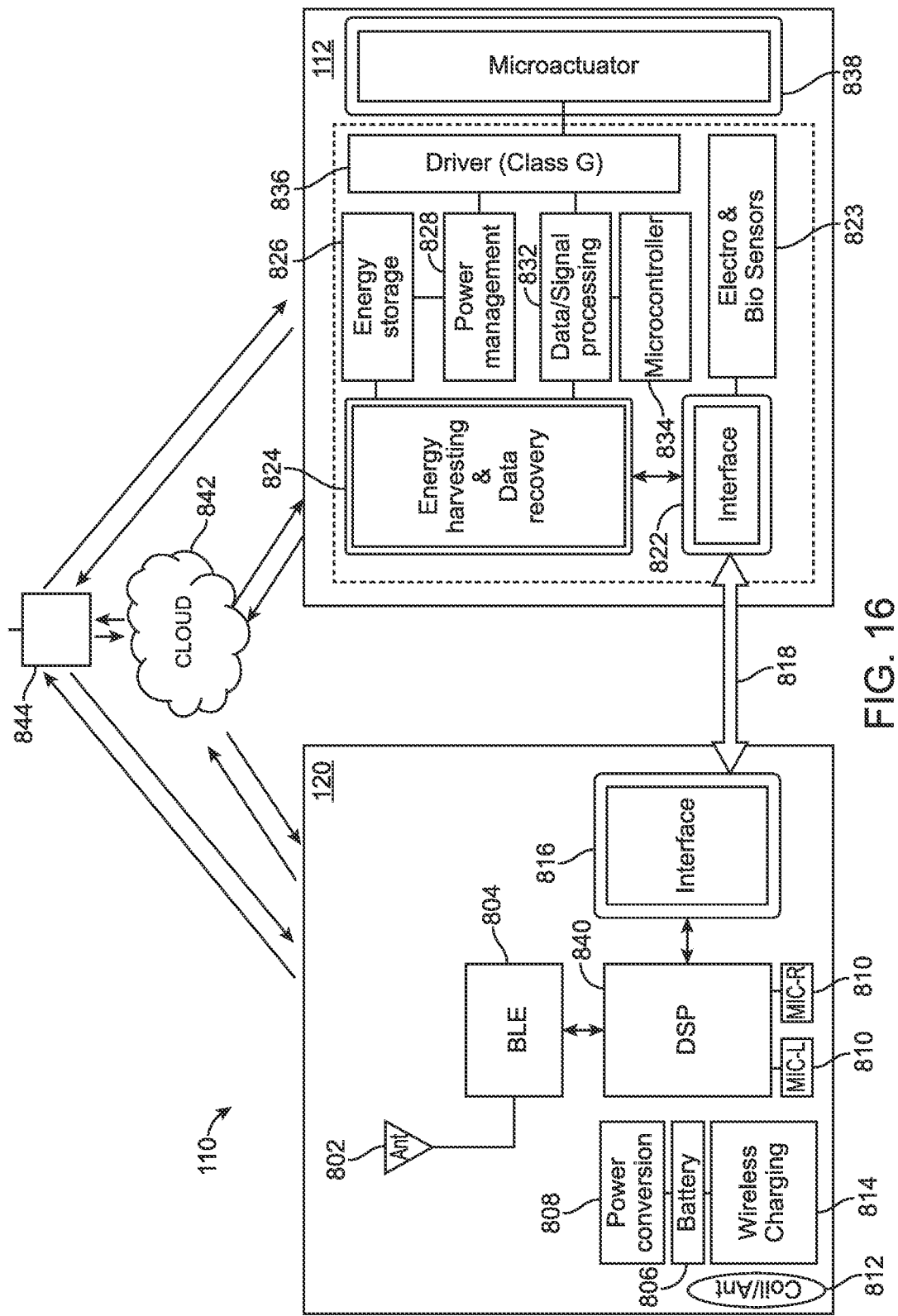
FIG. 16 is a block diagram of a contact hearing system which is adapted for communication with external devices according to the present invention.

FIG. 16 is a block diagram of a contact hearing system 110, adapted for communication with external devices according to the present invention. In FIG. 3, contact hearing system 110 is adapted to communicate with external devices such as cell phone 844 or cloud computing services 842. Such communication may occur through, for example, external antenna 802 on ear tip 120 or, in some embodiments directly from contact hearing device 112.

Figure 17:
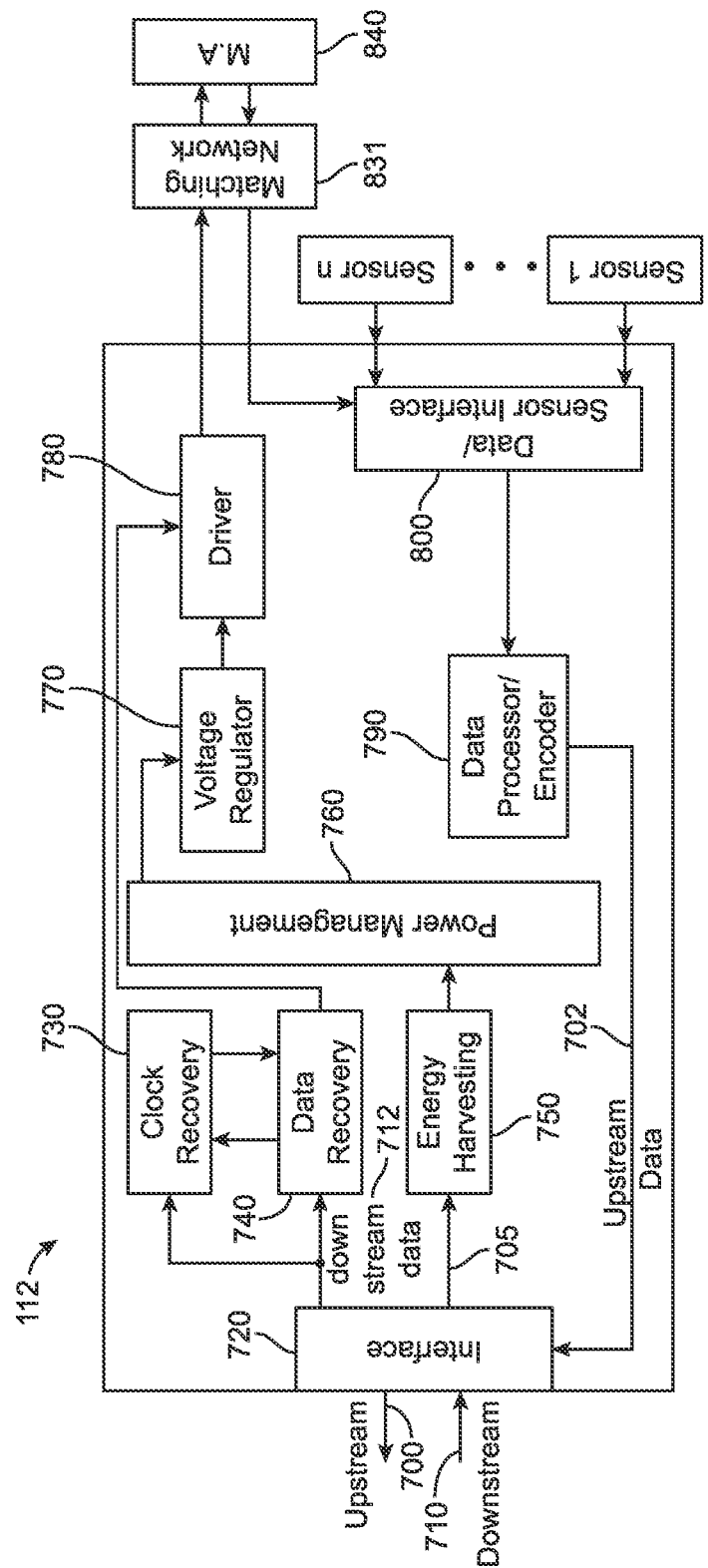
FIG. 17 is a block diagram of a contact hearing device according to the present invention.

FIG. 17 is a block diagram of a contact hearing device 112 according to an embodiment of the present invention. In FIG. 17, contact hearing device 112 includes interface 720, clock recovery circuit 730, data recovery circuit 740 and energy harvesting circuit 750. In embodiments of the invention, interface 720 is adapted to transmit data from contact hearing device 112 and to receive data transmitted to contact hearing device 112. Interface 720 may be an inductive interface. Contact hearing device 112 may further include power management circuit 760, voltage regulator 770, driver 780, data processor encoder 790 and data/sensor interface 800.

In FIG. 17, upstream data 702 collected from data processor/encoder 790 may be transmitted via interface 720 as a part of upstream signal 700. Downstream signal 710 may be transmitted to interface 720, which may extract the data portion and may distribute downstream data 712 to data recovery circuit 740 and clock recovery circuit 730. Interface 720 may further transmit at least a portion of downstream signal 710 to energy harvesting circuit 750. The output of energy harvesting circuit 750 may be transmitted to power management circuit 760, which may then distribute energy to voltage regulator 770. Voltage regulator 770 may distribute its output to driver 780, which may also receive input from data recovery circuit 740. The output of driver 780 may be sent through matching network 831 to drive, for example, microactuator 840.

Microactuator 840 may include sensors (not shown) which generate data about the function of microactuator 840. This data may be transmitted back to contact hearing device 112 through matching network 831 and to data/sensor interface 800, which, in turn may transmit the sensor information to data processor/encoder 790, which generates upstream data 702. Data/sensor interface 800 may also receive information from other sensors (e.g. Sensor 1 to Sensor n in FIG. 4), which data is, in turn, transmitted to data processor/encoder 790 and becomes part of upstream data 702.

FIG. 18 is a diagram of a rectifier and converter circuit 865 according to the present invention. In FIG. 18, rectifier and converter circuit 865 may include diode 974 and capacitor 972. In embodiments of the invention, the input to rectifier and converter circuit 865 may be connected directly to receive coil 130. In embodiments of the invention, the output of rectifier and converter circuit 865 may be coupled directly to a load, such as, for example, a transducer or a balanced armature transducer. In embodiments of the invention, the output of rectifier and converter circuit 865 may be coupled to the windings in a load, such as, for example, a transducer or a balanced armature transducer.

FIG. 18A is a diagram of a rectifier and converter circuit 865 according to the present invention. In embodiments of the invention, rectifier and converter circuit 865 may comprise a Villard Circuit. In embodiments of the invention, rectifier and converter circuit 865 may be a voltage multiplier circuit. In FIG. 18, rectifier and converter circuit 865 may include diode 974, AC filter capacitor 975 (which may be a series capacitor) and resonant capacitor 977. In embodiments of the invention, the input to rectifier and converter circuit 865 may be connected directly to receive coil 130. In embodiments of the invention, the output of rectifier and converter circuit 865 may be coupled directly to a load, such as, for example, a transducer or a balanced armature transducer. In embodiments of the invention, the output of rectifier and converter circuit 865 may be coupled to the windings in a load, such as, for example, a transducer or a balanced armature transducer.

FIG. 19 is a diagram of an alternative rectifier and converter circuit 865 according to the present invention. In embodiments of the invention, rectifier and converter circuit 865 may include diodes 974 and capacitors 972 which may form, for example bridge circuits such as, for example a half wave bridge.

FIG. 20 is a diagram of an alternative rectifier and converter circuit according to the present invention. In embodiments of the invention, rectifier and converter circuit 865 may include diodes 974 and capacitors 972 which may form, for example bridge circuits such as, for example, a full wave bridges. In embodiments of the invention, rectifier and converter circuit 865 may be connected to receive coil 130.

FIG. 21 is a diagram of a portion of a contact hearing device 112 according to the present invention. In embodiments of the invention, the input to rectifier and converter circuit 865 may be connected to receive coil 130 through additional circuitry, such as, for example, capacitor 854 or input circuitry 976. In embodiments of the invention, the output of rectifier and converter circuit 865 may be coupled to a load, such as, for example, a transducer or a balanced armature transducer through an output circuit 978. In embodiments of the invention, output circuit 978 may be, for example, a capacitor, an inductor, a combination of electrical or electronic components and/or a matching circuit.

FIG. 21A is a diagram of a portion of a contact hearing device according to the present invention. In FIG. 21A, contact hearing device 112 may include receive coil 130, connected to rectifier and converter circuit 865, which, in turn, may be connected to load 882, which may be, for example, a microactuator, for example a balanced armature microactuator.

Figure 22:
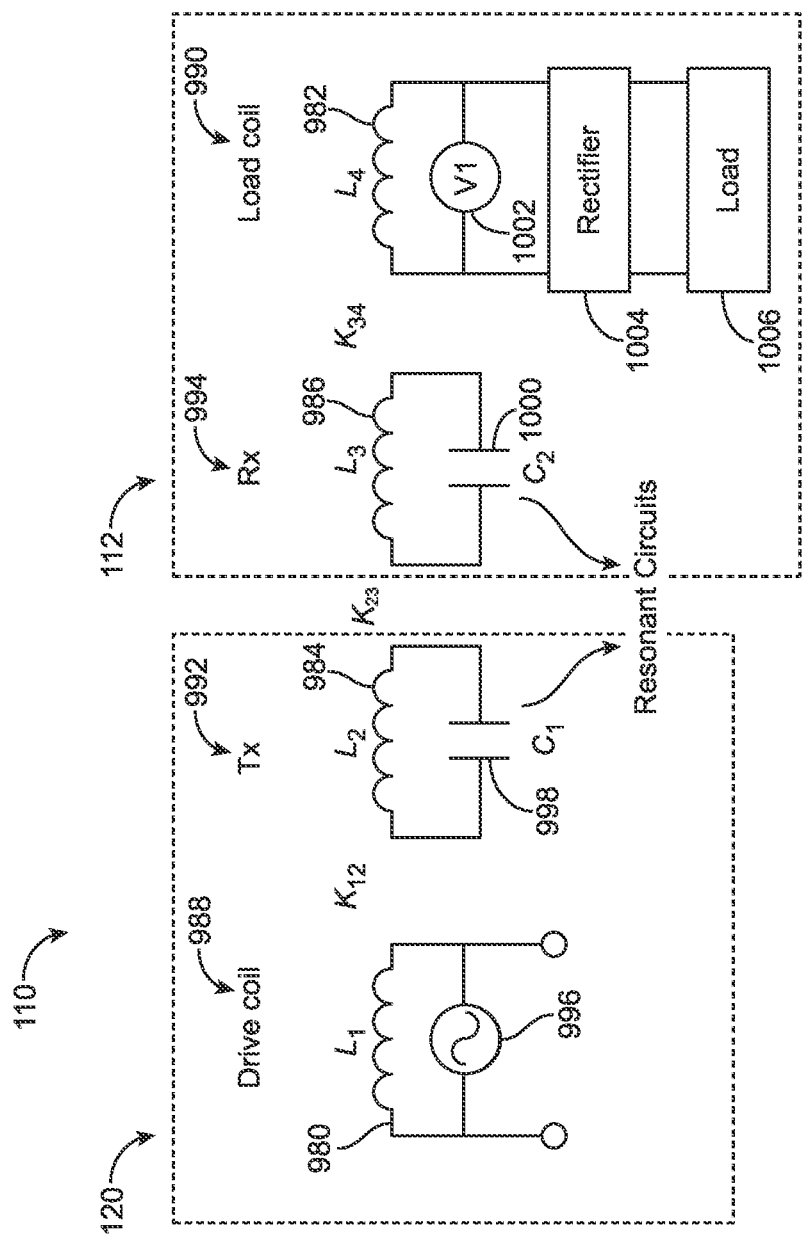
FIG. 22 is a circuit diagram of transmitter and receiver components of a contact hearing system according to embodiments of the present invention.

FIG. 22 is a circuit diagram of transmitter and receiver components of a contact hearing system 110 according to embodiments of the present invention. In embodiments of the invention, ear tip 120 may include a drive circuit 988, which may also be referred to as a transmit circuit. Drive circuit 988 may include coil L1 980 and signal source 996. In embodiments of the invention, ear tip 120 may further include transmit resonant circuit 992. In embodiments of the invention, transmit resonant circuit 992 may include resonant transmit coil L2 994 and resonant transmit capacitor C1 998. In embodiments of the invention, contact hearing device 112 may include load circuit 990. In embodiments of the invention, load circuit 990 may include load coil 982, voltage detector 1002, rectifier 1004 and load 1006. In embodiments of the invention, contact hearing device 112 may include receive resonant circuit 994. In embodiments of the invention, receive resonant circuit 994 may include resonant receive coil 986 and resonant receive capacitor C2 1000.

Figure 22A:
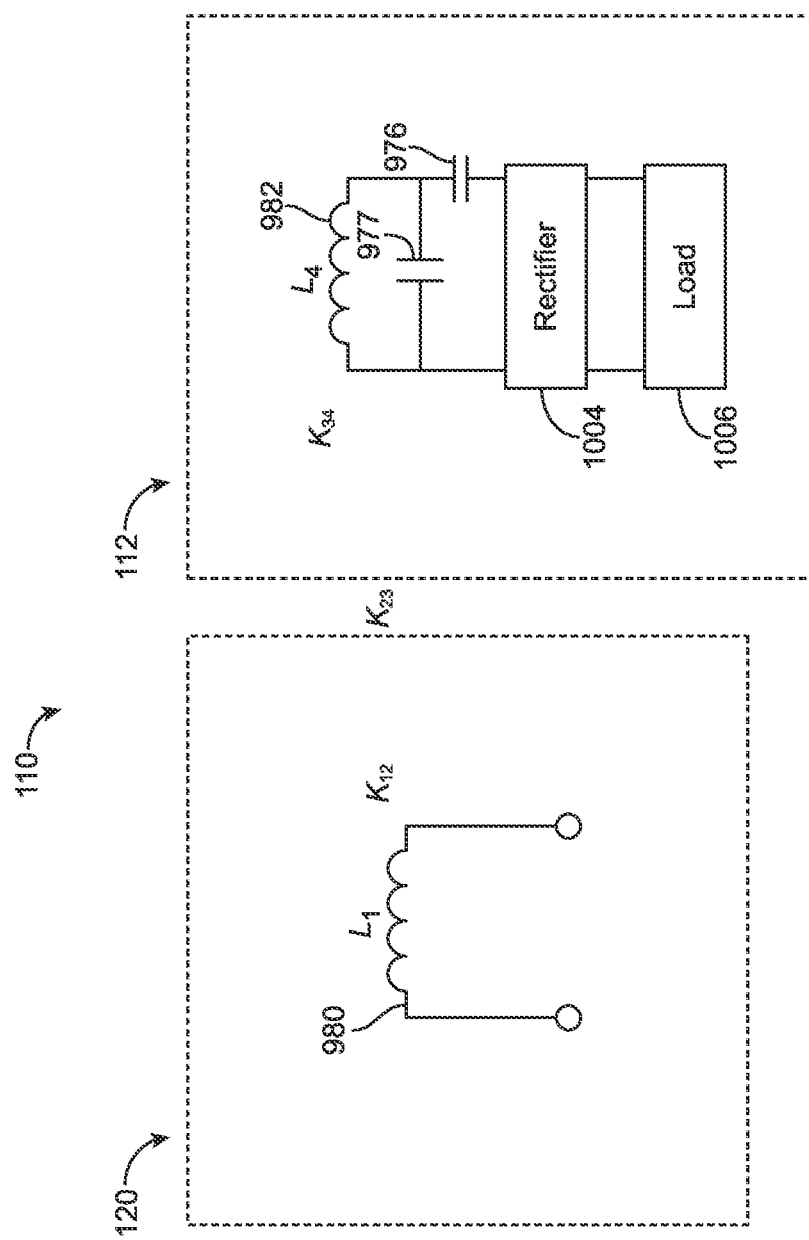
FIG. 22A is a circuit diagram of transmitter and receiver components of a contact hearing system according to embodiments of the present invention.

FIG. 22A is a circuit diagram of transmitter and receiver components of a contact hearing system according to embodiments of the present invention. In the contact hearing system 110 of FIG. 22A, ear tip 120 includes drive coil L1 980. In the contact hearing system 110 of FIG. 22A, contact hearing device 112 includes load coil L4 982, resonance capacitor 977 (which may also be referred to as a tuning capacitor), AC filter capacitor 975, rectifier circuit 1004 and load 1006.

In embodiments of the invention, drive coil 980 may be a transmit coil such as, for example, transmit coil 290. In embodiments of the invention, load coil 982 may be a receive coil such as, for example, receive coil 130. In embodiments of the invention, rectifier 1004 may be a rectifier and converter circuit such as, for example, rectifier and converter circuit 865. In embodiments of the invention, load 1006 may be an actuator, such as, for example microactuator 140. In embodiments of the invention, microactuator 140 may be, for example, a balanced armature microactuator.

Figure 23:
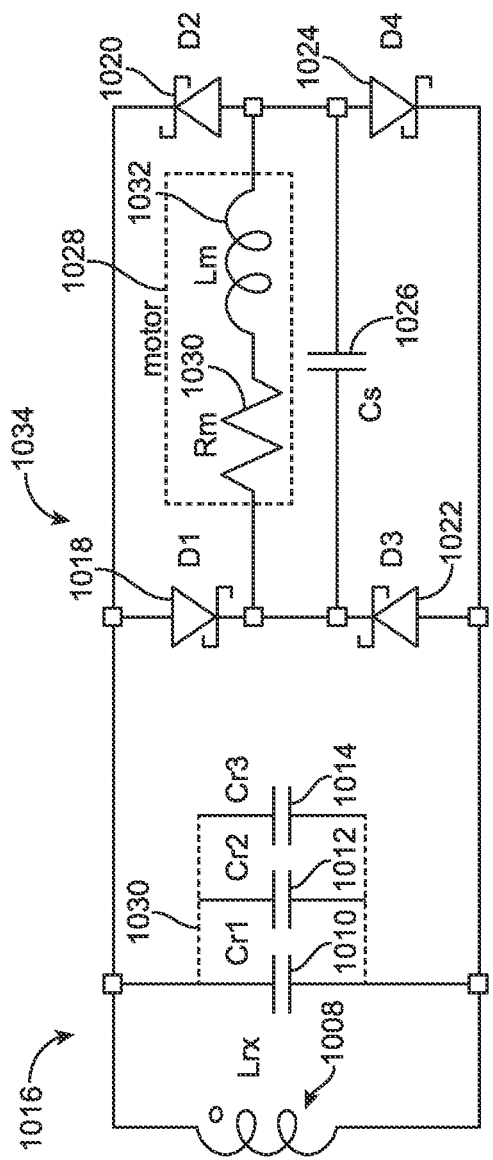
FIG. 23 is a circuit diagram of components of a receiver for use in a contact hearing system according to the present invention.
Figure 24:
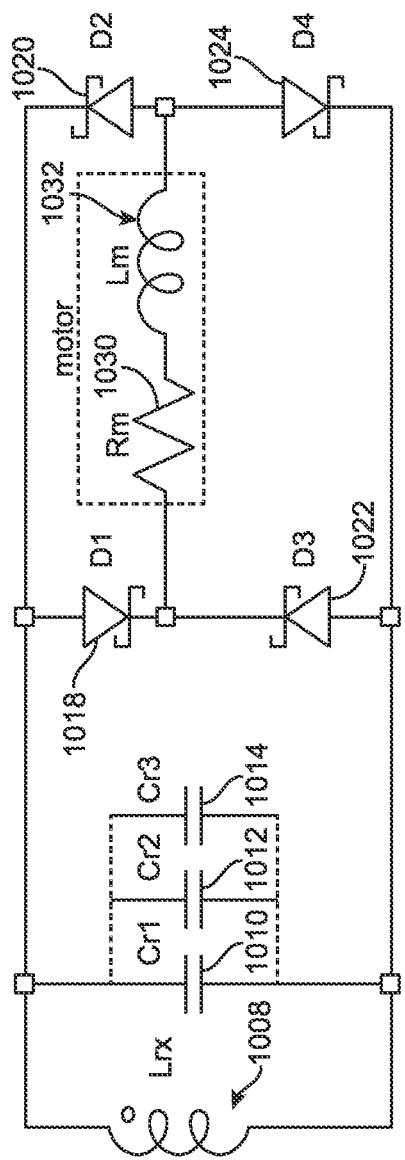
FIG. 24 is a circuit diagram of components of a receiver for use in a contact hearing system according to the present invention.

FIGS. 23 and 24 are circuit diagrams of components of a receiver 1016 for use in a contact hearing system 110 according to the present invention. In embodiments of the invention, receiver 1016 may be constructed in a full-wave rectifier receiver configuration, including a smoothing capacitor. In embodiments of the invention, receiver 102 includes receive inductor Lrx 1008, receive capacitor array 1030, diode bridge 1032, motor 1028, and smoothing capacitor 1026. In embodiments of the invention, receive capacitor array 1030 may include one or more receive capacitors, such as, receive capacitor Cr1 1010, receive capacitor Cr2 1012 and receive capacitor Cr3 1014. In embodiments of the invention, diode bridge 1034 may include one or more diodes, such as, diode D1 1018, diode D2 1020, diode D3 1022, and diode D4 1024. In embodiments of the invention, diode bridge 1034 may be arranged as a full wave rectifier bridge with a load, such as, for example, motor 1028 connected across the output of the full wave rectifier. In embodiments of the invention (such as the one illustrated in FIG. 23), a smoothing capacitor Cs 1026 may be connected across the output of the full wave rectifier in parallel with the motor 1028. In embodiments of the invention (such as the one illustrated in FIG. 24), the smoothing capacitor may be omitted. In embodiments of the invention, the diodes used in diode bridge 1034 may be Schottky diodes. In embodiments of the invention, the electrical characteristics of motor 1028 may be represented by the series circuit which includes motor resistor 1030, representing the resistance of the circuitry in motor 1028 and motor inductor 1032, representing the inductance of motor 1028 at the frequency of operation.

Figure 25:
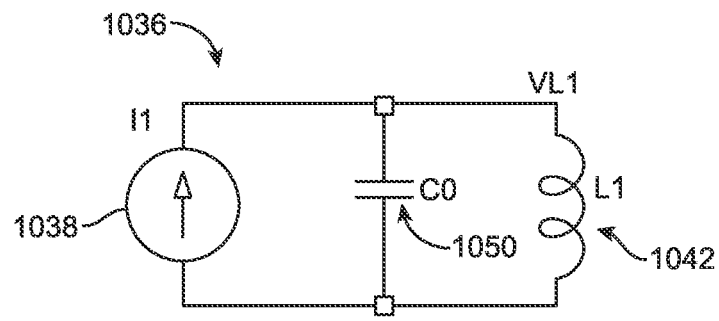
FIG. 25 is a circuit diagram of components of a transmitter for use in a contact hearing system according to the present invention.

FIG. 25 is a circuit diagram of components of a transmitter 1036 for use in a contact hearing system 110 according to the present invention. In embodiments of the invention, transmitter 1036 may be a current source 1038 connected in parallel with one or more output capacitors, such as C0 1040 and output coil L1 1042. In the embodiment of the invention, illustrated in FIG. 25, the transmitter may be a parallel drive with the signal input modeled as current source 1038. The configuration illustrated in FIG. 25 is advantageous because it requires a low input current.

Figure 26:
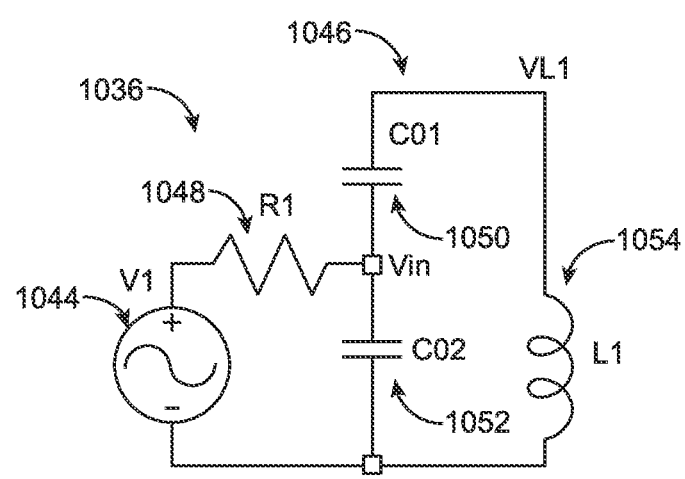
FIG. 26 is a circuit diagram of components of a transmitter for use in a contact hearing system according to the present invention.

FIG. 26 is a circuit diagram of components of a transmitter 1036 for use in a contact hearing system 110 according to the present invention. In embodiments of the invention, transmitter 1036 may be modeled as a voltage source 1044 feeding a capacitive transformer/divider 1046 through a resistor R1 1048. In this embodiment, capacitive transformer/divider 1046 may be modeled as Capacitor CO1 1050 in series with capacitor CO2 1052, which are in parallel with inductor L1 1054. The embodiment of the transmitter, illustrated in FIG. 26 is advantageous because it may be used to generate a large VL1 when V1 is small, thus allowing the circuit to be driven by, for example, a battery having a limited output voltage, for example, an output voltage in the range of 3 Volts. In this embodiment, voltage source V1 1044, in parallel with resistor R1 1048, combine to form a quasi-current source. In the embodiment illustrated, the resonant frequency will be a function of the series combination of capacitor CO1 1050, capacitor CO2 1052 and Inductor L1 1054.

Figure 27:
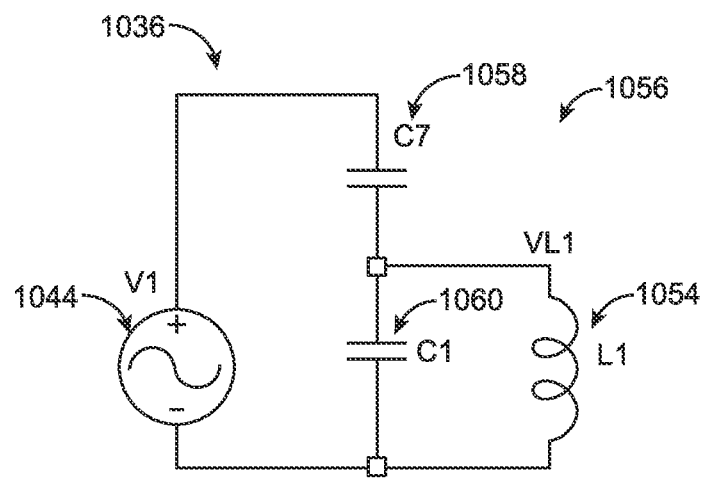
FIG. 27 is a circuit diagram of components of a transmitter for use in a contact hearing system according to the present invention.

FIG. 27 is a circuit diagram of components of a transmitter 1036 for use in a contact hearing system 110 according to the present invention. In embodiments of the invention, the circuit illustrated may represent a parallel drive arrangement for transmitter 1036. In embodiments of the invention, transmitter 1036 may be modeled as a voltage source V1 1044 feeding a parallel drive circuit 1056. In embodiments of the invention, parallel drive circuit 1056 may include capacitor C7 1058, capacitor C1 1060 and inductor L1 1054. In embodiments of the invention, capacitor C7 1058 adds impedance to voltage source V1 1044 to create a quasi-current source. In embodiments of the invention, C7 may be small compared to C1 1060 in order to ensure that most of the tank current flows in the L1-C1 loop, rather than in the L1-C7 loop. In embodiments of the invention, the resonant frequency will depend on the series combination of inductor L1 1054 with the parallel combination of capacitor C1 1060 and capacitor C7 1058.

In embodiments of the invention, using inductive coupling for power and/or data transfer in a contact hearing system may result in benefits over other methods of power and/or data transfer, including: reduced sensitivity to directionality; reduced sensitivity to motion in components of the contact hearing system; improved patient comfort; reduced sensitivity to the presence of bodily fluids, including cerumen; reduced sensitivity to the presence of tissue between the ear tip and the contact hearing device; reduced sensitivity to tissue loading; reduced sensitivity to the distance between the ear tip and the contact hearing device. In embodiments of the invention, power and data transfer may be separated (e.g. different frequencies) or combined.

Figure 32:
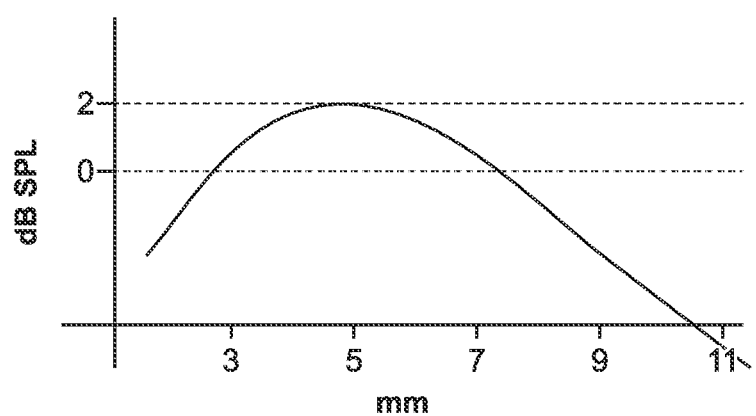
FIG. 32 is a graph of output in dB SPL as a function of transmit coil to receive coil distance.

In embodiments of the invention, data and power may be transferred from an ear tip to a contact hearing device using near field magnetic coupling. In embodiments of the invention, data may be transferred from an ear tip to a contact hearing device using near field magnetic coupling. In embodiments of the invention, power may be transferred from an ear tip to a contact hearing device using near field magnetic coupling. In embodiments of the invention, the use of near field magnetic coupling results in a power transfer wherein the power output from the contact hearing device remains relatively constant even when the distance between the ear tip and the contact hearing device varies. In embodiments of the invention, as illustrated in FIG. 32, the use of near field magnetic coupling results in a power output wherein the output of the contact hearing device varies by less than 2 dB SPL when the distance between the ear tip and the contact hearing device varies between 3 and 7 millimeters. In embodiments of the invention, as illustrated in FIG. 32, the use of near field magnetic coupling results in a power output wherein the output of the contact hearing device varies by less than 2 dB SPL when the distance between the ear tip and the contact hearing device is approximately 3 millimeters. In embodiments of the invention, data and power may be transmitted from an ear tip to a contact hearing device using resonant inductive coupling. In embodiments of the invention, the receive coil and the transmit coil may be connected through resonant inductive coupling. In embodiments of the invention, data and power may be transmitted from an ear tip to a contact hearing device using near field magnetic induction. In embodiments of the invention, data and power may be transmitted from an ear tip to a contact hearing device using a near field magnetic induction link.

In embodiments of the invention, such near field magnetic coupling could also be used to remotely power and/or deliver signal to neuro-stim implants. In embodiments of the invention the actuator may be replaced by electrodes. In embodiments of the invention, such near field magnetic coupling could also be used to remotely power in-body valves for, for example, bladder control.

In embodiments of the invention, the separation between the transmit coil and the receive coil may be between approximately five and nine millimeters when the system is placed in a user's ear.

In one embodiment, the present invention is directed to a method of transmitting information from an ear tip to a contact hearing device, the method including the steps of: exciting a transmit coil, the transmit coil being positioned in the ear tip, wherein the transmit coil is wound on a core, the core including a ferromagnetic material; radiating an electromagnetic field from the first coil through the ear canal of a user; receiving the radiated electromagnetic field at a receive coil, the receive coil being positioned on a contact hearing device, the contact hearing device including a receive coil without a ferrite core; and transmitting the information from the transmit coil to the receive coil using near-field radiation. In embodiments of the invention, the ear tip includes the transmit coil and the contact hearing device includes the receive coil. In embodiments of the invention, the method includes the step of adapting the ear tip such that it positions the medial end of the transmit coil to be within between 3 and 7 millimeters of the lateral end of the receive coil when the ear tip and contact hearing device are positioned in the ear canal of a user. In embodiments of the invention, the method includes the step of adapting the ear tip such that when it is positioned in the ear canal of a user more than fifty percent of magnetic flux lines emanating from the transmit coil couple through the receive coil. In embodiments of the invention, the method includes the step of adapting the ear tip such that when it is positioned in the ear canal of a user more than seventy five percent of a magnetic field generated by the transmit coil is coupled to the receive coil. In embodiments of the invention, the method includes the step of generating a signal in the transmit coil induces current in the receive coil, wherein the induce current is induced by the presence of a magnetic field generated at the transmit coil. In embodiments of the invention, the current induced is proportional to the magnetic field at the transmit coil. In embodiments of the invention, the step of generating a signal in the transmit coil results in a voltage generated across the receive coil wherein the generated voltage is a product of the magnetic field generated at the transmit coil. In embodiments of the invention, the voltage generated is proportional to the magnetic field at the transmit coil. In embodiments of the invention, the transmitted information is transmitted in an amplitude modulated (AM) signal. In embodiments of the invention, the transmitted information is demodulated by a demodulator attached to a receive coil. In embodiments of the invention, the transmit coil is magnetically coupled to the receive coil. In embodiments of the invention, the coupling between the transmit and receive coils is between approximately 0.1 percent and approximately 3.0 percent. In embodiments of the invention, information and power are transmitted from the transmit coil to the receive coil through the interaction of magnetic fields generated in the transmit coil with the receive coil. In embodiments of the invention, the core includes a ferrite material.

In one embodiment, the present invention is directed to a method of transmitting information from an ear tip to a contact hearing device, the method including the steps of: exciting a transmit coil, the transmit coil being positioned in an ear tip, wherein the transmit coil is wound on a ferrite core; radiating an electromagnetic field from the first coil through the ear canal of a user; receiving the radiated electromagnetic field at a receive coil, the receive coil being positioned on a contact hearing device without a ferrite core; and transmitting the information from the transmit coil to the receive coil using a near-field radiation. In embodiments of the invention, the first and second coils are inductively coupled. In embodiments of the invention, inductive coupling is used to link the first coil to the second coil. In embodiments of the invention, the information is transmitted from the first coil to the second coil using near-field magnetic coupling. In embodiments of the invention, the information is transmitted from the first coil to the second coil using resonant inductive coupling. In embodiments of the invention, the information is transmitted from the first coil to the second coil using near-field magnetic induction. In embodiments of the invention, the information is transmitted from the first coil to the second coil using a near-field magnetic induction link. In embodiments of the invention, the output of the contact hearing device varies by less than two decibels sound pressure level (dB SPL) when the distance between the transmit and receive coils varies by between three and seven millimeters. In embodiments of the invention, the receive coil is a part of a receive coil assembly, the receive coil assembly including: the receive coil; at least one disk positioned at a distal end of the receive coil, the at least one disk including a ferromagnetic material. In embodiments of the invention, the receive coil is wound with a central core of a non-ferromagnetic material. In embodiments of the invention, the non-ferromagnetic material is, at least in part, air. In embodiments of the invention, the outer diameter of the at least one disk is substantially the same as the outer diameter of the receive coil. In embodiments of the invention, the at least one disk includes a hole therethrough. In embodiments of the invention, the at least one disk is two disks. In embodiments of the invention, a printed circuit board including electronic components is affixed to a side of the at least one disk opposite the side to which the receive coil is affixed. In embodiments of the invention, the at least one disk includes a ferrite material.

In one embodiment the present invention is directed to a method of transmitting information from an ear tip to a contact hearing device, the method including the steps of: exciting a transmit coil, the transmit coil being positioned in an ear tip, wherein the transmit coil is wound on a ferromagnetic core; radiating an electromagnetic field from the transmit coil through an ear canal of a user; receiving the radiated electromagnetic field at a receive coil, the receive coil being positioned on a contact hearing device, the receive coil having a core of a non-ferromagnetic material; and transmitting the information from the transmit coil to the receive coil using the electromagnetic field. In embodiments of the invention, the transmit and receive coils are inductively coupled. In embodiments of the invention, inductive coupling is used to link the transmit coil to the receive coil. In embodiments of the invention, the information is transmitted from the transmit coil to the receive coil using near-field magnetic coupling. In embodiments of the invention, the information is transmitted from the transmit coil to the receive coil using resonant inductive coupling. In embodiments of the invention, information is transmitted from the transmit coil to the receive coil using near-field magnetic induction. In embodiments of the invention, information is transmitted from the transmit coil to the receive coil using a near-field magnetic induction link. In embodiments of the invention, the output of the contact hearing device varies by less than two decibels sound pressure level (dB SPL) when the distance between the transmit and receive coils varies by between three and seven millimeters. In embodiments of the invention, the receive coil is a part of a receive coil assembly, the receive coil assembly including: the receive coil; at least one disk positioned at a distal end of the receive coil, the at least one disk including a ferromagnetic material. In embodiments of the invention, the receive coil is wound with a central core of a non-ferromagnetic material. In embodiments of the invention, the non-ferromagnetic material is, at least in part, air. In embodiments of the invention, an outer diameter of the at least one disk is substantially the same as an outer diameter of the receive coil. In embodiments of the invention, the at least one disk includes a hole therethrough. In embodiments of the invention, the at least one disk is two disks. In embodiments of the invention, a printed circuit board including electronic components is affixed to a side of the at least one disk opposite a side to which the receive coil is affixed. In embodiments of the invention, the electronic components on the printed circuit board includes a demodulation circuit. In embodiments of the invention, the demodulation circuit is a diode demodulator. In embodiments of the invention, the at least one disk includes a ferrite material.

In embodiments of the invention, the transmit coil may include a coil with an air core. In embodiments of the invention, the transmit coil may include a coil wound around a ferrite core. In embodiments of the invention, the transmit coil may include a coil wound around a ferrite core with a channel through the center of the ferrite core, the channel forming an opening from the proximal end to the distal end of the ferrite core. The channel may further be positioned and sized to form an acoustic vent, allowing sound to pass through the ferrite core. In embodiments of the invention, the receive coil may include a coil wound around an air core. In embodiments of the invention, the receive coil may include a coil wound around ferrite core.

Figure 33:
FIGS. 33-35 illustrate various transmit coil vs receive coil alignments according to the present invention.
Figure 34:
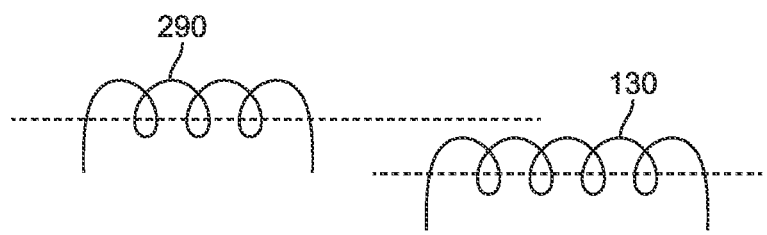
Figure 35:
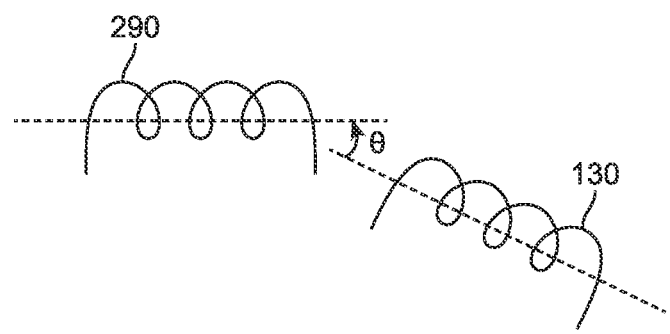

As illustrated in FIGS. 33-35, in embodiments of the invention, the central axis of the receive core and the central axis of the transmit core may be substantially parallel when the ear tip and the contact hearing device are positioned in the ear canal of a user. In embodiments of the invention, the central axis of the receive core and the central axis of the transmit core form an angle of not greater than 15 degrees. In embodiments of the invention, the central axis of the receive core and the central axis of the transmit core form an angle of not more than approximately 25 degrees. In embodiments of the invention, the system has a signal reduction of less than 0.5 dB over an angle of between plus and minus 20 degrees from full alignment.

In embodiments of the invention, a reduction in output (in dB) for a receive coil assembly as a function of the transmit to receive coil angle as a function of the distance L, and the angles $\theta_1$, $\theta_2$ and $\theta_3$ over a range of ±45°. In embodiments of the invention, the angle $\theta$ may be greater than ±45° and distance between the transmit coil and the receive coil may be between 2 and 12 mm.

Figure 46A:
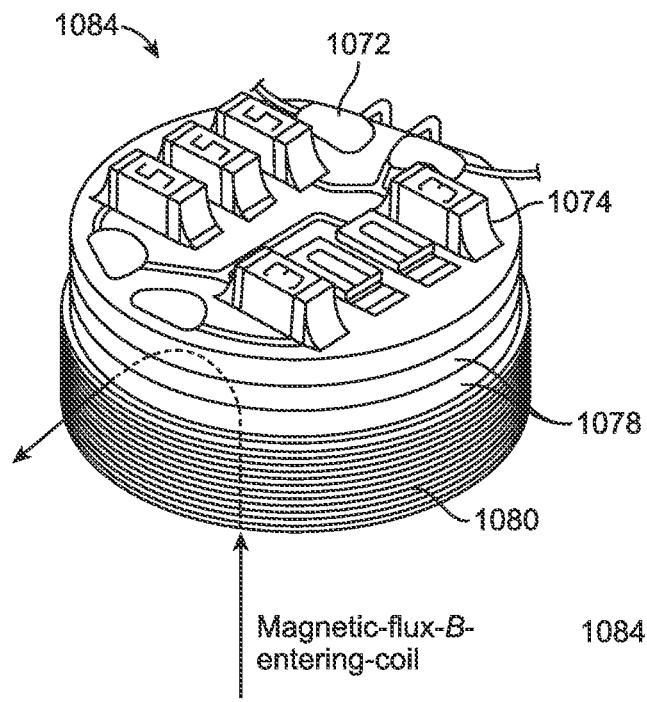
FIG. 46A is a perspective view of a receive circuit assembly according to the present invention.
Figure 46B:
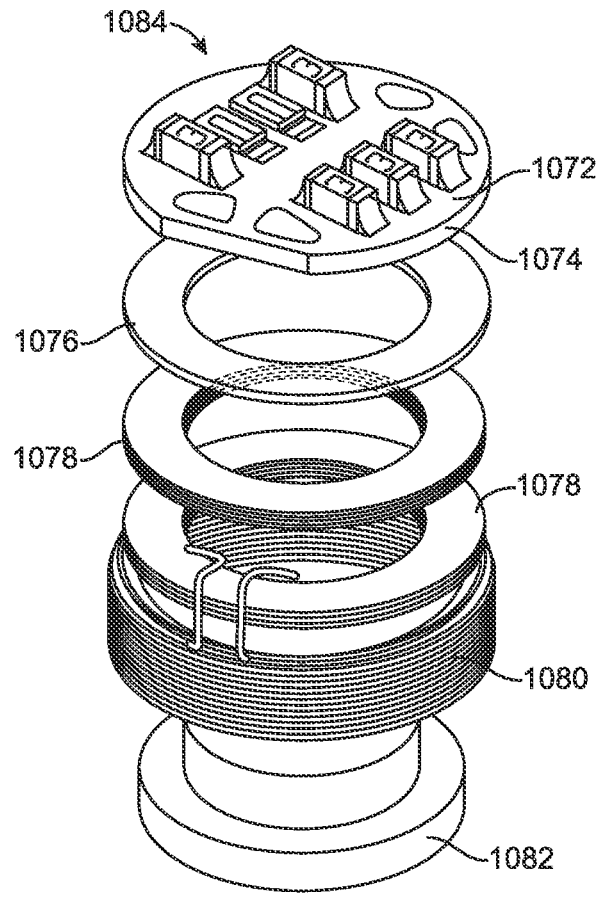
FIG. 46B is a perspective exploded view of a receive coil according to the present invention.

As illustrated in FIGS. 44, 45, 46A and 46B, a receive circuit assembly 1084 may include receive circuit board 1074, which may have mounted thereon receive circuit components 1072. Receive circuit assembly may further include receive coil winding (Rx Coil) 1080 and ferrite disk(s) 1078. Ferrite disc(s) 1078 may be attached to receive circuit board 1074 by adhesive 1076. Receive coil winding 1080 may include a plug 1082 at a proximal end thereof. In embodiments of the invention, receive coil winding 1080 may be wound around a core of a non-ferromagnetic material, such as, for example air. In embodiments of the invention, ferrite disk(s) 1078 may include a hole in the center of the disks. In embodiments of the invention, the hole in the center of ferrite disk(s) 1078 may be substantially the same diameter as the core of receive coil winding 1080. FIG. 46A illustrates the flux path through receive circuit assembly 1084 wherein the flux may be generated by an ear tip which is located a distance away from receive circuit assembly 1084 in the ear canal of a user. In embodiments of the invention, the magnetic flux may be generated in a coil positioned in the ear tip and may be a signal representative of information (e.g. audio information) to be transmitted to a contact hearing device which includes receive circuit assembly 1084. In FIG. 46A flux enters receive circuit assembly 1084 at a proximal end thereof and passes through receive coil winding 1080 and then through ferrite disk(s) 1078. In FIG. 46A the flux passing through receive circuit assembly 1084 induces a current in receive coil winding 1080. In embodiments of the invention, the current induced in receive coil winding 1080 will be conducted electrical components on contact hearing device 112, which will demodulate the received signal and transmit that signal to a microactuator 140 which may be in contact with the tympanic membrane of a user.

In embodiments of the invention, receive circuit assembly 1084 includes receive coil windings 1080 which may be backed by one or more (e.g. two) two ring-shaped ferrite layers (which may also comprise or be referred to as ferrite disk(s)) 1078 to which receive circuit components (e.g. one of the demodulator circuit described herein) are attached. In embodiments of the invention, the ferrite layers may increase the strength of the received signals in multiple ways.

In embodiments of the invention, the ferrite layers may increasing the inductance and Q of receive circuit assembly 1084. In embodiments of the invention, the ferrite layers may shunt magnetic flux entering receive coil windings 1080 to the outside of receive coil windings 1080 on the distal (PCB) end of receive coil windings 1080. In embodiments of the invention, magnetic flux may be shunted because the ferrite layers have high permeability and low reluctance compared to air and PCB material. In embodiments of the invention, this shunting of the magnetic flux results in the magnetic field being coupled more tightly around the receive coil windings 1080, which increases inductance without significant effect on the AC resistance. The Q increases directly from its defining equation $Q=2\pi fL/R_{AC}$, where f is the carrier frequency and L and $R_{AC}$ are the inductance and resistance at the carrier frequency, respectively.

In embodiments of the invention, shunting the field, the ferrite layers also shield receive circuit board 1074 and receive circuit components 1072 from the magnetic field and reduce loading of the magnetic field by eddy currents in the metal traces of receive circuit board 1075. As a result, the field inside receive coil windings 1080 is stronger, compared to a receive circuit assembly 1084 which did not include any ferrite layers (e.g. ferrite disk(s) 1078 and, therefore, may produce a higher signal strength at the output of receive circuit assembly 1084.

In embodiments of the invention, by acting as spacers to separate receive circuit board 1074 from a distal end of receive coil windings 1080 decreases magnetic-field loading caused by the presence of receive circuit board 1074 and receive circuit components 1072 at the distal end of receive coil windings 1080.

In embodiments of the invention, ferrite disk(s) 1078 may comprise a single layer of ferrite material. In embodiments of the invention ferrite disk(s) 1078 may be a ferrite powder embedded in a rubbery matrix. In embodiments of the invention the ferrite layers, ferrite disks or ferrite rings described herein may be made of any suitable ferromagnetic material.

In embodiments of the invention, the present invention is directed to a contact hearing system including: a transmit coil positioned in an ear tip wherein the transmit coil includes an electrical coil wound on a ferrite core; a receive coil positioned on a contact hearing device wherein the receive coil includes an electrical coil wound on a non-ferrite core. In embodiments of the invention, the non-ferrite core includes air. In embodiments of the invention, the receive coil is a component of a receive coil assembly, the receive coil assembly including at least one ferrite disk positioned at a distal end of the receive coil. In embodiments of the invention, the at least one ferrite disk includes a hole in a center of the at least one ferrite spacer. In embodiments of the invention, the at least one ferrite disk includes a plurality of ferrite disks laminated together. In embodiments of the invention, the at least one ferrite disk includes two or more ferrite disks. In embodiments of the invention, the receive coil includes a first central axis and the at least one ferrite disk includes a second central axis, the first central axis and the second central axis being aligned. In embodiments of the invention, the ferrite core includes a channel extending from a proximal to a distal end thereof. In embodiments of the invention, a central axis of the transmit coil and a central axis of the receive coil are substantially parallel when the ear tip and the contact hearing device are positioned in an ear canal of a user. In embodiments of the invention, a central axis of the transmit coil and a central axis of the receive coil form an angle of approximately 15 degrees or less when the ear tip and the contact hearing device are positioned in an ear canal of a user. In embodiments of the invention, a central axis of the transmit coil and a central axis of the receive coil form an angle of approximately 25 degrees or less when the ear tip and the contact hearing device are positioned in an ear canal of a user. In embodiments of the invention, a distal end of the transmit coil is positioned within between three and seven millimeters of the proximal end of the receive coil.

In embodiments of the invention, the present invention is directed to a contact hearing system, the contact hearing system including: an ear tip, the ear tip including a transmit coil wherein the transmit coil is wound around a core including, at least in part, a ferromagnetic material; and a contact hearing device including a receive coil wherein the receive coil is wound around a core including, at least in part, a non-ferromagnetic material. In embodiments of the invention, the ferromagnetic material includes a ferrite material. In embodiments of the invention, the non-ferromagnetic material includes air. In embodiments of the invention, the contact hearing device includes a receive circuit assembly, the receive circuit assembly including: the receive coil; a disk attached to a distal end of the receive coil wherein the disk includes a ferromagnetic material. In embodiments of the invention, the disk has a diameter which is substantially the same as a diameter of the receive coil. In embodiments of the invention, the disk has a hole in its center. In embodiments of the invention, the receive circuit assembly further includes a printed circuit board including electronic components. In embodiments of the invention, the disk acts as a spacer to separate the printed circuit board from a distal end of the receive coil. In embodiments of the invention, magnetic flux lines entering a proximal end of the receive coil are bent away from the printed circuit board by the disk as they exit a distal end of the receive coil. In embodiments of the invention, at least a portion of magnetic flux lines entering a proximal end of the receive coil are prevented from reaching the printed circuit board as they exit a distal end of the receive coil. In embodiments of the invention, the presence of the disk increases a quality factor (Q) of the receive circuit assembly. In embodiments of the invention, the disk reduces eddy currents in conductive traces on the printed circuit board when magnetic flux is passed through the receive coil. In embodiments of the invention, the printed circuit board includes components of a demodulation circuit.

In embodiments of the invention, the transmit and/or receive coils may be encapsulated using a parylene coating.

Figure 52:
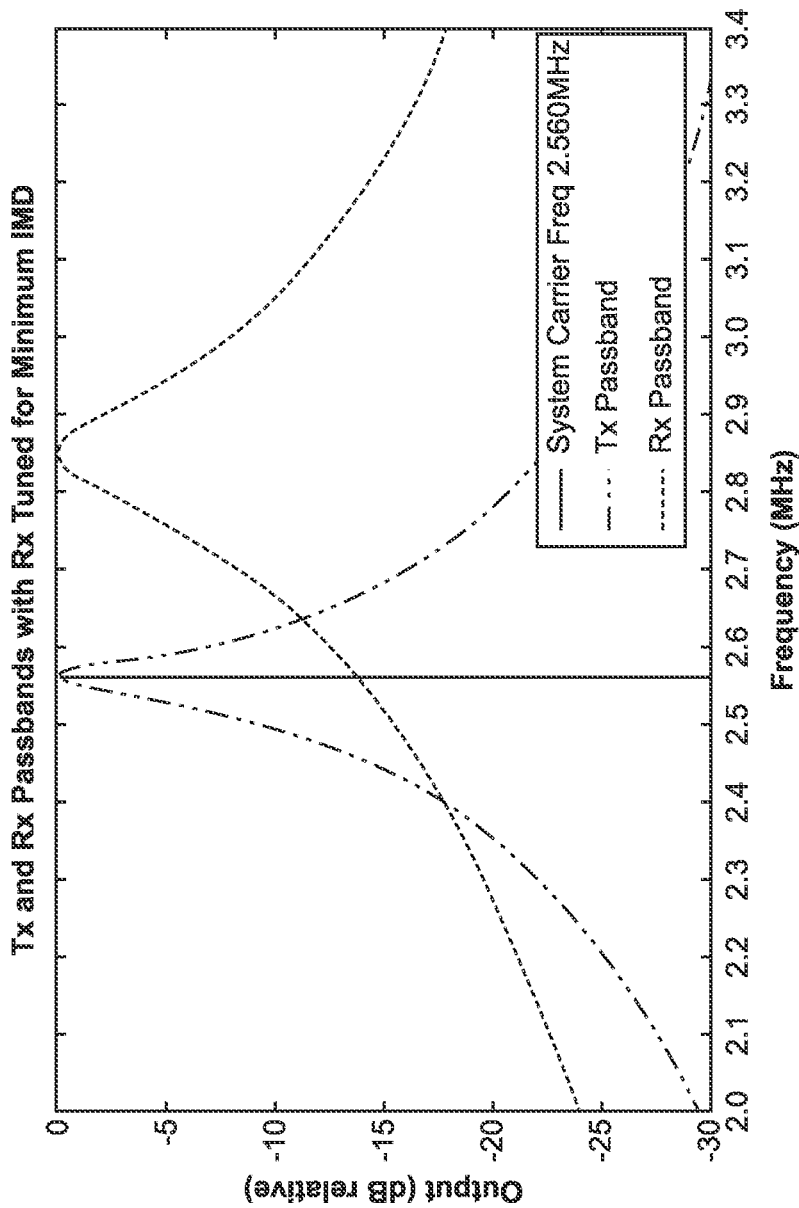
FIG. 52 is a graph showing passband tuning according to the present invention for a transmit circuit and a receive circuit according to the present invention.

In embodiments of the invention, the Q (where Q is defined as the ratio of the energy stored in the resonator to the energy supplied by a to it, per cycle, to keep signal amplitude constant, at a frequency where the stored energy is constant with time) of the transmit circuit ("Tx Q") is higher than the Q of the contact hearing device ("Rx Q"). In embodiments of the invention, the Tx Q may be greater than or equal to 70 and the Rx Q may be less than or equal to 20. In embodiments of the invention, the Rx Q is maximized by moving all circuitry to a board outside of the Rx coil. In embodiments of the invention, a ferrite core is used to increase the Q of the transmit coil. In embodiments of the invention, the transmit signal is amplified by exciting the transmit coil to a high state of resonance. FIG. 52 is an illustration of a system according to the present invention wherein a transmit circuit according to the present invention is tuned to have a higher Q than a receive circuit according to present invention. In embodiments of the invention, the transmit circuit may have a Q of between approximately 50 and 75. In embodiments of the invention, the transmit circuit may have a Q of approximately 60. In embodiments of the invention, the receive circuit may have a Q of between approximately 15 and 25.

In one embodiment, the present invention is directed to a contact hearing system including: an ear tip including a transmit circuit having a first Q value, wherein the ear tip includes a transmit coil wound on a ferrite core; a contact hearing device including a receive circuit having a second Q value, wherein the first Q value is greater than the second Q value; a receive coil positioned on the contact hearing device, wherein the receive coil includes a core of a non-ferromagnetic material. In embodiments of the present invention, the first Q value is greater than the second Q value by a factor of at least two. In embodiments of the present invention, the receive coil includes a disk including a ferromagnetic material at a distal end thereof. In embodiments of the present invention, the disk includes a ferrite material. In embodiments of the present invention, the disk includes a hole in its central portion. In embodiments of the present invention, the transmit coil is inductively coupled to the receive coil. In embodiments of the present invention, the contact hearing device includes a diode detector connected to the receive coil. In embodiments of the present invention, the contact hearing device includes a balanced armature microactuator connected to the receive coil. In embodiments of the present invention, the contact hearing device includes a platform which supports the receive coil, wherein the platform conforms to the anatomy of the wearers ear canal. In embodiments of the present invention, the contact hearing device includes a platform which supports the receive coil, wherein the platform is adapted to position the contact hearing device on a wearer's tympanic membrane.

In one embodiment, the present invention is directed to a method of inductively coupling an ear tip having a transmit circuit to a contact hearing device having a receive circuit, wherein the transmit circuit has a first Q value and the receive circuit has a second Q value, the first Q value being greater than the second Q value, the method including the steps of: exciting a transmit coil in the transmit circuit, the transmit coil being positioned in an ear tip; radiating an electromagnetic field from the transmit coil to a receive coil; receiving the radiated electromagnetic field at the receive coil, the receive coil being positioned on a contact hearing device; and transmitting information from the transmit coil to the receive coil using the electromagnetic field. In embodiments of the present invention, the first Q value is at least twice as large as the second Q value. In embodiments of the present invention, the transmit coil includes a ferrite core. In embodiments of the present invention, the receive coil includes a ferrite disk at a distal end thereof. In embodiments of the present invention, ferrite disk includes a hole in its central portion. In embodiments of the present invention, the information is transmitted from the transmit coil to the receive coil using near field radiation. In embodiments of the present invention, the transmit coil is inductively coupled to the receive coil. In embodiments of the present invention, the electromagnetic radiation induces a current in the receive coil. In embodiments of the present invention, the current induced in the receive coil is proportional to a level of magnetic flux passing through the receive coil. In embodiments of the present invention, a current induced in the receive coil drives a balanced armature microactuator positioned on the contact hearing device.

In one embodiment, the present invention is directed to a contact hearing system including: an ear tip including a transmit circuit having a first Q value, wherein the ear tip includes a transmit coil wound on a ferrite core, the first Q being in a range of between fifty and seventy-five; a contact hearing device including a receive circuit having a second Q value, wherein the second Q value is in the range of between fifteen and twenty-five; a receive coil positioned on the contact hearing device, wherein the receive coil has a core of non-ferromagnetic material. In embodiments of the present invention, the receive coil is a component of a receive circuit assembly, the receive circuit assembly including a disk at a distal end of the receive coil, wherein the disk includes a ferromagnetic material. In embodiments of the present invention, the receive coil assembly further includes a printed circuit board, the printed circuit board being separated from the distal end of the receive coil by the disk.

In a standard systems for transmitting information using electromagnetic waves it would be conventional to design the system such that both the transmit and receive circuits were optimized around the carrier frequency, that is that the transmitter would have its highest output at the carrier frequency and the receive circuit would have its most efficient reception at the carrier frequency (e.g. the receive coil or antenna would be optimized to pass signals at the carrier frequency with the least loss). In such a system it would be conventional to tune the transmitter (Tx) and receiver (Rx) resonance, to maximize power transfer. For example, you would tune both circuits to have a maximum Q with the pass band for both the Tx and Rx centered around the carrier frequency. Resonance generally occurs at (Where L is inductance and C is capacitance):

$$f_0 = \frac{w_0}{2\pi} = \frac{1}{2\pi\sqrt{LC}}.$$

Where AM modulation is used, such as in inductively coupled systems according to the present invention, that standard tuning may result in Intermodulation Distortion and/or harmonic distortion. Intermodulation Distortion (IMD) may be defined as the ratio (in dB) between the power of fundamental tones and third-order distortion products which may, under certain circumstances be audible to a listener, for example, a hearing aid user. In a system such as a contact hearing, system IMD may manifest itself as distortion of words and letters which incorporate higher frequency tones (e.g. "S" and "T" sounds). This is a particular problem in such systems because contact hearing systems transmit and deliver those sounds directly to the tympanic membrane through mechanical manipulation of the tympanic membrane, unlike conventional hearing aids.

In embodiments of the present invention, it may be possible to reduce or eliminate such intermodulation distortion by tuning the receive coil to center the passband at a frequency above the frequency of the carrier. In embodiments of the invention, the center of the receive passband may be tuned to approximately 137 KHz above the carrier frequency. In embodiments of the invention, the center of the bandpass may be tuned to approximately 322 KHz above the carrier frequency. Thus, by tuning the Rx circuit in a manner which would be expected to result in lower efficiency (power transfer), the present invention reduces or eliminates intermodulation distortion. In embodiments of the invention, the Rx circuit is tuned such that the new center of the passband is above the carrier frequency while the transmit (Tx) circuit is tuned such that the center of the passband for the transmit (Tx) circuit is below the transmit frequency.

FIG. 52 is a graph showing passband tuning according to the present invention for a transmit circuit and a receive circuit according to the present invention. In FIG. 52 a transmit circuit is tuned such that the center of its passband is at the system carrier frequency (e.g. 2.560 MHz), while the receive passband is tuned such that the center of its passband is at a second, higher, frequency (e.g. 2.852). Further, as illustrated in FIG. 52 the transmit circuit is tuned to have a higher Q than the receive band. In embodiments of the invention, the transmit and received circuits are tuned to have an offset between the center of the transmit passband and the center of the receive passband in order to improve intermodulation distortion. In embodiments of the invention, the transmit and received circuits are tuned to have an offset between the center of the transmit passband and the center of the receive passband in order to improve power transmission from the transmitter to the receiver. In embodiments of the invention, the transmit and received circuits are tuned to have an offset between the center of the transmit passband and the center of the receive passband in order to increase output power at the contact hearing device. In embodiments of the invention, the center frequencies of the receive passband may be lower than the center frequency of the transmit passband.

In embodiments of the invention the relationship between the transmit passband and the receive passband may be such that a signal at a frequency which is at the center of the transmit passband (e.g. a carrier signal) would be attenuated by between approximately 10 dB and 15 dB if it were passed through a filter having the characteristics of the receive passband. In embodiments of the invention the relationship between the transmit passband and the receive passband may be such that a signal at a frequency which is at the center of the receive passband would be attenuated by between approximately 20 dB and 25 dB if it were passed through a filter having the characteristics of the receive passband.

In embodiments of the invention, the present invention is directed to a contact hearing system including: a transmit circuit including a transmit coil positioned in an ear tip, THE transmit circuit having a first bandpass characteristic, wherein the transmit circuit is tuned such that a center of the first bandpass characteristic is set at a first frequency; and a receive circuit including a receive coil positioned on a contact hearing device, the receive circuit having a second bandpass characteristic, wherein the receive circuit is tuned such that a center of the second bandpass characteristic differs from the center of the first bandpass characteristic. In embodiments of the invention, the transmit circuit is tuned such that the center of the first bandpass characteristic is a transmit carrier frequency. In embodiments of the invention, the transmit carrier frequency is approximately 2.56 MHz. In embodiments of the invention, the receive circuit is tuned such that the center of the second bandpass characteristic is tuned to a frequency which is higher than the first frequency. In embodiments of the invention, the receive circuit is tuned such that the center of the second bandpass characteristic is tuned to a frequency above a transmit carrier frequency. In embodiments of the invention, the receive circuit is tuned such that the center of the second bandpass characteristic is tuned to approximately 2.852 MHz. In embodiments of the invention, the receive circuit is tuned such that the center of the second bandpass characteristic is tuned to a frequency within 5 percent of the carrier frequency. In embodiments of the invention, the receive circuit is tuned such that the center of the second bandpass characteristic is tuned to a frequency within 10 percent of the carrier frequency. In embodiments of the invention, the receive circuit is tuned such that the center of the second bandpass characteristic is tuned to a frequency which is within the bandpass characteristics of the transmit circuit.

In embodiments of the invention, the present invention is directed to a contact hearing system including: a transmit circuit including a transmit coil positioned in an ear tip, the transmit circuit having a first passband, wherein the transmit circuit is tuned such that a center of the first passband is set at a first frequency; and a receive circuit including a receive coil positioned on a contact hearing device, the receive circuit having a second passband, wherein the receive circuit is tuned such that a center of the second passband differs from the center of the first passband.

In embodiments of the invention, the present invention is directed to a contact hearing system including: a transmit circuit including a transmit coil positioned in an ear tip, the transmit circuit having a first bandpass characteristic, wherein the transmit circuit is tuned such that a center of the first bandpass characteristic is set at a first frequency; a receive circuit including a receive coil positioned on a contact hearing device, the receive circuit having a second bandpass characteristic, wherein the receive circuit is tuned such that a center of the second bandpass characteristic differs from the center of the first bandpass characteristic; and wherein the receive circuit is tuned such that the center of the second bandpass characteristic is tuned to a frequency which is lower than the first frequency. In embodiments of the invention the receive circuit is tuned such that the center of the second bandpass characteristic is tuned to a frequency below a transmit carrier frequency. In embodiments of the invention the receive circuit is tuned such that the center of the second bandpass characteristic is tuned to a frequency within 5 percent of the carrier frequency. In embodiments of the invention, the receive circuit is tuned such that the center of the second bandpass characteristic is tuned to a frequency within 10 percent of the carrier frequency. In embodiments of the invention, the receive circuit is tuned such that the center of the second bandpass characteristic is tuned to a frequency which is within the bandpass characteristics of the transmit circuit.

In embodiments of the invention, the present invention is directed to a method of tuning a transmit circuit and a receive circuit, wherein the transmit and receive circuit form components of a contact hearing system, the transmit circuit having a bandpass characteristic and the receive circuit having a bandpass characteristic, the method including the steps of: tuning the bandpass characteristics of the transmit circuit such that a center of the transmit bandpass characteristic is set to a first frequency; and tuning the bandpass characteristics of the receive circuit such that a center of the receive bandpass characteristic is set to a second frequency, the second frequency differing from the first frequency. In embodiments of the invention, second frequency it higher than the first frequency. In embodiments of the invention, the first frequency is the transmit carrier frequency. In embodiments of the invention, the first frequency is approximately 2.56 MHz. In embodiments of the invention, the transmit circuit includes a transmit coil wound on a ferrite core, the transmit coil and ferrite core being positioned in an ear tip. In embodiments of the invention, the receive circuit includes a receive coil positioned on a contact hearing device. In embodiments of the invention, the transmit circuit and the receive circuit are adapted to be positioned in the ear canal of a user. In embodiments of the invention, the first frequency is selected to be less than 10% lower than the second frequency. In embodiments of the invention, the first frequency is selected to be less than 5 percent lower than the first frequency. In embodiments of the invention, the second frequency is within the bandpass characteristics of the transmit circuit. In embodiments of the invention, the second frequency is selected such that, if passed through a filter having the bandpass characteristics of the transmit circuit it would be attenuated by less than six decibels. In embodiments of the invention, the second frequency is selected such that, if passed through a filter having the bandpass characteristics of the receive circuit it would be attenuated by less than three decibels.

In embodiments of the invention the present invention is directed to a method of tuning a transmit circuit and a receive circuit, wherein the transmit and receive circuit form components of a contact hearing system, the transmit circuit having a passband and the receive circuit having a passband, the method including the steps of: tuning the passband of the transmit circuit such that a center of passband of the transmit circuit is set to a first frequency; and tuning the bandpass characteristics of the receive circuit such that a center of the passband of the receive circuit is set to a second frequency, the second frequency differing from the first frequency.

In embodiments of the invention, the present invention is directed to a method of tuning a transmit circuit and a receive circuit, wherein the transmit and receive circuit form components of a contact hearing system, the transmit circuit having a bandpass characteristic and the receive circuit having a bandpass characteristic, the method including the steps of: tuning the bandpass characteristics of the transmit circuit such that the center of the bandpass is set to a first frequency; and tuning the bandpass characteristics of the receive circuit such that the center of the bandpass is set to a second frequency, the second frequency differing from the first frequency wherein the second frequency is lower than the first frequency. In embodiments of the invention, the first frequency is a transmit carrier frequency. In embodiments of the invention, the transmit circuit includes a transmit coil wound on a ferrite core, the transmit coil and ferrite core being positioned in an ear tip. In embodiments of the invention, the receive circuit includes a receive coil positioned on a contact hearing device. In embodiments of the invention, the transmit circuit and the receive circuit are adapted to be positioned in an ear canal of a user. In embodiments of the invention, the first frequency is selected to be less than 10% lower than the second frequency. In embodiments of the invention, the first frequency is selected to be less than 5 percent lower than the first frequency. In embodiments of the invention, the second frequency is within the bandpass characteristics of the transmit circuit. In embodiments of the invention, the second frequency is selected such that, if passed through a filter having the bandpass characteristics of the transmit circuit it would be attenuated by less than six decibels. In embodiments of the invention, the second frequency is selected such that, if passed through a filter having the bandpass characteristics of the transmit circuit it would be attenuated by less than three decibels. In embodiments of the invention, the second frequency is selected such that, if passed through a filter having the bandpass characteristics of the transmit circuit it would be attenuated by between 20 and 25 decibels. In embodiments of the invention, the first frequency is within the bandpass characteristics of the receive circuit. In embodiments of the invention, the first frequency is selected such that, if passed through a filter having the bandpass characteristics of the receive circuit it would be attenuated by between 10 and 15 decibels. In embodiments of the invention: the second frequency is selected such that, if passed through a filter having the bandpass characteristics of the transmit circuit it would be attenuated by between 20 and 25 decibels; and the first frequency is selected such that, if passed through a filter having the bandpass characteristics of the receive circuit it would be attenuated by between 10 and 15 decibels.

In embodiments of the invention, signals may be transmitted between the ear tip and the contact hearing device using an amplitude modulated oscillating magnetic field with a 2.5 MHz carrier frequency. In embodiments of the invention, the digital audio signal generated by the audio processor may be mixed with a carrier at the desired coupling frequency. In embodiments of the invention, the coupling circuit including the transmit coil subsystem and the receive coil subsystem may act as a band pass filter and the resulting waveform is an AM modulated signal which may be detected by the diode circuit connected to the receive coil. In embodiments of the invention, driver circuit may be a type D (H Bridge) and the mixing may be accomplished using an AND or a NAND gate with the carrier and the delta sigma digital modulation signal (the output of the delta sigma modulator, which may be a digital stream representative of an audio signal). In embodiments of the invention, the two legs of the H Bridge may be driven 180 degrees out of phase. In embodiments of the invention, the second leg may be driven by just the inverted (with respect to the other leg) carrier signal, allowing independent control of an additional carrier signal. This additional carrier may be used to overcome distortion caused by the non-linear current-voltage relationship of the diodes near the forward voltage $V_f$ without sacrificing the dynamic range of the delta sigma modulator. The carrier leg voltage source can be independently controlled to adjust the amount of additional carrier inserted. In embodiments of the invention, the modulation may be FM or Frequency Modulation.

Figure 28:
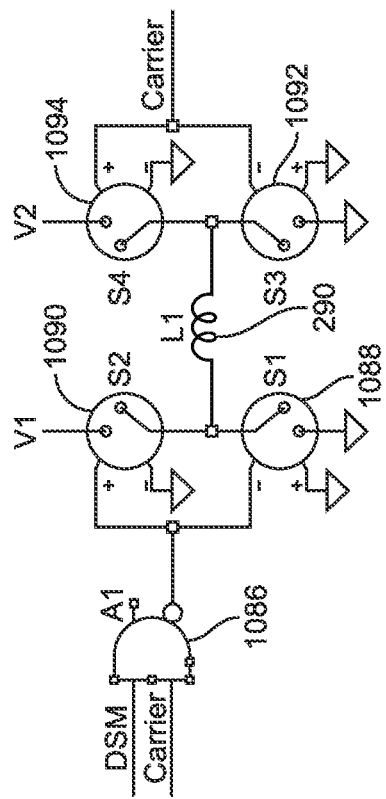
FIG. 28 is an illustration of a circuit wherein the DSM input is the delta-Sigma modulator output signal used to modulate a carrier signal.
Figure 49:
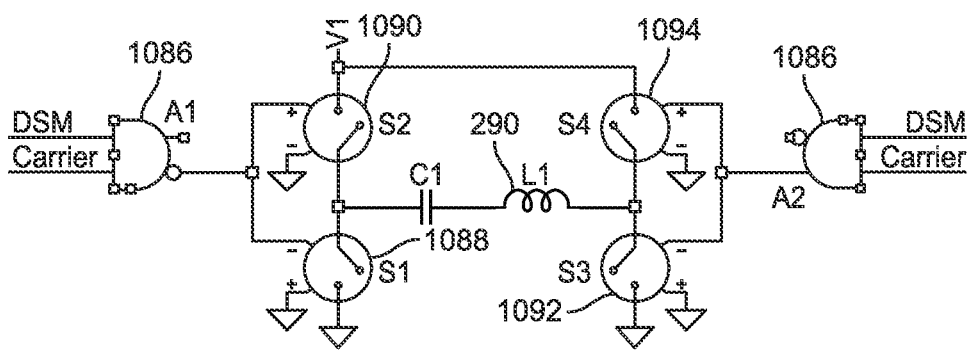
FIG. 49 is an illustration of a circuit wherein the DSM input is the delta-Sigma modulator output signal used to modulate a carrier signal.
Figure 50:
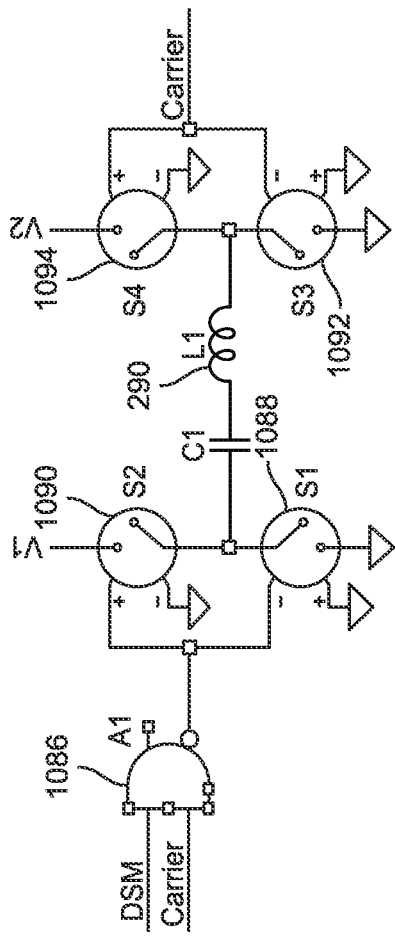
FIG. 50 is an illustration of a circuit wherein the DSM input is the delta-Sigma modulator output signal used to modulate a carrier signal.

FIGS. 28, 49, and 50 are illustrations of a circuit that uses a delta sigma modulator (DSM) signal input to modulate a carrier signal in a standard H-Bridge configuration. In embodiments of the invention each side is driven 180 degrees out of phase with respect to each other. In FIGS. 28, 49, and 50, the H-Bridge circuit may comprise one or more AND/NAND circuits 1086, in combination with switches 1088, 1090, 1092 and 1094. The output of the H-Bridge may be supplied to transmit coil 290 to provide an AM signal field which may transmitted to a receive coil 130 by, for example, inductively coupling the output of transmit coil 290 to receive coil 130. In embodiments of the invention, illustrated in FIGS. 49 and 50, one side of the H-Bridge may be coupled to transmit coil 290 through a capacitor C1. Modulation is accomplished using the multiplicative property of the AND/NAND function. FIGS. 28, 49, and 50 are illustrations of a circuit according to the present invention wherein the DSM input is the delta sigma digital modulation signal. In embodiments of the invention, the output of the delta-sigma modulator is a signal representative of the sound received by the processor which is to be transmitted to the contact hearing device by amplitude modulation (AM) of the carrier. In FIGS. 28, 49, and 50, the carrier may be a clock signal. In FIGS. 28, 49, and 50, the carrier clock signal may be twice the DSM rate. FIGS. 28, 49, and 50, the carrier may be a digital clock signal representative of the carrier frequency, for example, 2.5 MHz. In embodiments of the invention, switches $S_1$-$S_4$ may be solid state/digital switches, such as, FET transistors. In embodiments of the invention, $S_1$-$S_4$ may form an H Bridge input to a resonant circuit (capacitor C1 and inductor L1). In embodiments of the invention, the AM output signal may be formed by filtering the differential digital signal using a resonator. L1 may be the transmit coil 290. In the embodiment of the invention illustrated in FIGS. 28 and 50, the input to a first side of the H Bridge is the NAND output of the AND/NAND gate circuit which has as its inputs the DSM signal and the Carrier signal. In the embodiment of the invention illustrated in FIG. 49, the input to a first side of the H Bridge is the NAND output of the AND/NAND gate circuit which has as its inputs the DSM signal and the Carrier signal while the input to a second side of the H Bridge is the AND output of the AND/NAND gate circuit which has as its inputs the DSM signal and the Carrier signal. In embodiments of the invention, V1 supply voltage controls the amount of modulated signal power transmitted. In embodiments of the invention, V2 supply controls the additional carrier power. In embodiments of the invention, the AND/NAND gate(s) serves as the mixer, multiplying the modulation signal and the carrier, creating an AM modulation of the carrier.

Figure 29:
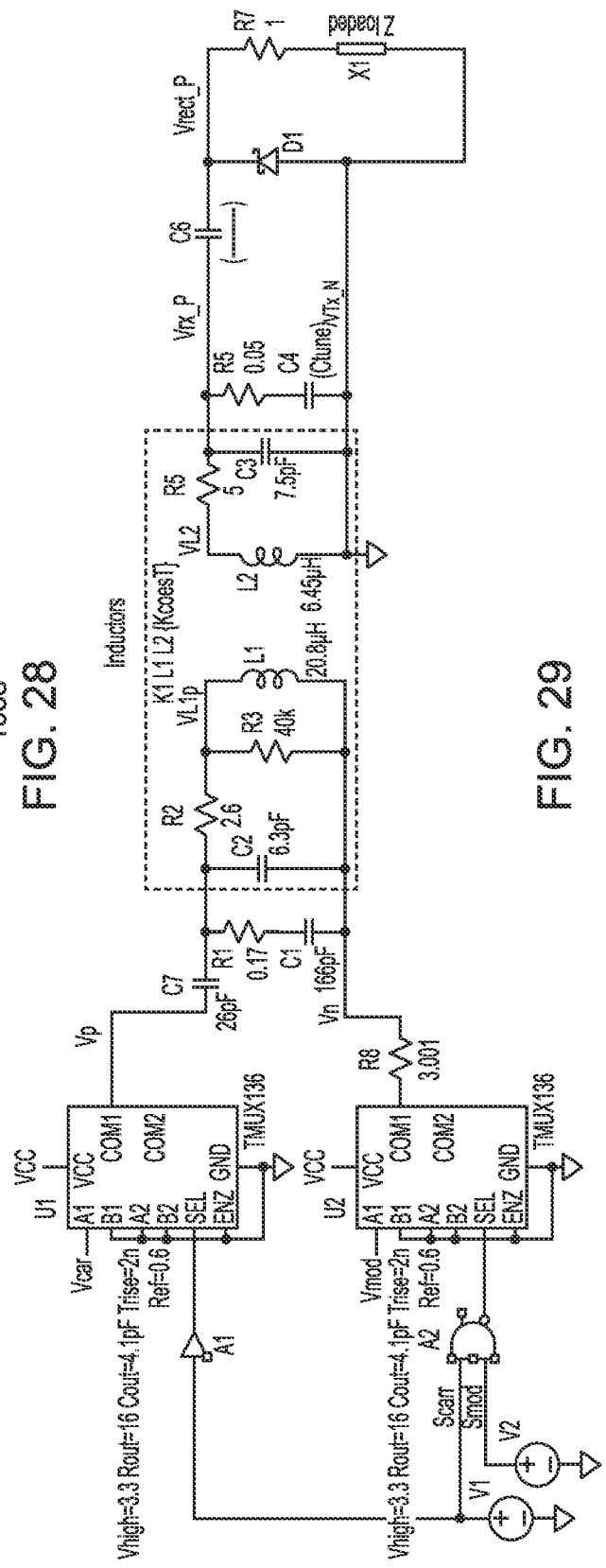
FIG. 29 is a system model of a system according to the present invention, including transmission and receive tank circuits and a detector circuit.
Figure 51:
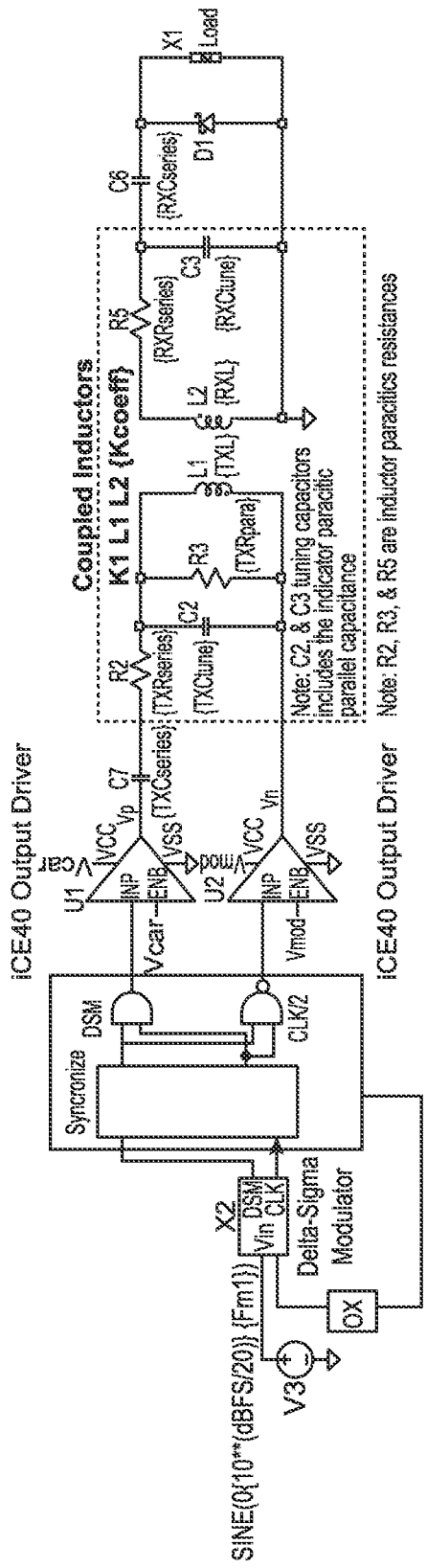
FIG. 51 is a system model of a system according to the present invention, including transmission and receive tank circuits and a detector circuit.

FIGS. 29 and 51 are system models of a system according to the present invention, including transmission and receive tank circuits and a detector circuit. In embodiments of the invention, key components (e.g. the AND and NAND function along with the synchronization of the Pulse Density Modulation (PDM) with the clock) may be implemented using a Field Programmable Gate Array (FPGA). Further, the low capacitance FPGA output driver (for example, an iCE40 Output Driver from Lattice Semiconductor) may be used to create the H-Bridge. In embodiments of the invention time skews and clock jitter can be kept at a minimum by re-clocking the outputs after the logic and just prior to the output driver. In embodiments of the invention, the circuit illustrated in FIGS. 29 and 51 may include discrete components to model the parasitic elements in the primary component. For example R2, R3 and C2 may be the parasitic resistance and capacitance in L1.

Figure 30:
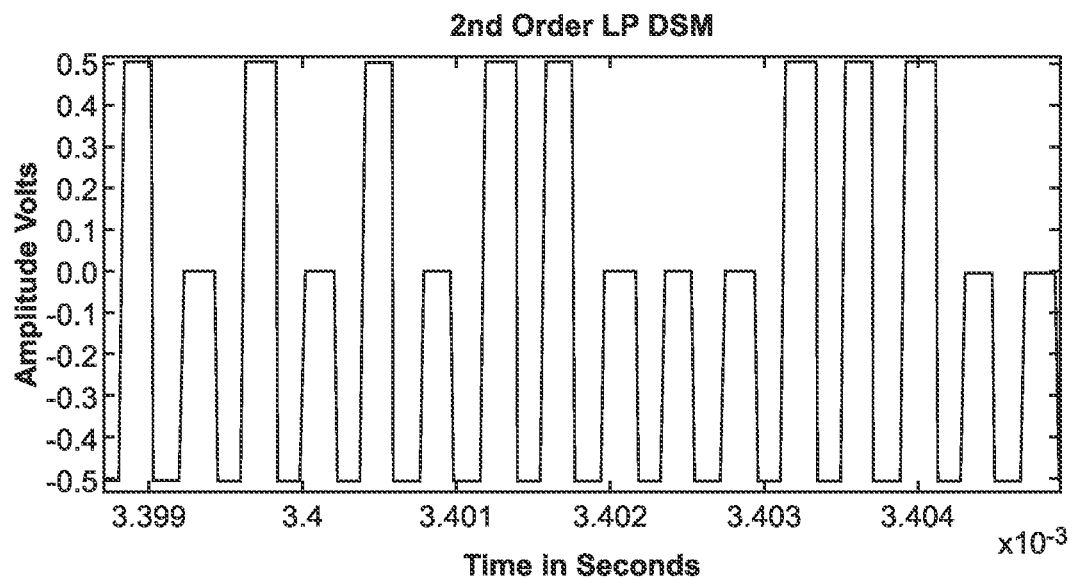
FIG. 30 illustrates the time domain waveform when the added carrier clock is the same size as the delta sigma signal mixed with the carrier clock.

FIG. 30 illustrates the time domain waveform when the added carrier clock is the same size as the delta sigma signal mixed with the carrier clock.

Figure 31:
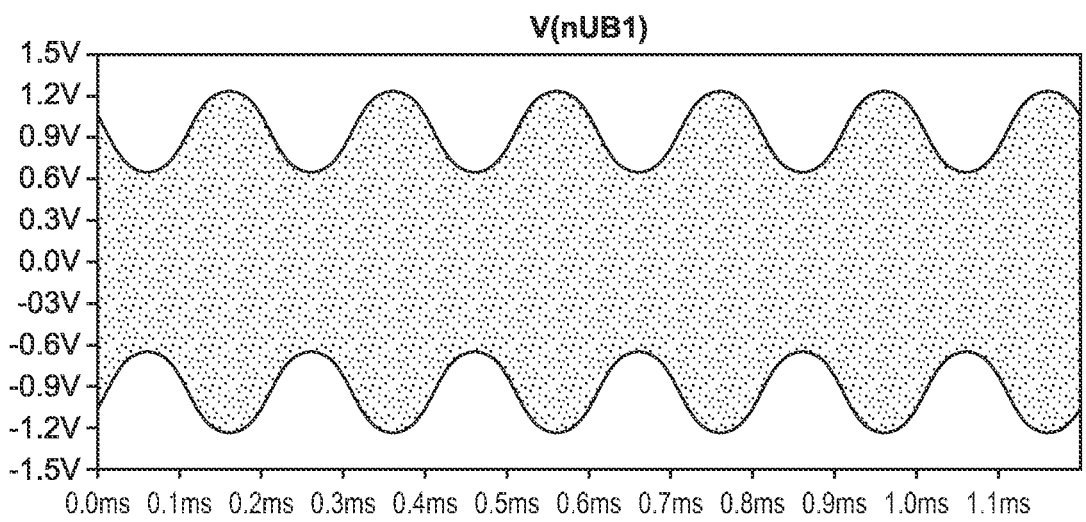
FIG. 31 illustrates the resulting waveform with a 95% delta sigma with the added clock.

FIG. 31 illustrates the resulting waveform with a 95% delta sigma with the added clock. Note that this is an AM signal with a modulation index of less than 50%. The embodiment illustrated in FIG. 31 may result in a lower distortion when using a simple diode detector while leaving the full dynamic range of the delta sigma modulator.

Several alternative methods of generating additional carrier exist. In embodiments of the invention, the signal could be generated using conventional analog means (mixer) then sum in additional carrier. In embodiments of the invention, the signal may be generated by digitally generating the desired waveform (including the added carrier) then using a high speed DAC (Digital to Analog converter). In embodiments of the invention, the mixing could also be performed by modulating the supply voltage to the H Bridge. In embodiments of the invention, this method could also be used to make a very simple cost effective AM modulator and by reversing the phase of the added carrier, suppressing the carrier double sideband suppressed carrier DSBSC. For standard AM the second leg of the H Bridge would be inverted from the first.

In one embodiment, the present invention is directed to a contact hearing system including: an ear tip including a transmit coil, wherein the transmit coil is connected to an audio processor, including an H Bridge circuit; a first input to the H Bridge circuit including an AND circuit wherein a first input to the AND circuit includes a carrier signal and a second input to the AND circuit includes an output of a delta sigma modulation circuit, wherein the delta sigma modulation circuit is a component of the audio processor; and a second input to the H Bridge circuit including an NAND circuit wherein a first input to the NAND circuit includes a carrier signal and a second input to the NAND circuit includes an output of the delta sigma modulation circuit. In embodiments of the invention, an output of a first side of the H Bridge circuit is connected to a first side of the transmit coil and an output of a second side of the H Bridge circuit is connected to a second side of the transmit coil. In embodiments of the invention, a capacitor is connected between at least one output of the H Bridge circuit and the transmit coil. In embodiments of the invention, the transmit coil is inductively coupled to a receive coil. In embodiments of the invention, the receive coil is positioned on a contact hearing device. In embodiments of the invention, the contact hearing device includes a diode detector connected to an output of the receive coil.

In one embodiment, the present invention is directed to a method of transmitting signals between a transmitter and receiver in an inductively coupled contact hearing system, the method including the steps of: mixing an output of a delta sigma modulation circuit with a carrier signal using an AND gate; providing an output of the AND gate to a first input of an H Bridge circuit; mixing the output of the delta sigma modulation circuit with the carrier signal using an NAND gate; providing an output of the NAND gate to a second input of the H Bridge circuit; providing an output of a first side of the H Bridge circuit to a first side of a transmit coil; and providing an output of a second side of the H Bridge circuit to a second side of the transmit coil. In embodiments of a method according to the present invention the method further including the steps of: receiving a signal generated by the transmit coil at a receive coil; passing the received signal through a diode detector. In embodiments of a method according to the present invention, the method further includes the step of: passing the output of the diode detector to a balanced armature transducer. In embodiments of the invention the carrier is AM modulated. In embodiments of the invention, the diode detector demodulates the AM modulated carrier.

In one embodiment, the present invention is directed to a contact hearing system including: an ear tip including a transmit coil, wherein the transmit coil is connected to an audio processor, including an H Bridge circuit, wherein the transmit coil is connected to the output of the H Bridge circuit; a first input to the H Bridge circuit including an AND circuit wherein a first input to the AND circuit includes a carrier signal and a second input to the AND circuit includes an output of a delta sigma modulation circuit, wherein the delta sigma modulation circuit is a component of the audio processor; and a second input to the H Bridge circuit including the carrier signal. In embodiments of the invention, the second input is an inverted carrier signal. In embodiments of the invention, the transmit coil is inductively coupled to a receive coil. In embodiments of the invention, the receive coil is positioned on a contact hearing device. In embodiments of the invention, the contact hearing device includes a diode detector connected to an output of the receive coil.

In one embodiment, the present invention is directed to a method of transmitting signals between a transmitter and receiver in an inductively coupled contact hearing system, the method including the steps of: mixing the output of a delta sigma modulation circuit with a carrier signal using an AND gate; providing an output of the AND gate to a first input of an H Bridge circuit; providing a carrier signal to a second input of an H Bridge circuit; providing an output of a first side of the H Bridge circuit to a first side of a transmit coil; and providing an output of a second side of the H Bridge circuit to a second side of a transmit coil. In a method according to the present invention, the method further includes the steps of: receiving a signal generated by the transmit coil at a receive coil; passing the received signal through a diode detector. In a method according to the present invention, the method further includes the steps of: passing an output of the diode detector to a balanced armature transducer. In embodiments of the invention, the carrier is AM modulated. In embodiments of the invention, the diode detector demodulates the AM modulated carrier signal.

Figure 36:
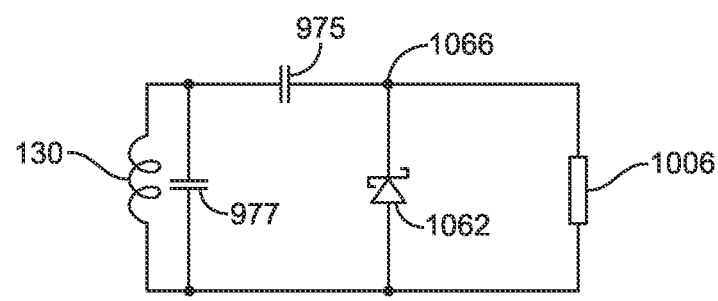
FIG. 36 illustrates a receiver according to the present invention wherein a Villard circuit is used to demodulate the received signal.

As described earlier, a Villard, 1-diode demodulator, such as, for example the circuit illustrated in FIG. 36 may be used as a demodulator circuit in embodiments of the present invention. In the circuit illustrated in FIG. 36, receive coil 130 has an inductance L-Rx, which forms a tank resonator when used in combination with resonance capacitor 977, having a tuning capacitance C-tune, which may be modified by the combined capacitances of the remaining circuit components, including AC filter capacitor 975 (which may be a series capacitor), Schottky diode 1062 and load 1006 (which may be, for example, a microactuator). In embodiments of the invention, resonance capacitor 977 may have a capacitance C-tune which is composed of 3 0201-size capacitors that are chosen to make the tank circuit resonate near or at the carrier frequency of approximately 2.5 MHz. In embodiments of the invention the carrier frequency may be approximately 2.560 MHz. C-tune, in combination with the other components and, in particular, the Villard 1-diode demodulator may be chosen to provide a high output while minimizing intermodulation distortion (IMD).

In the embodiment of the invention, illustrated in FIG. 36, a signal received by contact hearing device 112 and, on a negative half cycle of the carrier voltage, charge enters motor node 1066 through first diode 1062, which may be, for example, a Schottky diode. On the subsequent positive half-cycle of the carrier, AC filter capacitor 975 and first diode 1062 holds this charge on motor node 1066 while displacement current travels through AC filter capacitor 975 into motor node 1066. This sequence results in a voltage doubling at motor node 1066 on each carrier cycle. While acting as an efficient demodulator, a Villard circuit of the kind described may result in large voltage peaks at motor node 1066, which large peaks may result in distortion, such as intermodulation distortion.

Figure 37:
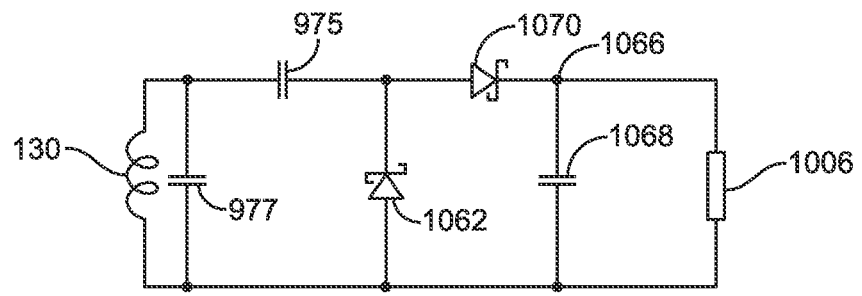
FIG. 37 illustrates a receiver according to the present invention wherein a Greinacher circuit is used to demodulate the received signal.
Figure 47:
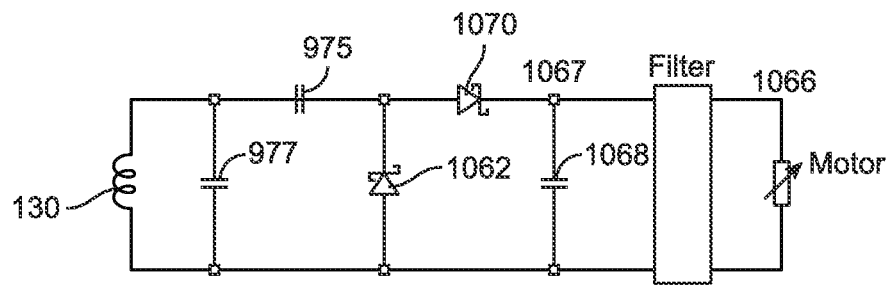
FIG. 47 illustrates a receiver according to the present invention wherein a Greinacher circuit is used to demodulate the received signal.
Figure 48:
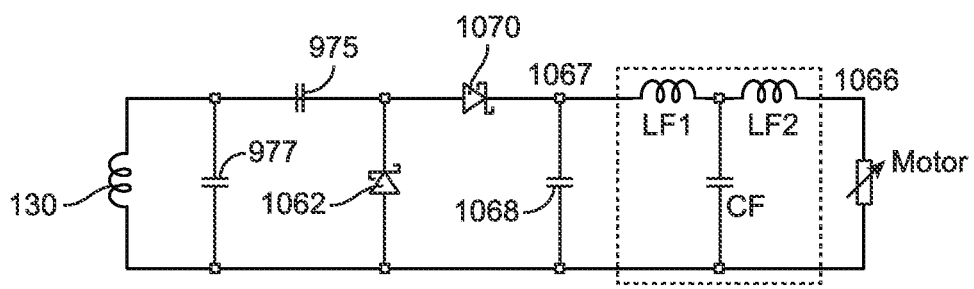
FIG. 48 illustrates a receiver according to the present invention wherein a Greinacher circuit is used to demodulate the received signal.

In the embodiment of the invention, illustrated in FIGS. 37, 47 and 48 a Greinacher circuit may be used to demodulate a signal received by contact hearing device 112. In embodiments of the invention, the Greinacher circuit may be a Villard circuit followed by a peak detector, wherein the peak detector may comprise a second diode 1070 (which may in some embodiments of the invention, be a Schottky diode) and a smoothing capacitor 1068. The extra diode and capacitor act to smooth out the sharp voltage peaks on the Villard output. In a contact hearing device according to the present invention, smoothing capacitor 1068 may be used to present a more consistent output to load 1006. In embodiments of the invention, smoothing capacitor 1068 may form a tank circuit with load 1006 wherein the presence of the tank circuit boosts the output of contact hearing device at frequencies around 10 kHz. In embodiments of the invention, smoothing capacitor 1068 may form a tank circuit with load 1006 wherein the presence of the tank circuit boosts the output of contact hearing device at the high end of the range of frequencies of interest (e.g. around 10 kHz). In embodiments of the invention, smoothing capacitor 1068 may form a tank circuit with load 1006 wherein the presence of the tank circuit boosts the output of contact hearing device at frequencies around 10 kHz, thereby ensuring that the output of contact hearing device 112 is substantially level across the range of frequencies of interest (e.g. from 100 Hz to 10,000 Hz) and does not fall off as the frequency approaches the higher end of the band. In embodiments of the invention, the circuit illustrated in FIG. 37 may be used to both minimize intermodulation distortion and maintain the output of contact hearing device 112 up to a frequency of approximately 10,000 Hz. In the embodiment of FIG. 47, the Greinacher (2-diode) circuit includes an output filter. In the embodiment of FIG. 48, the Greinacher (2-diode) circuit includes an LC output filter.

FIGS. 47 and 48 are illustrations of circuits used to implement a Greinacher demodulator with filter according to the present invention. In embodiments of the invention, the filter is intended to prevent (reduce) the carrier RF reaching the load (motor). In embodiments of the invention, the filter implementation is preferably low-pass, allowing the audio signals to pass with minimal attenuation up to 10 kHz while reducing/blocking the RF at 2.56 MHz or any carrier frequency. In embodiments of the invention, intermodulation distortion (IMD) is improved (around 5 dB) with two types of low-pass filters in this position. In embodiments of the invention, IMD may be improved by the addition of a filter to the Greinacher demodulator. In embodiments of the invention, the presence of the filter may reduce the amount of RF voltage on diode output node 1067 which reaching motor node 1066, which will reduce the reflected RF from the motor from reaching the diodes (especially D2 at diode output node 1067) and mixing with the original signal. Mixing of signals in the diode, because of the non-linear I-V curve, results in distortion and may be the main contribution to IMD.

In embodiments of the invention, Villard (single diode) demodulation circuits may be used to increase the efficiency of the contact hearing device as they use a single diode which is only turned on for one half cycle. Unfortunately, Villard demodulation circuits produce larger spikes as they also act as voltage doublers. In demodulation circuits of this kind, the number of diodes in the circuit dictates its efficiency (in part) as the power needed to turn on a diode is not usable in signal transfer and is, therefore, lost. Greinacher (two diode) demodulation circuits have advantages over Villard demodulation circuits because the second diode of the Greinacher circuit in combination with smoothing capacitor 1068 smooths out the voltage and current spikes of the Villard, thus ensuring a smother demodulated signal and potentially reducing distortion. In addition, the Greinacher circuit is beneficial because it smooths out the response of the system across the frequency band of interest (in this case between approximately 100 Hz and 10,000 Hz such that the output of the demodulator is substantially the same across that range.

In embodiments of the invention, the present invention is directed to a contact hearing system including: a transmit coil positioned in an ear tip wherein the transmit coil includes an electrical coil wound on a ferrite core; a receive coil positioned on a contact hearing device wherein the receive coil includes an electrical coil without a core; a load connected to the receive coil; and a demodulation circuit connected to the receive coil and the load wherein the demodulation circuit includes a voltage doubler and a peak detector. In embodiments of the invention, the demodulation circuit is connected to the load at a motor node. In embodiments of the invention, a tuning capacitor is connected across the receive coil. In embodiments of the invention, the voltage doubler includes a series capacitor connected to a first diode. In embodiments of the invention, the series capacitor is connected between a first side of the receive coil and a cathode of the first diode. In embodiments of the invention, the cathode of the first diode is connected to a second side of the receive coil. In embodiments of the invention, the peak detector is connected between an output of the voltage doubler and the load. In embodiments of the invention, the peak detector includes a second diode and a smoothing capacitor. In embodiments of the invention, an anode of the second diode is connected to the voltage doubler. In embodiments of the invention, a cathode of the first diode is connected to an anode of the second diode. In embodiments of the invention, a cathode of the second diode is connected to a first side of the smoothing capacitor. In embodiments of the invention, the cathode of the second diode and the first side of the smoothing capacitor is connected to a first side of the load. In embodiments of the invention, a second side of the load is connected to a second side of the smoothing capacitor. In embodiments of the invention, the first diode is a Schottky diode. In embodiments of the invention, the second diode is a Schottky diode. In embodiments of the invention, the load is a microactuator. In embodiments of the invention, the load is a balanced armature microactuator.

FIG. 38 is a side view of a transmit coil for use in an ear tip according to the present invention. FIG. 39 is a top view of a transmit coil for use in an ear tip according to the present invention. FIG. 40 is a side perspective view of a transmit coil for use in an ear tip according to the present invention. In the embodiments of the invention, illustrated in FIGS. 38-40, transmit coil 290 includes coil winding 316 which is wrapped around ferrite core 318, which, in the embodiments of FIGS. 38-40 may be a solid core with no acoustic vent. Transmit coil 290 may further include transmit electronics 342.

Figure 42:
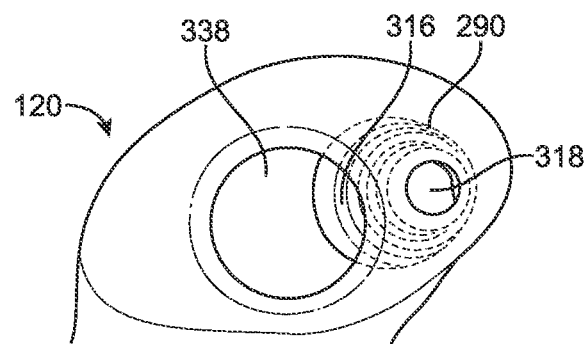
FIG. 42 is an end view of an ear tip according to the present invention.
Figure 43:
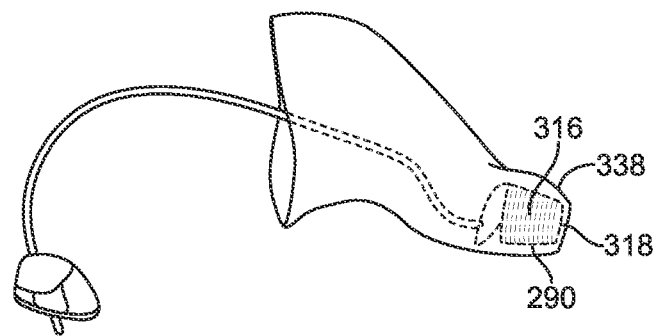
FIG. 43 is a side view of an ear tip assembly according to the present invention.

FIG. 41 is an end view of an ear tip according to the present invention. FIG. 42 is an end view of an ear tip according to the present invention. FIG. 43 is a side view of an ear tip assembly according to the present invention. In the embodiments of the invention, illustrated in FIGS. 41-43, ear tip 120 includes transmit coil 290 and acoustic vent 338.

Transmit coil 290 may include coil winding 316 and ferrite core 316. In embodiments of the invention, ferrite core 316 may be constructed of a ferrite material or of any magnetic material. In embodiments of the invention, a distal end of ferrite core 316 may extend beyond a distal end of coil winding 316.

In embodiments of the invention described and claimed herein the text may refer to a "medial" or a "lateral" end or side of a device or component. In embodiments of the invention described and claimed herein, the text may refer to a "distal" or a "proximal" end or side of a device or component. In embodiments of the invention, "medial" and "distal" may refer to the side or end of the device or component which is farthest from the outside of the user's body (e.g. at the end of the ear canal where the tympanic membrane is found. In embodiments of the invention, "lateral" and "proximal" may refer to the side or end of the device or component which is closest to the outside of the user's body (e.g. at the open end of the ear canal where the pinna is found).

While the preferred embodiments of the devices and methods have been described in reference to the environment in which they were developed, they are merely illustrative of the principles of the present inventive concepts. Modification or combinations of the above-described assemblies, other embodiments, configurations, and methods for carrying out the invention, and variations of aspects of the invention that are obvious to those of skill in the art are intended to be within the scope of the claims. In addition, where this application has listed the steps of a method or procedure in a specific order, it may be possible, or even expedient in certain circumstances, to change the order in which some steps are performed, and it is intended that the particular steps of the method or procedure claim set forth herebelow not be construed as being order-specific unless such order specificity is expressly stated in the claim.

Definitions

Audio Processor—A system for receiving and processing audio signals. In embodiments of the invention, audio processors may include one or more microphones adapted to receive audio which reaches the user's ear. In embodiments of the invention, the audio processor may include one or more components for processing the received sound. In embodiments of the invention, the audio processor may include digital signal processing electronics and software which are adapted to process the received sound. In embodiments of the invention, processing of the received sound may include amplification of the received sound. In embodiments of the invention, the output of the audio processor may be a signal suitable for driving an inductive coil located in an ear tip. Audio processors may also be referred to as behind the ear units or BTEs.

Contact Hearing System—A system including a contact hearing device, an ear tip and an audio processor. In embodiments of the invention, contact hearing systems may also include an external communication device. In embodiments of the invention, power and/or data may be transmitted between an ear tip and a contact hearing device using inductive coupling.

Contact Hearing Device—A tiny actuator connected to a customized ring-shaped support platform that floats on the ear canal around the eardrum, where the actuator directly vibrates the eardrum causing energy to be transmitted through the middle and inner ears to stimulate the brain and produce the perception of sound. In embodiments of the invention, the contact hearing device may comprise a coil, a microactuator connected to the coil and a support structure supporting the coil and microactuator. The contact hearing device may also be referred to as a Tympanic Contact Actuator (TCA), a Tympanic Lens or a Tympanic Membrane Transducer (TMT).

Ear Tip—A structure designed to be placed into and reside in the ear canal of a user, where the structure is adapted to receive signals from an audio processor and transmit signals to the user's tympanic membrane or to a device positioned on or near the user's tympanic membrane (such as, for example, a contact hearing device). In embodiments of the invention, the signal may be transmitted using inductive coupling, using, for example, a coil connected to the Ear Tip.

Inductively Driven Hearing Aid System—a contact hearing system wherein signals are transmitted from an ear tip to a contact hearing device using inductive coupling. In an inductively driven hearing system, magnetic waves may be used to transmit information, power or both information and power from the ear tip to the contact hearing device.

Mag Tip—an ear tip adapted for use in an inductively driven hearing aid system. In embodiments of the invention, the mag tip may include an inductive transmit coil.

| REFERENCE NUMBERS | |
|---|---|
| Number | Element |
| 110 | Contact Hearing System |
| 112 | Contact Hearing Device |
| 114 | Grasping Tab |
| 116 | Demodulator |
| 118 | Sulcus Platform |
| 120 | Ear Tip/Mag Tip |
| 122 | Adhesive |
| 124 | Drive Post |
| 126 | Oil Layer |
| 128 | Charging Status LEDs |
| 130 | Receive coil |
| 132 | Audio Processor |
| 134 | AC Adapter Port |
| 136 | Charging Station |
| 138 | Charging Slots |
| 140 | Microactuator |
| 141 | Support Structure |
| 142 | Electromagnetic waves |
| 144 | Springs |
| 220 | Umbo Lens |
| 250 | Taper Tube |
| 260 | Cable |
| 290 | Transmit Coil |
| 310 | External Microphone |
| 312 | Transmit Electronics |
| 314 | Volume/Control Switch |
| 316 | Coil Winding |
| 318 | Ferrite Core |
| 312 | Canal Microphone |
| 320 | Analog to Digital Converter |
| 324 | External Communication and Control Device |
| 330 | Digital Signal Processor |
| 332 | Central Chamber |
| 334 | Mounting Recess |
| 336 | Secondary Acoustic Vent |
| 338 | Acoustic Vent |
| 340 | Acoustic Input (Audible Sound) |
| 342 | Transmit Electronics |
| 700 | Upstream Signal |
| 702 | Upstream Data |
| 710 | Downstream Signal |
| 712 | Downstream Data |
| 720 | Interface |
| 730 | Clock Recovery Circuit |
| 740 | Data Recovery Circuit |
| 750 | Energy Harvesting Circuit |
| 760 | Power management Circuit |

-continued

| REFERENCE NUMBERS | |
|---|---|
| Number | Element |
| 770 | Voltage Regulator |
| 780 | Driver |
| 790 | Data Processor Encoder |
| 800 | Data/Sensor Interface |
| 802 | External Antenna |
| 804 | Bluetooth Circuit |
| 806 | Battery |
| 808 | Power Conversion Circuit |
| 810 | Microphones |
| 812 | Charging Antenna |
| 814 | Wireless Charging Circuit |
| 816 | Interface Circuit |
| 818 | Power/Data Link |
| 822 | Interface Circuit |
| 823 | Biological Sensors |
| 824 | Energy Harvesting and Data Recovery Circuit |
| 826 | Energy Storage Circuitry |
| 828 | Power Management Circuitry |
| 831 | Matching Network |
| 832 | Data/Signal Processing Circuitry |
| 834 | Microcontroler |
| 836 | Driver |
| 838 | Microactuator |
| 840 | Digital Signal Processors (shown as MA in FIG. 7 appears to be wrong) |
| 842 | Cloud Based Computer |
| 844 | Cell Phone |
| 846 | Data Acquisition Circuit |
| 848 | MPPT Control Circuit |
| 852 | Current Sensor |
| 854 | Capacitor |
| 863 | Voltage Meter |
| 865 | Rectifier and Converter Circuit |
| 869 | Storage Device |
| 872 | Parasitic Capacitance |
| 882 | Load |
| 972 | Capacitor |
| 974 | Diode |
| 975 | AC Filter Capacitor |
| 976 | Input Circuit |
| 977 | Resonance Capacitor (Tuning Capacitor) |
| 978 | Output Circuit |
| 980 | Drive Coil L1 |
| 982 | Load Coil L4 |
| 984 | Resonant Transmit Coil L2 |
| 986 | Resonant Receive Coil L3 |
| 988 | Drive (Transmit) Circuit |
| 990 | Load (Receive) Circuit |
| 992 | Transmit Resonant Circuit |
| 994 | Receive Resonant Circuit |
| 996 | Signal Source |
| 998 | Resonant Transmit Capacitor C1 |
| 1000 | Resonant Receive Capacitor C2 |
| 1002 | Voltage Detector |
| 1004 | Rectifier Circuit |
| 1006 | Load |
| 1008 | Receive Inductor Lrx |
| 1010 | Receive Capacitor Cr1 |
| 1012 | Receive Capacitor Cr2 |
| 1014 | Receive Capacitor Cr3 |
| 1016 | Receive Capacitor Cr4 |
| 1018 | Diode D1 (Schottky) |
| 1020 | Diode D2 |
| 1022 | Diode D3 |
| 1024 | Diode D4 |
| 1026 | Smoothing Capacitor 1026 |
| 1028 | Motor |
| 1030 | Motor Resistor (Resistance) |
| 1032 | Motor Inductor (Inductance) |
| 1034 | Diode Bridge |
| 1036 | Transmitter |
| 1038 | Current Source |
| 1040 | Output Capacitor C0 |
| 1042 | Output Coil L1 |
| 1044 | Voltage Source |

-continued

| REFERENCE NUMBERS | |
|---|---|
| Number | Element |
| 1046 | Capacitive Transformer/Divider |
| 1048 | Resistor R1 |
| 1050 | Capacitor C01 |
| 1052 | Capacitor C02 |
| 1054 | Inductor L1 |
| 1056 | Parallel Drive Circuit |
| 1058 | Capacitor C7 |
| 1060 | Capacitor C1 |
| 1062 | First Diode |
| 1066 | Motor Node |
| 1067 | Diode Output Node |
| 1068 | Smoothing Capacitor |
| 1070 | Second Diode |
| 1072 | Receive Circuit Components |
| 1074 | Receive Circuit Board |
| 1076 | Adhesive |
| 1078 | Ferrite Disk(s) |
| 1080 | Receive Coil Windings |
| 1082 | Adhesive Plug |
| 1084 | Receive Circuit Assembly |
| 1086 | AND/NAND Gate |
| 1088 | Switch S1 |
| 1090 | Switch S2 |
| 1092 | Switch S3 |
| 1094 | Switch S4 |

The invention claimed is:

1. A method of transmitting audio information from an ear tip to a contact hearing device, the method comprising the steps of:
exciting a transmit coil using a varying current, the transmit coil being positioned in the ear tip, wherein the transmit coil is wound on a core, the core comprising a ferromagnetic material;
radiating an electromagnetic field from the transmit coil through an ear canal of a user, wherein the radiated electromagnetic field is amplitude modulated based on the varying current of the transmit coil to be indicative of audio information;
receiving the radiated electromagnetic field at a receive coil positioned on a contact hearing device wherein the receive coil has a core which is not ferromagnetic; and
transmitting audio information and power from the transmit coil to the receive coil using near-field radiation, wherein the near-field radiation induces an amplitude modulated signal at the receive coil indicative of the audio information and providing power to drive a microactuator that transduces the amplitude modulated signal using the audio information.

2. A method according to claim 1, wherein the ear tip comprises the transmit coil and the contact hearing device comprises the receive coil, the method comprising the step of adapting the ear tip such that it positions a medial end of the transmit coil to be within between 3 and 7 millimeters of a lateral end of the receive coil when the ear tip and contact hearing device are positioned in the ear canal.

3. A method according to claim 1, wherein the ear tip comprises the transmit coil and the contact hearing device comprises the receive coil, the method comprising the step of adapting the ear tip such that when it is positioned in the ear canal of a user more than fifty percent of magnetic flux lines emanating from the transmit coil couple through the receive coil.

4. A method according to claim 1, wherein the ear tip comprises the transmit coil and the contact hearing device comprises the receive coil, the method comprising the step of adapting the ear tip such that when it is positioned in the ear canal of a user more than seventy five percent of a magnetic field generated by the transmit coil is coupled to the receive coil.

5. A method according to claim 1, wherein the step of exciting the transmit coil induces current in the receive coil, wherein the induced current is induced by the presence of a magnetic field generated at the transmit coil.

6. A method according to claim 5, wherein the current induced is proportional to the magnetic field at the transmit coil.

7. A method according to claim 1, wherein the step of exciting the transmit coil results in a voltage generated across the receive coil wherein the generated voltage is a product of the magnetic field generated at the transmit coil.

8. A method according to claim 7, wherein the voltage generated is proportional to the magnetic field at the transmit coil.

9. A method according to claim 1, wherein the transmitted audio information is transmitted in an amplitude modulated (AM) signal.

10. A method according to claim 1, wherein the transmitted audio information is demodulated by a demodulator attached to a receive coil.

11. A method according to claim 1, wherein the transmit coil is magnetically coupled to the receive coil.

12. A method according to claim 11, wherein coupling between the transmit and receive coils is between approximately 0.1 percent and approximately 3.0 percent.

13. A method according to claim 1, wherein the audio information and the power are transmitted from the transmit coil to the receive coil through the interaction of magnetic fields generated in the transmit coil with the receive coil.

14. A method according to claim 1, wherein the core comprises a ferrite material.

15. A method of transmitting audio information from an ear tip to a contact hearing device, the method comprising the steps of:
   exciting a transmit coil using a varying current, the transmit coil being positioned in an ear tip, wherein the transmit coil is wound on a ferromagnetic core;
   radiating an electromagnetic field from the transmit coil through an ear canal of a user, wherein the radiated electromagnetic field is amplitude modulated based on the varying current of the transmit coil to be indicative of audio information;
   receiving the radiated electromagnetic field at a receive coil positioned on a contact hearing device, the receive coil having a core of a non-ferromagnetic material; and
   transmitting audio information and power from the transmit coil to the receive coil using near-field radiation, wherein the near-field radiation induces an amplitude modulated signal at the receive coil indicative of the audio information and providing power to drive a microactuator that transduces the amplitude modulated signal using the audio information.

16. A method according to claim 15, wherein the transmit and receive coils are inductively coupled.

17. A method according to claim 15, wherein inductive coupling is used to link the transmit coil to the receive coil.

18. A method according to claim 15, wherein the audio information is transmitted from the transmit coil to the receive coil using near-field magnetic coupling.

19. A method according to claim 15, wherein the audio information is transmitted from the transmit coil to the receive coil using resonant inductive coupling.

20. A method according to claim 15, wherein the audio information is transmitted from the transmit coil to the receive coil using near-field magnetic induction.

21. A method according to claim 15, wherein the audio information is transmitted from the transmit coil to the receive coil using a near-field magnetic induction link.

22. A method according to claim 15, wherein the output of the contact hearing device varies by less than two decibels sound pressure level (dB SPL) when the distance between the transmit and receive coils varies by between three and seven millimeters.

23. A method according to claim 15, wherein the receive coil is a part of a receive coil assembly, the receive coil assembly comprising:
   the receive coil; and
   at least one disk positioned at a distal end of the receive coil, the at least one disk comprising a ferromagnetic material.

24. A method according to claim 23, wherein the receive coil is wound with a central core of a non-ferromagnetic material.

25. A method according to claim 24, wherein the non-ferromagnetic material is, at least in part, air.

26. A method according to claim 23, wherein an outer diameter of the at least one disk is substantially the same as an outer diameter of the receive coil.

27. A method according to claim 26, wherein the at least one disk includes a hole therethrough.

28. A method according to claim 23, wherein the at least one disk is two disks.

29. A method according to claim 23, wherein a printed circuit board including electronic components is affixed to a side of the at least one disk opposite a side to which the receive coil is affixed.

30. A method according to claim 29, wherein the electronic components on the printed circuit board comprise a demodulation circuit.

31. A method according to claim 30, wherein the demodulation circuit is a diode demodulator.

32. A method according to claim 23, wherein the at least one disk comprises a ferrite material.

* * * * *